(12) United States Patent
Vaughan et al.

(10) Patent No.: US 7,659,719 B2
(45) Date of Patent: Feb. 9, 2010

(54) CAVITY RESONATOR FOR MAGNETIC RESONANCE SYSTEMS

(75) Inventors: John Thomas Vaughan, Stillwater, MN (US); Mark A Watson, Savage, MN (US); Kenneth M Bradshaw, Chaska, MN (US); Matthew T Waks, Coon Rapids, MN (US); Joshua J Holwell, Plymouth, MN (US)

(73) Assignee: MR Instruments, Inc., Minneapolis, MN (US)

( * ) Notice: Subject to any disclaimer, the term of this patent is extended or adjusted under 35 U.S.C. 154(b) by 0 days.

(21) Appl. No.: 11/563,047

(22) Filed: Nov. 24, 2006

(65) Prior Publication Data
US 2008/0024133 A1    Jan. 31, 2008

Related U.S. Application Data

(60) Provisional application No. 60/739,687, filed on Nov. 25, 2005.

(51) Int. Cl.
*G01V 3/00* (2006.01)
(52) U.S. Cl. ...................................... 324/318
(58) Field of Classification Search .................. 324/318; 600/410, 422
See application file for complete search history.

(56) References Cited

U.S. PATENT DOCUMENTS

| | | | |
|---|---|---|---|
| 4,027,112 A | 5/1977 | Heppner | |
| 4,712,067 A | 12/1987 | Roschmann et al. | |
| 4,737,718 A | 4/1988 | Kemner et al. | |
| 4,746,866 A | 5/1988 | Roschmann | |
| 4,751,464 A | 6/1988 | Bridges | |
| 4,896,129 A | 1/1990 | Turner et al. | |
| 4,952,878 A | 8/1990 | Mens et al. | |
| 5,050,607 A | 9/1991 | Bradley et al. | |
| 5,085,219 A | 2/1992 | Ortendahl | |

(Continued)

FOREIGN PATENT DOCUMENTS

EP    0471509    2/1992

(Continued)

OTHER PUBLICATIONS

H. J. Schneider, and P. Dullenkopf, "Slotted tube resonator: A new NMR probe head at high observing frequencies," Rev. Sci. Instrum., 48:68-73 (1977).

(Continued)

*Primary Examiner*—Brij B. Shrivastav
*Assistant Examiner*—Megann E Vaughn
(74) *Attorney, Agent, or Firm*—Fredrikson & Byron, PA

(57) ABSTRACT

An magnetic resonance apparatus in embodiments of the invention may include one or more of the following features: (a) a coil having at least two sections, (b) the at least two sections having a resonant circuit, (c) the at least two sections being reactively coupled or decoupled, (d) the at least two sections being separable, (e) the coil having openings allowing a subject to see or hear and to be accessed through the coil, (f) a cushioned head restraint, and (g) a subject input/output device providing visual data to the subject, the input/output device being selected from the group consisting of mirrors, prisms, video monitors, LCD devices, and optical motion trackers.

13 Claims, 34 Drawing Sheets

U.S. PATENT DOCUMENTS

| | | | |
|---|---|---|---|
| 5,134,373 A | | 7/1992 | Tsuruno et al. |
| 5,177,443 A | * | 1/1993 | Gilderdale ................... 324/318 |
| 5,274,332 A | | 12/1993 | Jaskolski |
| 5,277,184 A | | 1/1994 | Messana |
| 5,281,918 A | | 1/1994 | Lehr |
| 5,307,814 A | | 5/1994 | Kressel et al. |
| 5,313,945 A | | 5/1994 | Friedlander |
| 5,365,928 A | | 11/1994 | Rhinehart et al. |
| 5,476,095 A | | 12/1995 | Schnall et al. |
| 5,497,773 A | | 3/1996 | Kuhara |
| 5,557,247 A | | 9/1996 | Vaughan, Jr. |
| 5,572,129 A | * | 11/1996 | Carlson ....................... 324/318 |
| 5,572,132 A | | 11/1996 | Pulyer et al. |
| 5,577,504 A | | 11/1996 | Salloway |
| 5,602,478 A | | 2/1997 | Salloway |
| 5,699,801 A | | 12/1997 | Atalar et al. |
| 5,715,819 A | | 2/1998 | Svenson et al. |
| 5,744,957 A | | 4/1998 | Vaughan, Jr. |
| 5,877,732 A | | 3/1999 | Ziarti |
| 5,886,596 A | | 3/1999 | Vaughan, Jr. |
| 5,892,359 A | | 4/1999 | Yui et al. |
| 6,316,941 B1 | | 11/2001 | Fujita et al. |
| 6,374,667 B1 | | 4/2002 | Eriksen |
| 6,433,548 B1 | | 8/2002 | Furuta et al. |
| 6,591,128 B1 | | 7/2003 | Wu et al. |
| 6,611,702 B2 | | 8/2003 | Rohling et al. |
| 6,693,427 B2 | | 2/2004 | Drobnitzky |
| 6,850,064 B1 | * | 2/2005 | Srinivasan ................... 324/318 |
| 6,946,840 B1 | | 9/2005 | Zou |
| 6,958,607 B2 | | 10/2005 | Vaughan et al. |
| 7,102,350 B2 | * | 9/2006 | Weyers et al. ................ 324/318 |
| 7,215,120 B2 | | 5/2007 | Vaughan |
| 7,339,373 B2 | * | 3/2008 | Seki et al. ................... 324/248 |
| 7,345,483 B2 | | 3/2008 | Vaughan |
| 7,375,527 B2 | | 5/2008 | Vaughan, Jr. |
| 2002/0050815 A1 | * | 5/2002 | Suzuki et al. ................ 324/248 |
| 2003/0164704 A1 | | 9/2003 | Yoshida |
| 2005/0062472 A1 | | 3/2005 | Bottomley |
| 2005/0134271 A1 | | 6/2005 | Zheng |
| 2005/0231200 A1 | * | 10/2005 | Tropp et al. ................. 324/318 |
| 2005/0264291 A1 | | 12/2005 | Vaughan et al. |
| 2006/0001425 A1 | * | 1/2006 | Weyers et al. ................ 324/318 |
| 2006/0132134 A1 | | 6/2006 | Amm |
| 2007/0066885 A1 | | 3/2007 | Vaughan |
| 2007/0108980 A1 | | 5/2007 | Adriany |

FOREIGN PATENT DOCUMENTS

| | | |
|---|---|---|
| EP | 0758092 A1 | 2/1997 |
| EP | 0290187 | 11/1998 |
| EP | 1624314 A1 | 2/2006 |
| JP | 08289878 | 11/1996 |
| WO | 02/10786 | 2/2002 |
| WO | 02/39135 | 5/2002 |
| WO | 03107026 A | 12/2003 |
| WO | 2005052622 A | 6/2005 |
| WO | 2005122060 A | 12/2005 |
| WO | 2006076739 A | 7/2006 |
| WO | 2006090293 A | 8/2006 |
| WO | 2007103953 A2 | 9/2007 |

OTHER PUBLICATIONS

H. Barfuss, H. Fischer, D. Hentschel, R. Ladebeck, A. Oppelt, R. Wittig, W. Duerr, and R. Oppelt, "In Vivo Magnetic Resonance Imaging and Spectroscopy of Humans with 4 T Whole-body Magnet," NMR in Biomedicine, vol. 3, pp. 31-45, Feb. 1990.

J. T. Vaughan, J. O. Otu, H. P. Hetherington, P. Noa, G. M. Pohost, "A High Frequency Tuned Resonator for Clinical MRI," Abstracts, Society of Magnetic Resonance in Medicine, 11th Annual Scientific Meeting, Berlin, Germany, Aug. 8-14, 1992, p. 279.

J. T. Vaughan, H. P. Hetherington, J. G. Harrison, J. O. Otu, J. W. Pan, P. J. Noa, J. A. den Hollander, and G. M. Pohost, "High Frequency Coils for Clinical Nuclear Magnetic Resonance Imaging and Spectroscopy," Physica Medica, vol. IX, N. 2-3, pp. 147-153, Apr.-Sep. 1993.

J. T. Vaughan, H. P. Hetherington, J. W. Pan, P. J. Noa, G. M. Pohost, "A High Frequency Double Tuned Resonator for Clinical NMR," Abstracts, Society of Magnetic Resonance in Medicine, 12th Annual Scientific Meeting and Exhibition, New York, NY, Aug. 14-20, 1993, p. 306.

R. A. Chipman, "Theory and Problems of Transmission Lines," McGraw-Hill, New York, NY, 1968, pp. 215-227.

S. Y. Liao, "Microwave Devices and Circuits", Prentice-Hall, Englewood Cliffs, N.J., 1985, pp. 140-150.

R. Chatterjee, "Elements of Microwave Engineering," Ellis Horwood, Chichester, England, 1986, pp. 220-253.

R. F. Harrington, "Time-Harmonic Electromagnetic Fields," McGraw-Hill, New York, NY, 1961, pp. 74-76.

F. A. Duck, "Physical Properties of Tissue", Academic Press, Harcourt Brace Jovanovich, London, 1990, pp. 279-317.

H. Bomsdorf, T. Helzel, D. Kunz, P. Roschmann, O. Tschendel, and J. Wieland, "Spectroscopy and Imaging with a 4 Tesla Whole-body MR System," NMR in Biomedicine, vol. 1, pp. 151-158, Jun. 1988.

J. T. Vaughan, J. Harrison, B. L. W. Chapman, J. W. Pan, H. P. Hetherington, J. Vermeulen, W. T. Evanochko, G. M. Pohost, "High Field/Low Field Comparisons of RF Field Distribution, Power Deposition, and S/N for Human NMR: Preliminary Results at 4.1 T," Abstracts, Society of Magnetic Resonance in Medicine, 10th Annual Scientific Meeting and Exhibition, San Francisco, CA, Aug. 10-16, 1991, p. 1114.

J. Tropp, "The Theory of the Bird-Cage Resonator," J. Magn. Res., vol. 82, pp. 51-62, 1989.

R. Pascone, T. Vullo, J. Farrelly, P. T. Cahill, "Explicit Treatment of Mutual Inductance in Eight-Column Birdcage Resonators," Magn. Reson. Imag., vol. 10, pp. 401-410, 1992.

G. L. Matthaei, L. Young, E. M. T. Jones, "Microwave Filters, Impedance-Matching Networks, and Coupling Structures," McGraw-Hill, New York, NY, 1964, pp. 243-252.

H. P. Hetherington, J. T. Vaughan, J. W. Pan, P. J. Noa, D. B. Twieg, R. K. Kuzniecky, G. M. Pohost, "High-Resolution Neuroimaging at 4.1 T," J. Magn. Reson. Imag., vol. 3(P), p. 94, No. 313, 1993 (Supplement to JMRI Mar./Apr. 1993 Issue).

J. T. Vaughan, J. Harrison, H. P. Hetherington, G. M. Pohost, "RF Limitations to High-Field-Strength Clinical Imaging," J. Magn. Reson. Imag. vol. 3(P), p. 94, No. 314, 1993 (Supplement to JMRI Mar./Apr. 1993 Issue).

J. W. Pan, H. P. Hetherington, J. T. Vaughan, and G. M. Pohost, "High Resolution Neuro-Imaging at 4.1 T," Abstracts, Society of Magnetic Resonance in Medicine, 12th Annual Scientific Meeting, New York, NY, Aug. 14-20, 1993, p. 333.

R. Kuzniecky, H. Hetherington, J. W. Pan and G. M. Pohost, "High Resolution MRI at 4.1 T of the Hippocampus in Temporal Lobe Epilepsy," Abstracts, Society of Magnetic Resonance in Medicine, 12th Annual Scientific Meeting, New York, NY, Aug. 14-20, 1993, p. 484.

J. W. Pan, H. P. Hetherington, G. F. Mason, J. N. Whitaker, and G. M. Pohost, "Evaluation of Multiple Sclerosis by High Field Spectroscopic Imaging," Abstracts, Society of Magnetic Resonance in Medicine, 12th Annual Scientific Meeting and Exhibition, New York, NY, Aug. 14-20, 1993, p. 1552.

G. F. Mason, J. W. Pan, H. P. Hetherington, S. Ponder, D. Twieg, and G. Pohost, "Short-Echo Spectroscopic Imaging of Glutamate at 4.1 T in Human Brain in Vivo," Abstracts, Society of Magnetic Resonance in Medicine, 12th Annual Scientific Meeting, New York, NY, Aug. 14-20, 1993, p. 368.

H. P. Hetherington, J. W. Pan, G. F. Mason, S. L. Ponder, D. B. Twieg, J. T. Vaughan, and G. M. Pohost, "High Resolution H Spectroscopic Imaging of Human Brain at High Field: Quantitative Evaluation of Gray and White Matter Metabolite Differences," Abstracts, Society of Magnetic Resonance in Medicine, 12th Annual Scientific Meeting, New York, NY, Aug. 14-20, 1993, p. 127.

D. B. Twieg, J. W. van der Veen, R. K. Justice, J. den Hollander, H. P. Hetherington, J. T. Vaughan, G. Deutsch, and G. M. Pohost, "High Resolution 3-D Cerebral Activation Mapping at 4.1 T," Abstracts, Society of Magnetic Resonance in Medicine, 12th Annual Scientific Meeting and Exhibition, New York, NY, Aug. 14-20, 1993, p. 1389.

Mansfield, P., et al., High Frequency Cavity Resonator Designs for NMR: Measurement Science and Technology, IOP, Bristol, GB, vol. 1., No. 10, (Oct. 1, 1990), pp. 1052-1059.

"Intera Application Guide, vol. 1: Basics", 2001, Philips Medical Systems Nederland B.V.

Vaughan, J.T., Ed., "An Improved Volume Coil for High Field MRI", International Society for Magnetic Resonance in Medicine. 7th Scientific Meeting and Exhibition. ISMRM, Philadelphia, PA, May 22, 1999.

Crozier, et al., "Gradient-Coil Design by Simulated Annealing", Journal of Magnetic Resonance, Series A 103, pp. 354-357 (1993).

R. Turner., "A target field approach to optimal coil design", J. Phys. D: Applied Physics 19 (1986) L147-L151.

J.J. Holwell et al.: "An Open 16-Channel Transmission Line Array for 7T", Proc. Intl. Soc. Mag. Reson. Med. 15, (2007), p. 1053, XP-002472559, conference abstract.

W. Driesel et al.: "A Helmet Coil with Reduced Out-of-Volume Sensitivity for Human Brain Imaging at 7 T", Proc. Intl. Soc. Mag. Reson. Med. 14, (May 2006), p. 3549, XP00247256, conference abstract.

G. Adriany et al.: "A Gemometrically Adjustable 16 Channel Transceive Transmission Line Array for 7 Tesla", Proc. Intl. Soc. Mag. Reson. Med. 13, (2005), p. 673, XP002472561, conference abstract.

C. Akgun et al.: "Microstrip TEM Coil Optimization at 7T" Proc. Intl. Soc. Mag. Reson. Med. 14, (May 2006), p. 2619, XP002472562, conference abstract.

G. Adriany et al.: "An Elliptical Open-Faced Transceive Array for Ultra High Field Parallel Imaging and FMRI Applications" Proc. Intl. Soc. Mag. Reson. Med. 11, (2004), p. 1604, XP002472563, conference abstract.

G. Adriany et al.: "A 32 Channel Lattice Transmission Line Array for Parallel MRI", Proc. Intl. Soc. Mag. Reson. Med. 14, (May 2006), p. 126, XP002472564, conference abstract.

Wu et al.: "Design of an inductively decoupled microstrip array at 9.4T", Journal of Magnetic Academic Press, Orlando, FL, US, vol. 182, No. 1, (Sep. 2006) pp. 126-132, XP005694552, ISSN: 1090-7807.

Jevtic J. et al.: "Endcap design for phased-array coils", Proceedings of the International Society for Magnetic Resonance in Medicine, 12th Scientific Meeting and Exhibition, Kyoto, Japan, (May 15-21, 2004), (May 15, 2004), p. 1560, XP002477521.

Wright S. M. et al.: "Theory and application of array coils in MR spectroscopy", NMR in Biomedicine, Wiley, London, GB, vol. 10, No. 8, (1997), pp. 394-410, XP009016838, ISSN: 0952-3480, see pp. 400-405.

G. C. Wiggins et al.: "An 8 Channel Phased Array Coil and Detunable TEM Transmit Coil for 7 T Brain Imaging", Proc. Intl. Soc. Mag. Reson. Med., (2004), p. 36, XP002475393, conference abstract.

X. Yang et al.: "A Hybrid QD Transmit/8-Channel Receive Array Knee Coil at 3T", Proc. Intl. Soc. Mag. Reson. Med. 13, (2005), p. 907, XP002475394, conference abstract.

C.A. Saylor et al.: "Transmit/Receive High Resolution Knee Array", Proc. Intl. Soc. Mag. Reson. Med. 11, (2004), p. 1554, XP002475395, conference abstract.

C. J. Hardy et al.: "A 32-Element Cardiac Receiver-Coil Array for Highly Accelerated Parallel Imaging", Proc. Intl. Soc. Mag. Reson. Med. 13, (2005), p. 951, XP002475396, conference abstract.

U.S. Appl. No. 11/558,719, Non Final Office Action mailed May 12, 2009,8 pgs.

* cited by examiner

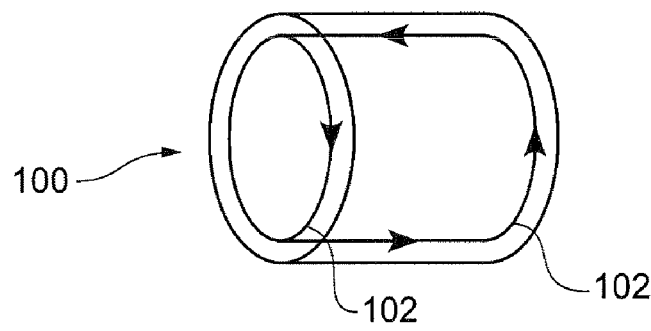
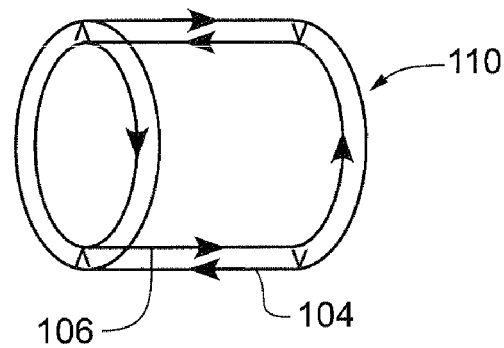
Fig. 2c
PRIOR ART
Fig. 2d
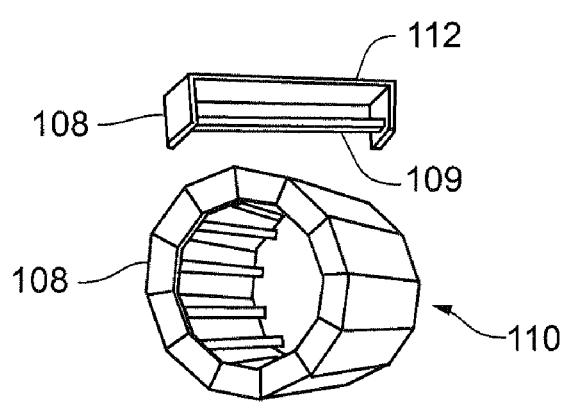
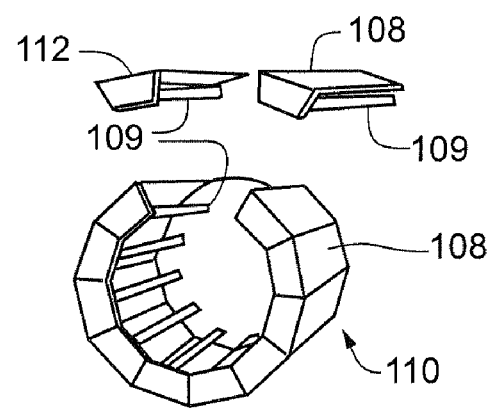
Fig. 2e
Fig. 2f

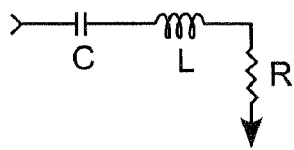
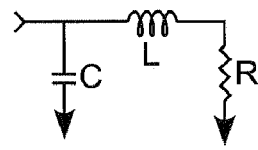
*Fig. 7a*        *Fig. 7b*
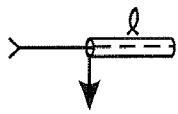
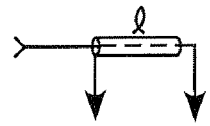
*Fig. 7c*        *Fig. 7d*
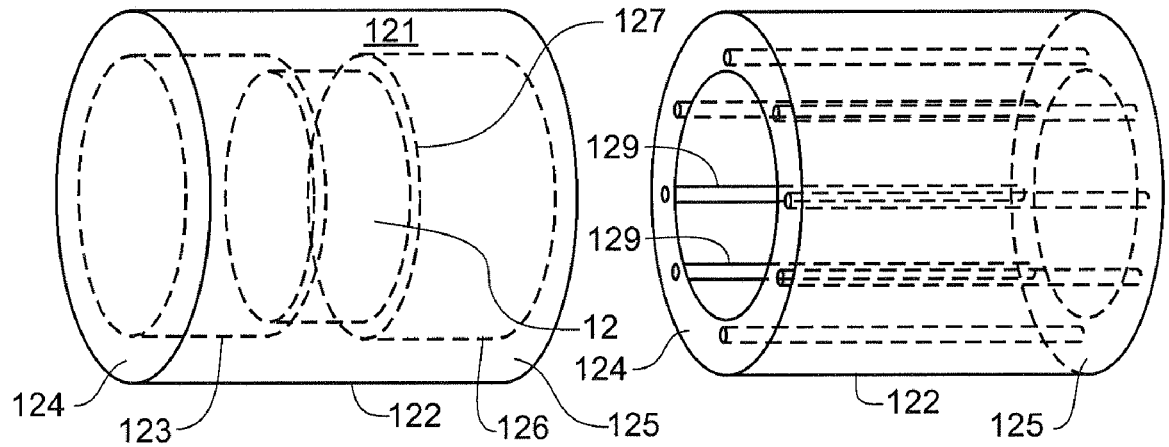
*Fig. 8a*        *Fig. 9a*
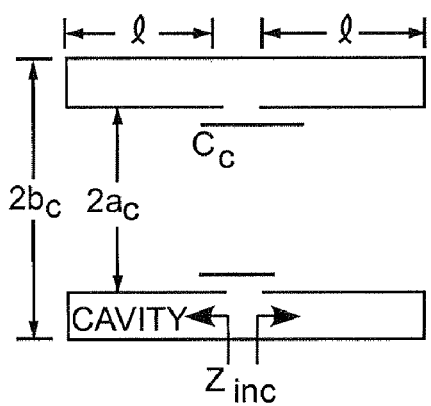
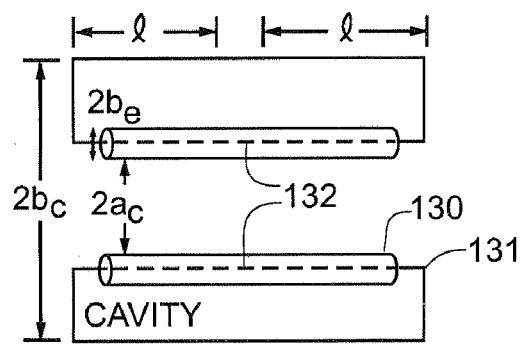
*Fig. 8b*        *Fig. 9b*

M=0

M=1

M=2

M=3

M=4

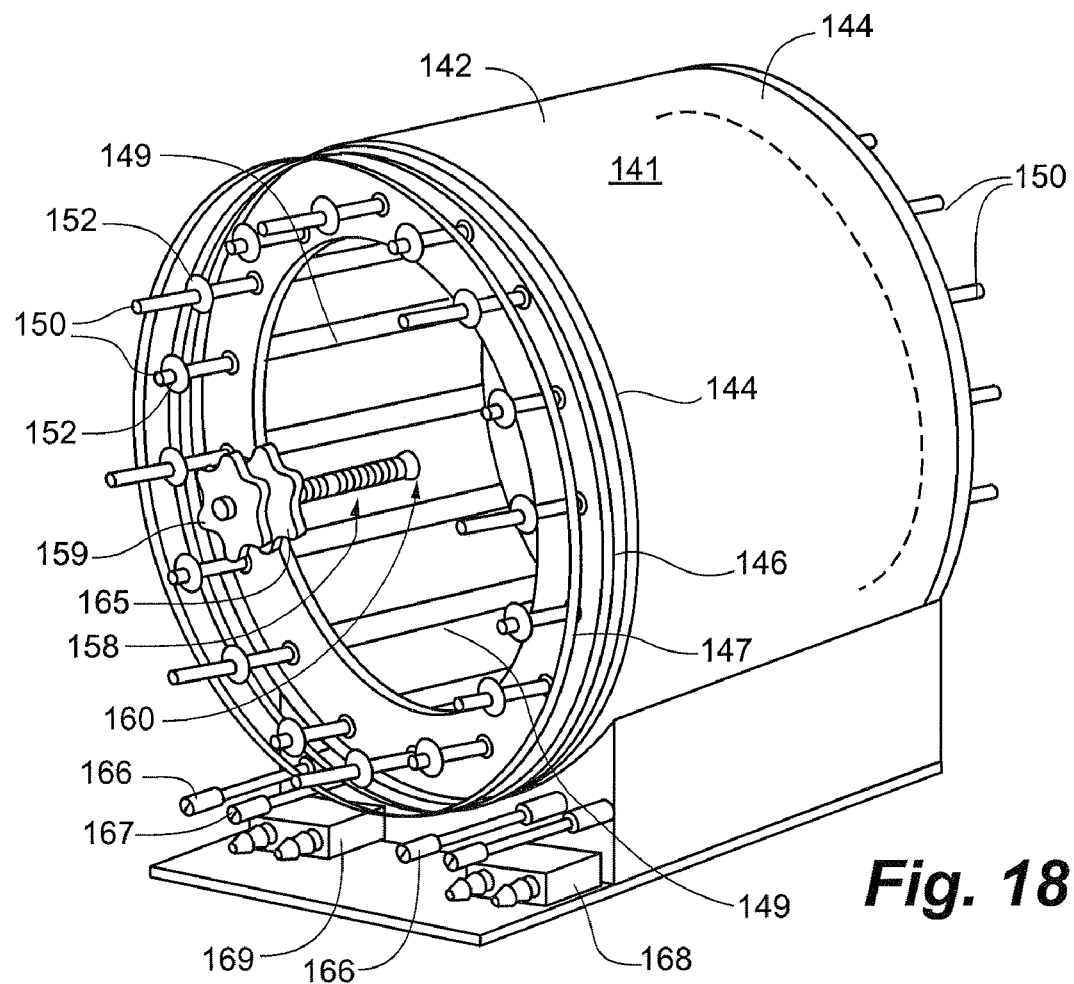

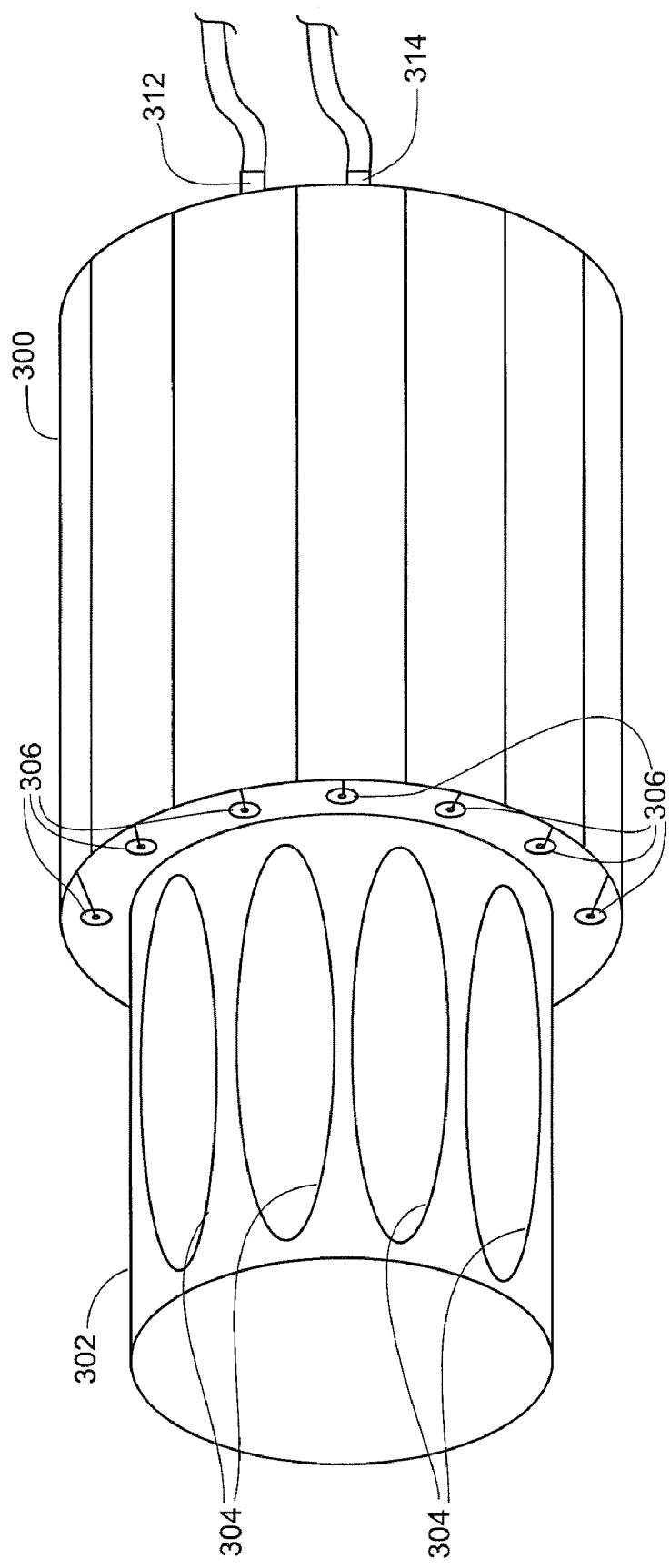
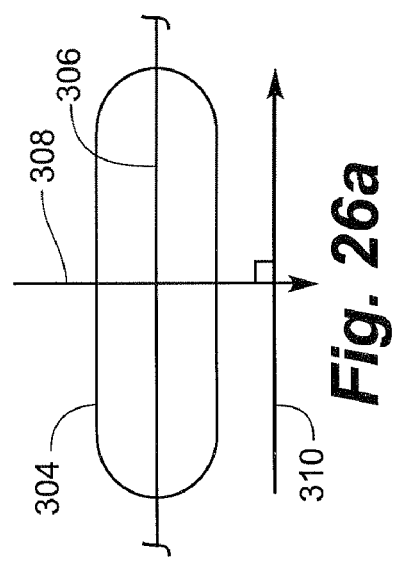
Fig. 26
Fig. 26a

CAVITY RESONATOR FOR MAGNETIC RESONANCE SYSTEMS

CROSS REFERENCE TO RELATED APPLICATIONS

This application claims priority from U.S. Provisional Application Ser. No. 60/739,687, filed Nov. 25, 2005, the contents of which are incorporated by reference in their entirety.

FIELD OF THE INVENTION

The present invention relates to a cavity resonator coil for use in magnetic resonance Systems.

BACKGROUND OF THE INVENTION

There are many previously known resonators for use in magnetic resonance (MR) systems for imaging and spectroscopy. For example, one previously known device is commonly known as a birdcage resonator. These previously known birdcage resonators typically comprise a plurality of circumferentially spaced inductive/capacitive elements connected by inductive/capacitive end ring elements, which are driven at resonance by a Larmor radio frequency useful for nuclear magnetic resonance (NMR) systems. The object to be analyzed is positioned within the resonator during the operation of the MR system.

One disadvantage of these previously known resonators, however, is that they typically use lumped element circuits (with discrete inductors and capacitors) to achieve resonance at the selected radio frequency. Because lumped element circuits lose more energy to radiation at high frequencies where the circuit is greater than $1/10$ wavelength, the lumped element resonator is less efficient for high field MR imaging applications compared to lower field strengths. Because lumped element circuits are more radiative, they are electrically less efficient and have a lower Q factor. Similarly because conventional lumped element circuits such as the birdcage are more inductive, they resonate at lower frequencies than do the less inductive transmission line (TEM) circuits.

These previously known resonators, which use lumped element circuits, suffer from several additional disadvantages. One such disadvantage is non-uniform current distributions which result in decreased homogeneity, decreased fill factor, and increased electric field losses. Especially at higher frequencies and for larger (clinical) volumes, lumped element resonators may achieve self-resonance below the desired frequency of operation as well as increased electromagnetic radiation losses.

A distributed circuit, cavity resonator for NMR systems disclosed by Vaughan in U.S. Pat. No. 5,744,957 overcomes the above-mentioned disadvantages of the previously known devices. Vaughan discloses a cavity resonator having coaxial inner and outer cylindrical walls separated by a dielectric region. Spaced conductive end walls extend across the inner and outer walls at each axial end of the coil so that the inner, outer, and end walls together form an approximate cavity. The inner, outer, and end walls can, for example, be coated with a thin foil conductive material, such as copper, silver, or gold. In doing so, the coil imitates a coaxial line segment made resonant at Larmor frequencies useful for MR, such as 64 MHz (1.5 T), 175 MHz (4.1 T) or 170 MHz (4 T).

The apparatus disclosed by Vaughan provides a cavity resonator coil overcoming the problems of conventional coils discussed above, providing for a substantial improvement in signal to noise ratio (SNR). The coil will also resonate and operate efficiently at higher Larmor frequencies for the higher static magnetic now available at 3T and above. Because the SNR from MR samples increases with the magnet field strength, the ability of this coil to resonate and operate efficiently at higher frequencies means that it can be used at high field strengths to obtain further SNR gains. This increase in signal to noise ratio provides a substantially improved image of the object to be analyzed within the resonator during the operation of the MR system, for example.

The resonator disclosed by Vaughan has proven effective in MR systems providing increased SNR, homogeneity, transmit efficiency, fill factor, decreased electric field losses, and higher operational frequencies. However, there are still some problems associated with both the resonator disclosed by Vaughan and the previously known lumped element resonators.

An ideal clinical head coil for example would lend itself to the easiest and most comfortable subject positioning, leave the subject's face uncovered once the subject is in position, and would include these access and comfort features without compromising coil performance, safety and reliability. It is preferable for a head coil to be both comfortable and accessible for the subject and easy to use for the technician. However, it is difficult to provide comfort and accessibility for the subject and ease of use for the technician and maintain a high coil performance. The ideal coil should have a removable top as well, to allow for comfortable subject positioning in the coil. Furthermore, some commercial systems don't provide the space for a coil that slides over a subject's head. Accordingly, several commercial coil designs already incorporate this "pop top" feature. However, these commercial coils that separate into halves are not popular with some research applications such as fMR. Apparently the electrical contacts that are broken and remade to open and close the coil each time a new subject is loaded, become unstable over time due to wear and oxidation, resulting in noise "spikes" and temporal instabilities often seen in EPI images for example. These electrical contacts are required to complete the end ring current paths in birdcages and similar coil structures. While commercial coils must meet rigorous FDA safety criteria, it could be imagined that electrical contacts in a coil might possibly pose safety risks in certain situations, especially where electrolytic bodily fluids were present.

Similarly, an ideal body coil might be as small as possible and fit close enough to the human trunk for efficient transmission to and reception from a region of interest, but allow room for subject comfort and access. The present body coils are built very large to allow for access and comfort, but as a consequence are very inefficient and are poorly coupled to the MR region of interest in a body. RF power amplifiers of 35 kW and more are required to compensate for the inefficiencies of a body coil used in a 3T magnet for example. Still, these coils provide little shoulder room for the largest human subjects.

Limb coils, especially leg coils, are similarly limited by conventional practice. A leg volume coil for example must be oversized to make room for a leg with a foot to be threaded through the cylindrical structure. Or a leg coil has a removable top to provide easier access for a closer fitting, more efficient coil. This latter coil however by conventional designs requires the problematic electrical contacts described for the head coil above.

Typical existing head only MR systems are one-piece units. A significant problem with this structure is that many medical subjects do not possess the physical ability to manipulate their heads and bodies into the positions required for the MR without significant difficultly or pain. Typically, the subject must try and navigate their head into the small diameter of the head only system. This can be painful or impossible for most medical subjects who are asked to do this while lying on their back.

Because of the inherently low SNR of the MR signal, these signals must be acquired and averaged a sufficient number of times to improve the SNR to a significant value. MR data acquisition by signal averaging is highly intolerant of motion in the MR sample or subject. Accordingly, human subjects are required to remain motionless for the duration of an MR scan, sometimes lasting 30 minutes or more. Movement will result in lower resolution images and in image "ghosting", thereby limiting the diagnostic quality of an image and often requiring a repeated imaging session. To minimize head motion for example, MR operators will often insert padding around the subject's head to provide head restraint. While this has the effect of reducing the subject's head movement, it does not eliminate all of the subject's head movement. Further, all of the padding placed around the subject's head can apply uncomfortable pressure and can intensify the subject's feelings of claustrophobia. Therefore, the purpose behind having a high performance coil with a better signal to noise ratio is defeated if the subject cannot remain still.

Another, problem associated with many MR protocols, is they can be painfully loud. Typically, subjects are given earplugs or headphones to muffle the noise (in most MR centers the subject can even bring their own cassette or CD to listen to). The acoustic noise is attributed to the electro motive forces generated by switched electrical currents in the wires of the magnet's gradient coils. Stronger magnet fields and stronger or faster gradient current switching generate greater acoustic amplitudes. While the methods mentioned above are generally effective for gradient noise reduction, coils must be built to larger and less efficient dimensions to accommodate the head restraint and hearing protection devices placed about the head.

Visual input/output is often required for a subject receiving an MR exam, for diagnostics or research. These I/O visual devices help to minimize claustrophobia, provide visual cues, and relay information from the MR operator. Visual I/O devices are typically mirrors, prisms, or active displays located above the subject's eyes. A problem with existing systems of this sort is that 1) they are often fixed in position which requires that a subject be adjusted to the device, and 2) they typically protrude above the head coil so as to preclude their use in close fitting head only MR systems, and in head gradient inserts used in whole body MR systems.

It has been shown that back planes on RF coils can function as an RF mirror to extend the uniformity of the coil's transverse RF magnetic field along the rotational or "z" axis of the coil. A back plane, also known as an end cap, can be used in a coil to make a shorter, and therefore more ergonomic, better shielded, and more electrically efficient coil for a desired field of view. Conventional cylindrical birdcage head coil, as mentioned above, typically do not have a back plane. The lack of a back plane together with the inherently shorter axial field of a birdcage require the birdcage head coil to be longer typically covering the subject's mouth and chin. This increased length of the birdcage has many problems. It creates a head coil, which can increase feelings of claustrophobia for the subject. Once inside of the head coil the subject's mouth is located immediately in front of the inside coil wall. A subjects breath pushed back into their face by the inside coil wall creates a very uncomfortable/claustrophobic feeling for the subject. This is an undesirable result since the MR exam may take 20 to 90 minutes. Additionally, general medical access and vocal communications are impeded with the coil extending over the subject's mouth and chin. Further, if the subject has a large head, nose, and/or chin, it becomes increasingly difficult to fit the subject's head inside of the coil. Another additional disadvantage for coils not having end caps is additional electromagnetic energy is lost from the top of the coil and thus the coil is less efficient at high frequencies.

While a back wall in a head coil is more desirable for coil performance and ergonomics in relation to the subject's mouth and chin (i.e., with a back wall the head coil body can be shorter and thus the head coil does not have to extend over the chin), a back wall is undesirable for a couple of reasons. First, a back plane closes off one end of the coil giving the appearance of putting ones head into a bucket rather than an open cylinder. This can increase a feeling of claustrophobia for the subject. Second, the back plane limits access to the subject from the back of the magnet. In coils without back planes, leads for physiological monitors, anesthesia and/or respiratory hoses, EEG leads, communications lines, etc., can be passed. In these systems visual signal projection is often performed from the rear of a magnet and through the back of a coil to mirror or prism systems mounted above the subjects' eyes. Therefore, presently, head coil manufacturers must choose between the benefits of having a coil back plane or end cap or the benefits associated with access to the subject provided by head coils with no end cap.

As stated above, a problem associated with head coils is the amount of space provided inside of the coil. RF coils transmit MR stimulus to the subject and receive signals back most efficiently when the coil is as close as possible to the subject. Therefore, for RF coil performance considerations, space inside a coil should be only enough for subject comfort and for the inclusion of devices useful for safety, head stability, and communication with the subject. As stated above, normally a subject must wear earphones or plugs for hearing protection and have separate pads inserted around the head to hold the head motionless for the MR exam. Further, there is typically some sort of visual and/or audio communications device adjacent to the head so that the MR operator can communicate with the subject. However, the padding, hearing protection and communication equipment can not only make the MR experience uncomfortable for the subject but this equipment also occupies limited space within the head coil.

All of these problems listed above, individually and collectively, degrade the overall quality of NMR images and spectra, add to the discomfort of the subject, and limit subject access for the physician or researcher. Therefore, what is clearly needed is a high performance apparatus, which provides for increased signal to noise ratios and improved MR image quality, while overcoming the problems discussed above.

SUMMARY OF THE INVENTION

An magnetic resonance apparatus in embodiments of the invention may include one or more of the following features: (a) a coil having at least two sections, (b) the at least two sections having a resonant circuit, (c) the at least two sections being wirelessly coupled or decoupled, (d) the at least two sections being separable, (e) several openings allowing a subject to see and be accessed through the coil, (f) at least one cushioned head restraint, and (g) a subject input/output device providing visual data from in front and behind of the coil respectively; wherein the input/output device is selected from the group consisting of mirrors, prisms, video monitors, LCD devices, and optical motion trackers.

A magnetic resonance apparatus in embodiments of the invention may include one or more of the following features: (a) a coil having at least one head restraint, (b) a means for audio communication to a subject connected to the head restraint, (c) a means for active or passive protection for a subject's hearing, (d) at least three head restraints to provide a three-point head restraint, (e) a means to secure said head restraint to a subject's head, and (f) a head cushion.

A TEM coil providing MR imaging in embodiments of the invention may include one or more of the following features: (a) a coil providing at least two head restraints, (b) the head restraints having a means for audio communication to a subject, (c) a means for active or passive protection for a subject's hearing, (d) a head cushion to provide a three-point head restraint, (e) a means to secure said head restraints to a subject's head, and (f) a means to accept an audio signal input.

A magnetic resonance apparatus in embodiments of the invention may include one or more of the following features: (a) a coil having at least two separable sections, (b) a input/output device, (c) a track system located within an open face area in the coil, and (d) the input/output device being slideably mounted on said track.

A TEM coil in embodiments of the invention may include one or more of the following features: (a) an input/output device, (b) a track system located within an open face area in the coil, (c) the input/output device being slideably mounted on said track, and (d) the input/output device is selected from the group consisting of visual transducers, olfactory transducers, gustatory transducers, or auditory transducers to provide two way communication or stimulus.

An RF coil for magnetic resonance in embodiments of the invention may include one or more of the following features: (a) the coil comprising a plurality of sections, (b) the plurality of sections being with wireless connections and able to wirelessly couple electromagnetic energy between the plurality of sections or the plurality of sections being reactively decoupled, (c) the plurality of sections being separable, and (d) a guiding means to assure mutual alignment between said plurality of sections.

A method of manufacturing a magnetic resonance device in embodiments of the invention may include one or more of the following steps: (a) providing a coil having a plurality of sections; the plurality of sections being separable, (b) attaching a head restraint means to prevent movement of a subject's head, provide communication with the subject, and protect said subject's hearing, (c) inserting a slideable input/output device within an open window on said top section to provide subject with two way communication, (d) creating a rear projection slot providing a channel positioned in a back plane of said coil to provide access for a rear visual projection system.

A method of performing magnetic resonance imaging in embodiments of the invention may include one or more of the following steps: (a) providing a coil having a top section and a bottom section; said top section and bottom section being separable and wirelessly connected, (b) placing a subject within the bottom section, (c) placing the top section in electromagnetic communication with the bottom section, (d) providing a plurality of openings in the top section to allow a subject to see through said coil and be accessed through said coil, (e) providing at least one cushioned device for head restraint.

A TEM magnetic resonance apparatus in embodiments of the invention may include one or more of the following features: (a) a coil having at least two sections, (b) the at least two sections having a resonant circuit, (c) the at least two sections being reactively coupled or decoupled, (d) the at least two sections being separable, and (e) an overlapping shield on at least one section.

A method of manufacturing a TEM magnetic resonance device in embodiments of the invention may include one or more of the following steps: (a) providing a coil having a plurality of sections; the plurality of sections being separable, and (b) determining an optimum profile of a transmission line element based on a predetermined need.

A TEM magnetic resonance apparatus in embodiments of the invention may include one or more of the following features: (a) a coil having a transmission section, (b) a coil having a receiver section, (c) the coils having a resonant circuit, (d) the coils being operably coupled or decoupled, and (e) the coils being separable.

A method of manufacturing a TEM magnetic resonance device in embodiments of the invention may include one or more of the following steps: (a) providing a coil having a transmission section, (b) providing a coil having a receiver section, (c) the coils being operably coupled or separable, and (d) selecting a desired transmission line element based on a predetermined need.

BRIEF DESCRIPTION OF THE DRAWINGS

FIG. 2c is a profile view of a prior art bird cage coil.

FIG. 2d is a profile view of a TEM cavity resonator.

FIG. 2e is a profile view of a resonator according to an embodiment of the present invention.

FIG. 2f is a profile view of a resonator according to an embodiment of the present invention.

FIG. 3 is an enlarged view of the exploded view of a resonator as shown in FIG. 2a.

FIGS. 7a, b, c, d compare lumped element resonant circuits to transmission line analogues.

FIGS. 8a, b diagrammatically illustrate a coaxial cavity used for high frequency volume MR coils according to the invention.

FIGS. 9a, b diagrammatically illustrate a tuned TEM resonator according to the invention.

FIG. 18 is an elevation, in perspective, of a dual frequency tunable TEM resonator for a high frequency, large volume MR coil, according to the invention.

FIG. 19 is a sectional view of a portion of FIG. 18.

FIGS. 26-37 show several construction embodiments for a TEM resonator in embodiments of the present invention.

DETAILED DESCRIPTION

Figure 1:
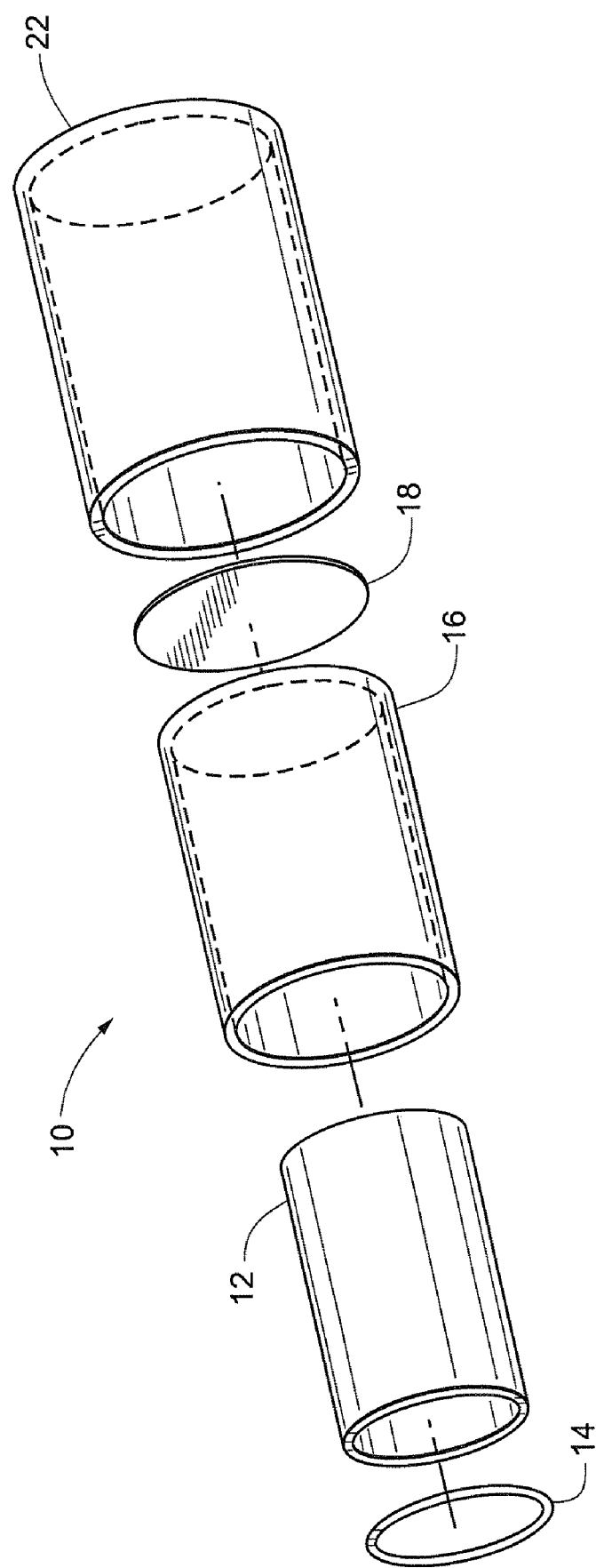
FIG. 1 is an exploded view of a construction of a resonator.

To assist in an understanding of the invention, a preferred embodiment or embodiments will now be described in detail. Reference will be frequently taken to the figures, which are summarized above. Reference numerals will be used to indicate certain parts and locations in the figures. The same reference numerals will be used to indicate the same parts or locations throughout the figures unless otherwise indicated.

The present invention is not limited to only distributed circuit cavity resonator head coils, and may be employed in many of various types of MR head coil devices. It is to be further understood, moreover, the present invention may be employed in many of various types of MR devices and is not limited only to head coils. For purposes of illustration only, however, the present invention is below described in the context of cavity resonator head coils.

Figure 1A:
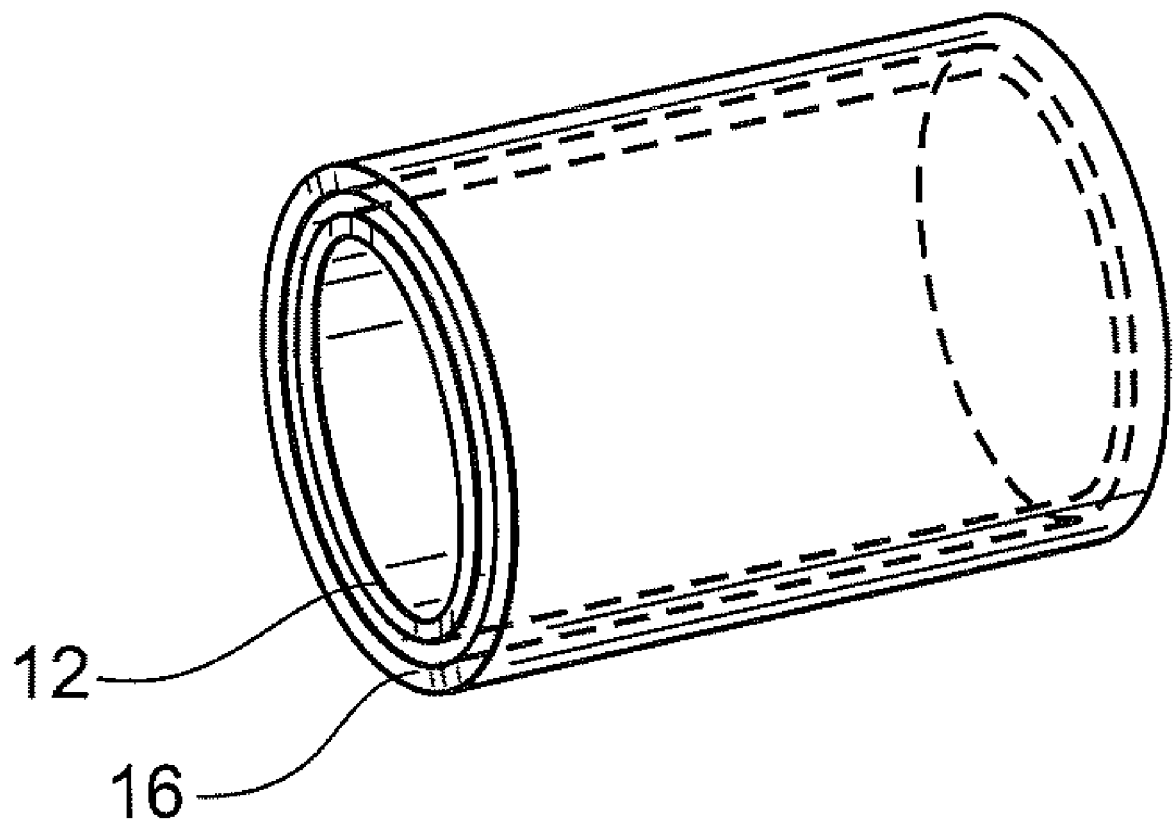
FIG. 1a is a profile view of a construction of a resonator according to FIG. 1.

With respect to FIGS. 1 & 1a, a general construction of a cavity resonator is shown. Additional structures and teachings for construction of a cavity resonator, which can be utilized in the present invention are discussed in U.S. Pat. No. 5,557,247, U.S. Pat. No. 5,744,957, U.S. Pat. No. 5,886,596, U.S. Provisional Application 60/135,269, U.S. Provisional Application 60/222,144, U.S. Provisional 60/378,111, and U.S. Provisional 60/373,808, which are herein incorporated by reference in their entirety. Generally a cavity resonator (coil) 10 is comprised of an electrical circuit tube/board 12, a front cavity wall component 14, a lateral cavity wall component 16, and a back cavity wall component 18 all contained within a coil shell 22.

Figure 2:
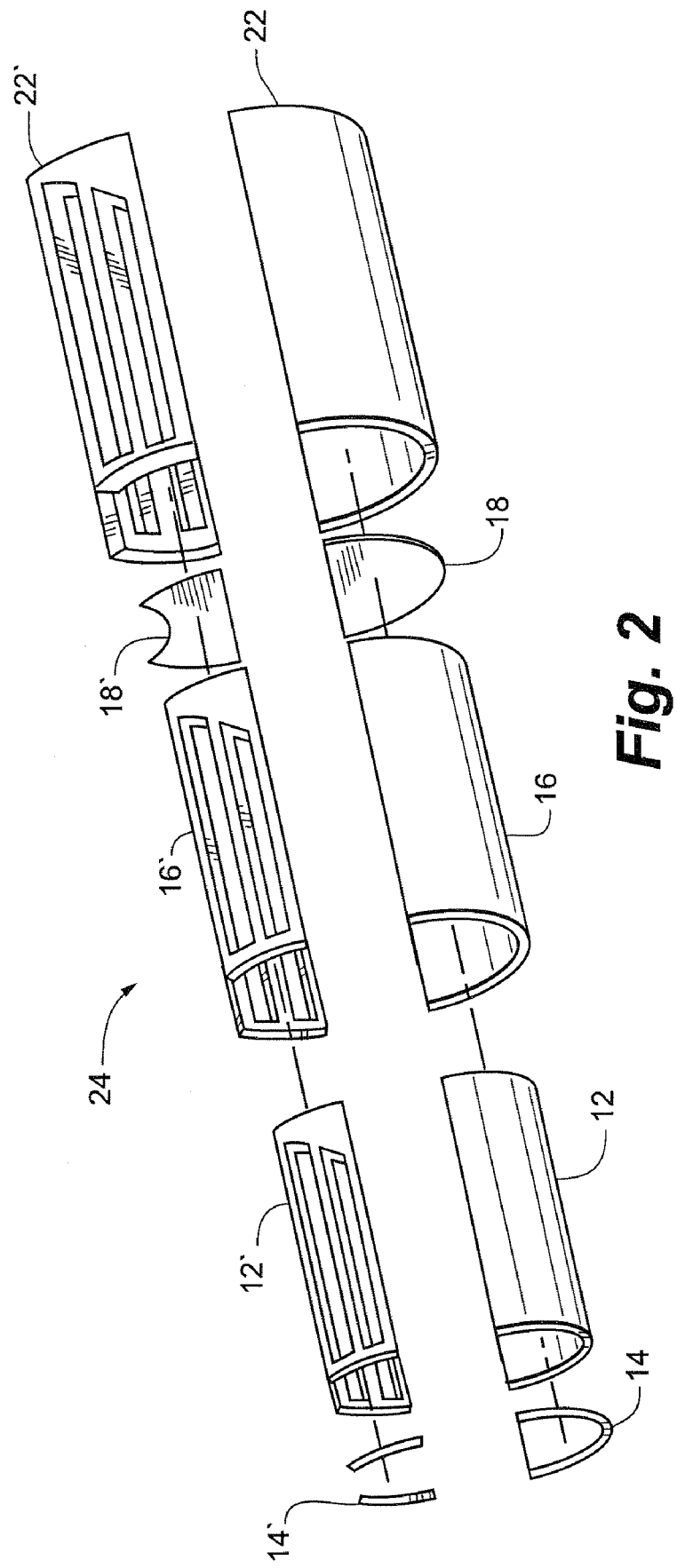
FIG. 2 is an exploded view of an internal construction of a resonator according to an embodiment of the present invention.

With reference to FIG. 2, an exploded view of an internal construction of a resonator according to an embodiment of the present invention is shown. Generally coil 24 is comprised of electrical circuit tube/board 12 and 12', front cavity walls 14 & 14', lateral cavity walls 16 & 16', and back cavity wall 18 & 18' all contained within coil shell 22 & 22'. Electrical circuit tubes 12 and 12" are generally comprised of circuit elements which may be transmission line elements including coaxial line, flat line, stripline, microstrip, wave guide or other distributed elements, inductors, capacitors, PIN diodes, or other lumped elements, printed or etched circuit boards, preamps, TR switches, phase shifters, amplitude modulators, and other electronics devices. Tubes 12 and 12' are inductively coupled by mutual inductance of the current elements in each. Cavity walls 14, 14', lateral cavity walls 16, 16', and back cavity wall 18, 18' are all electromagnetic shields or conductive strips comprised of conductive foil to complete the circuit, to limit radiative losses and to provide a Faraday shield for the coil 24. Coil shells 22, 22' are comprised of a nonconducting packaging material such as plastic or fiberglass to house the internal components of coil 24, which are discussed above. When combined, front wall 14', tube 12', lateral wall 16', back wall 18', and coil shell 22' are combined to form top section 28. In addition, front wall 14, tube 12, lateral wall 16, back wall 18, and coil shell 22 are combined to form bottom section 26. The internal construction of coil 24 is only essential to the present invention to the extent that it agrees with the external construction as shown in FIGS. 2a-6 and provides for some preferred manufacturing methods and materials. It is contemplated that coil 24 can have most any type of internal MR structure, however, preferably resonator 24 has a general internal structure similar to that of the teachings of U.S. Pat. No. 5,557,247, U.S. Pat. No. 5,744,957, U.S. Pat. No. 5,886,596, U.S. Provisional Application 60/135,269, U.S. Provisional Application 60/222,144, U.S. Provisional 60/378,111, or U.S. Provisional 60/373,808.

Through research it has been found that hospitals, physicians, and MR system operators prefer to have a coil, which comes apart in two halves for ease of subject accessibility. With respect to FIG. 2a, an exploded view of an embodiment for a coil of the present invention is shown. In a preferred embodiment, coil 24 is comprised of a top section 28, and a bottom section 26. While FIGS. 2-6 show coil 24 having only a top 28 and bottom section 26, it is fully contemplated that coil 24 could have a plurality of sections without departing from the spirit of the invention. However, for the purposes of this discussion, coil 24 is characterized as having a top 28 and bottom section 26. Generally, since the two halves of coil 24 are wirelessly coupled through inductive or capacitive coupling, there is no need for electrical contacts to bind top section 28 with bottom section 26. Basically coil 24 is comprised of conductor elements located in top section 28 mutually coupled to elements in bottom section 26. This reactive coupling is possible utilizing structures similar to those in U.S. Pat. No. 5,557,247, U.S. Pat. No. 5,744,957, U.S. Pat. No. 5,886,596, U.S. Provisional Application 60/135,269, U.S. Provisional Application 60/222,144, U.S. Provisional 60/378,111, or U.S. Provisional 60/373,808. Coil 24 can be viewed as an array of resonant units (each unit comprised of a conductive element with cavity segment) all reactively coupled to each other. Thus there is no need for hard electrical contacts to transfer energy between top section 28 and bottom section 26, thus the energy is transferred wirelessly. Alternately, as shown in FIGS. 2e and 2f, a plurality of sections 112 are reactively decoupled and driven by independent transmitters, or received by independent receivers or both transmit and receive such as is used in parallel imaging. These separate resonant circuits not only make top section 28 and bottom section 26 separable from one another they also have the added benefit of preventing switched gradient current induced eddy currents in coil 24.

With reference to FIG. 2c, previously known devices such as birdcage 100, discussed above, require electrical contacts to complete an end ring 102 circuit on each end. Birdcage coil 100 design has one or more end ring 102 circuits at each end of the coil design, which provide current return paths to separate legs that traverse between two rings 102. Thus, the operation of a birdcage coil 100 design relies on current flow through end rings 102. Therefore, separating birdcage 100 into two halves requires hard electrical contacts between the two halves to be broken. Electrical contacts provide many problems including being prone to wear, oxidation, intermittency, and potential safety hazards for the subject.

The current paths on conventional birdcage coils 100 are dependent on end rings 102 making birdcage 100 inductance dependent on the diameter of the coil. Large coils such as head and body coils are very inductive and therefore resonate at lower frequencies.

With reference to FIGS. 2d, 2e, and 2f, resonant cavity 110 circuit of the present invention does not depend on a current return path on an end ring 102, as does a birdcage 100. The current return in the preferred embodiment occurs on its associated cavity wall 108 segment, creating an electrically shorter, and therefore less inductive, more current uniform, higher frequency, and more efficient circuit than an equal sized birdcage 100. The operational frequency of birdcage 100 is dependent on and limited by the inductive end ring 102. TEM or cavity resonator 110 whose operational frequency is not dependent on or limited by an end ring 102 however can obtain much higher frequencies.

The current paths on TEM resonator 110 are not dependent on end rings 102, but rather on cavity wall 108 to provide a "return" path for current elements 109. TEM coil 110 can therefore be arbitrarily large in diameter such as a large body coil, and still resonate at frequencies limited only by the size of an individual line element. Segmented TEM coils 110 shown in FIGS. 2e and 2f are shown to highlight the individual segments 108 or line elements 109 of which a TEM coil 110 is composed. Because the operation of TEM coil 110 does not depend on an end ring 102, segments 112 from coil 110 can be removed as shown without affecting the operational coil.

Therefore, the present invention utilizes top section 28 reactively coupled, inductively and/or capacitively, to bottom section 26 to allow for a separable design without the necessity of hard electrical contacts. The two sections of coil 24 are coupled reactively to one another so that all electrical circuits of coil 24 are sealed harmlessly inside dielectric coil packaging 27. The present invention not only makes coil 24 more accessible to subjects, it also minimizes or prevents any electrical shock hazard to the subject. Further, the separation of top section 28 and bottom section 26 assists in preventing eddy currents.

Another benefit of the reactive design of coil 24 is the ability to create an open window 29 substantially near the top of top section 28. As discussed above, a common problem with present systems is the coil giving the subject either an increased feeling of claustrophobia or not providing enough room for subjects with large heads, noses, and/or chins. Since, top section 28 has several openings 25, between inductively coupled elements of coil 24, the subject can freely see out of coil 24 and thus the feeling of claustrophobia is significantly reduced. Additionally, general medical access and vocal communications are not impeded due to open sections 29 & 25. Further, if the subject has a large head, nose, and/or chin, open window 29 allows the subject to fit comfortably within coil 24 as is depicted in FIG. 2b. The use of open window 29 allows a larger head to fit, into a smaller, closer fitting, and therefore more efficient coil 24.

Figure 2A:
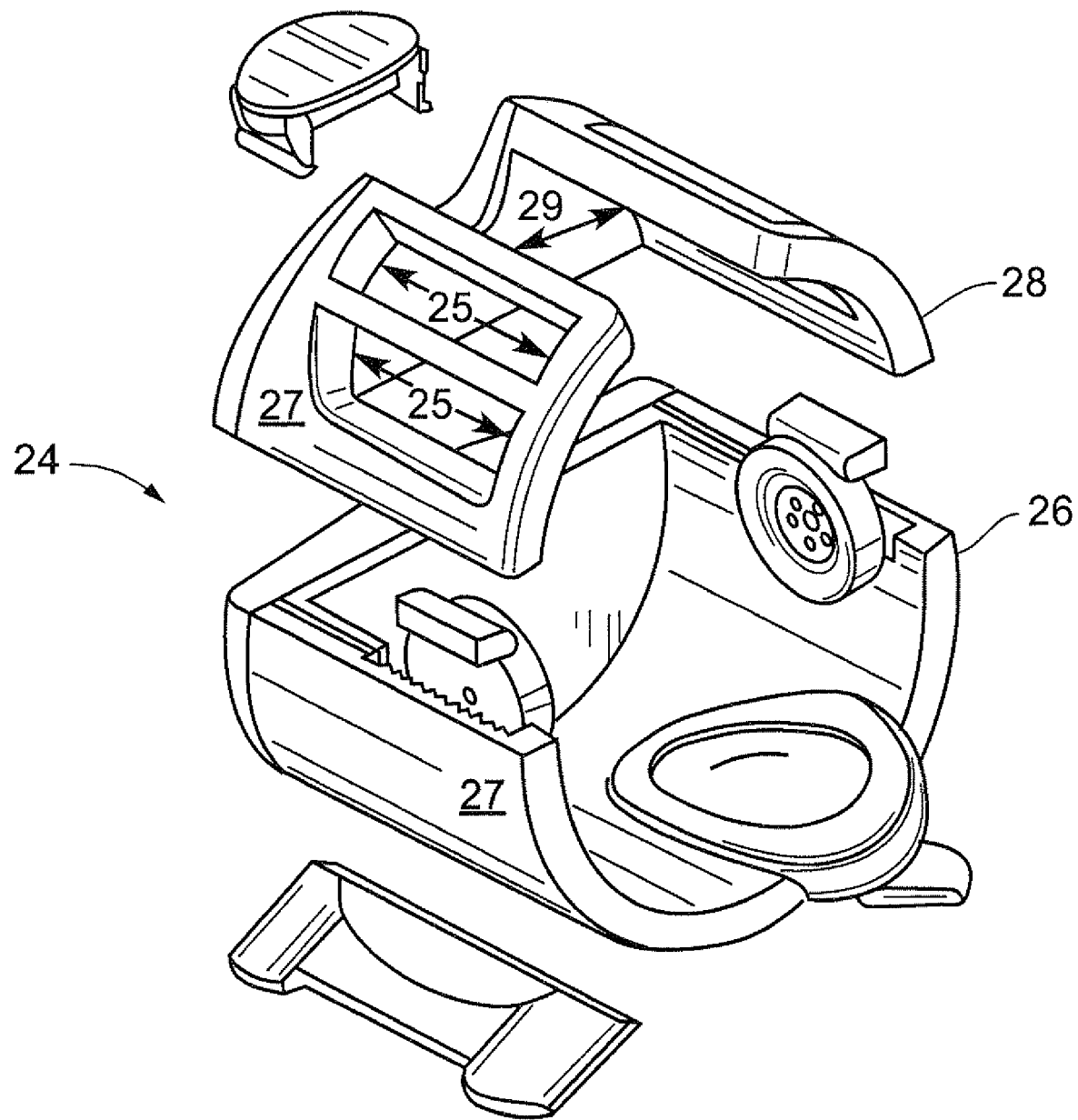
FIG. 2a is an exploded view of a resonator according to an embodiment of the present invention.
Figure 2B:
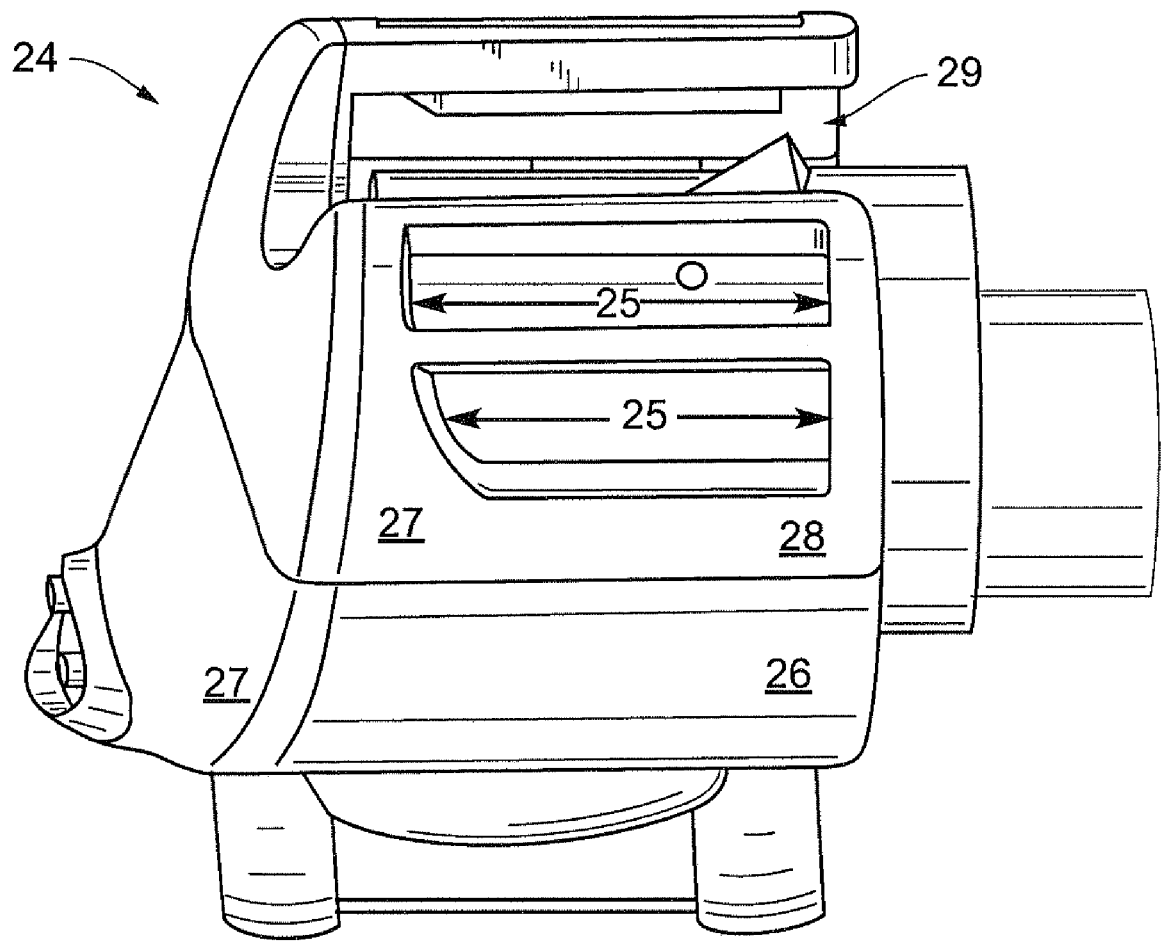
FIG. 2b is a side profile diagram of a simulated subject's head within a resonator for the present invention.
Figure 3:
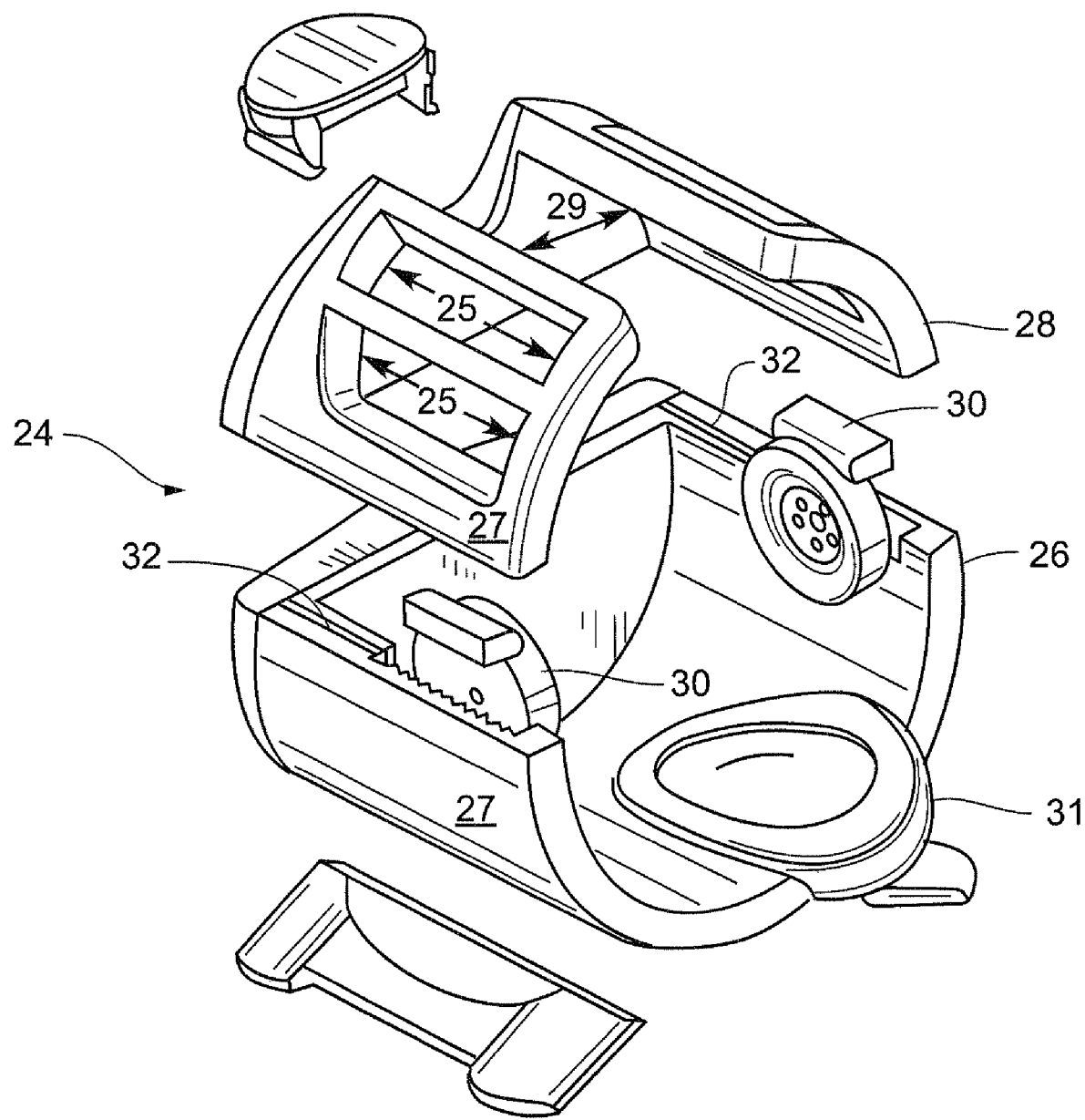

FIG. 3 shows an enlarged view of FIG. 2a. With respect to FIG. 3, combination head restraints 30 and head cupped cushion 31 are shown. As stated above, regardless of the amount of padding used to prevent motion of the subject's head there is inevitably still some motion. Moreover, the padding can cause the subject some discomfort from compression and an increased feeling of claustrophobia. Combination head restraints 30 and head cushion 31 of the present invention not only provide an improved cushioned 3-point head restraint system from an ergonomics' viewpoint, but head restraints 30 also provide communications to the subject from the MR operator, relaxing music or other entertainment to the subject, and hearing protection by passive or active sound suppression means. Audio input into the head restraints 30 may be by cable, optic fiber, sound tube, or wireless means.

As can be seen from FIG. 3, head restraint earpieces 30 can be positioned in any direction to accommodate the size of the subject's head. Furthermore, head restraints 30 and head cushion 31 may come in a variety of sizes for use on a variety of subjects. Head restraints 30 and head cushion 31 would be chosen, depending on the subject's head size to ensure that the subject's head is held snugly in coil 24 to prevent motion, but not so snug as to cause pain. Further, because head restraints 30 and head cushion 31 are compact they do not crowd coil 24, thus allowing the use of a smaller more efficient coil while reducing any feeling of claustrophobia. Other methods of adjusting head restraints 30 and head cushion 31 are contemplated, such as having cushions that can expand and contract to the subject's head by simply rotating them in a clockwise-counterclockwise motion, cams, or other means without departing from the spirit of the invention. With further reference to FIG. 3, guiding slots 32 are shown. Guiding slots assist in assuring mutual alignment between top section 28 and bottom section 26.

Figure 4:
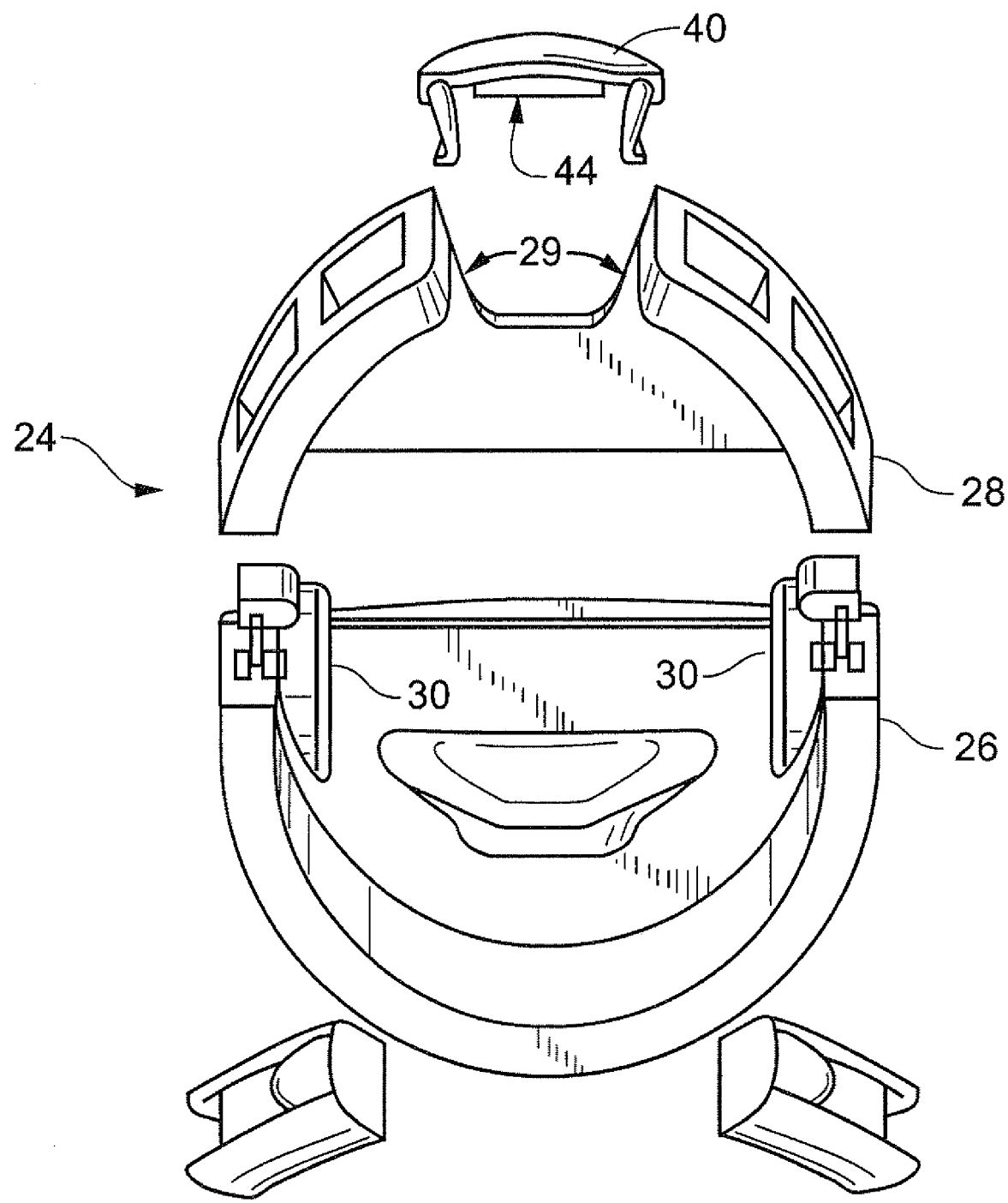
FIG. 4 is an exploded front profile of a resonator for the present invention.
Figure 5:
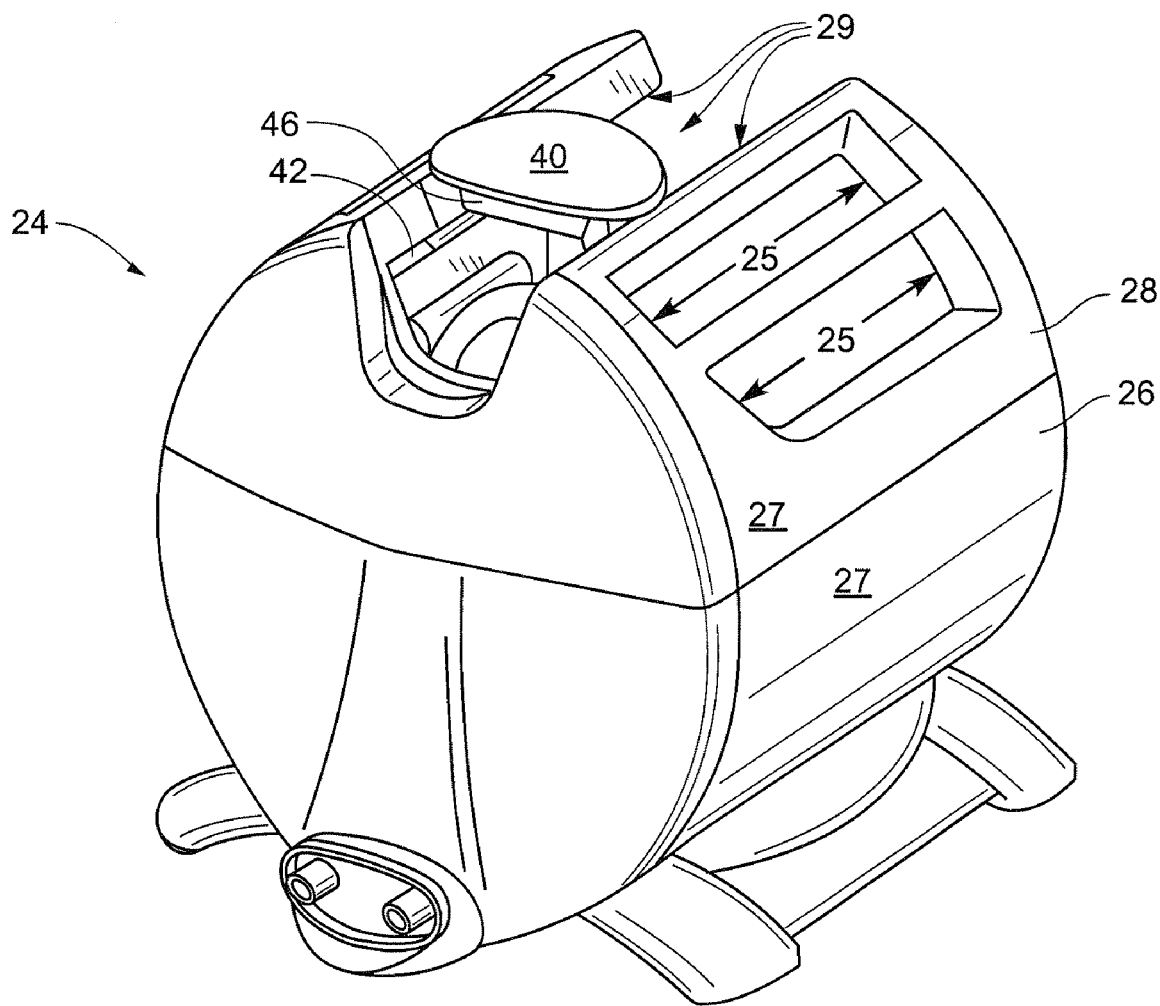
FIG. 5 is a rear side profile view of a resonator for the present invention.

With reference to FIGS. 4 & 5, an I/O device of the present invention is shown. I/O device 40 can be any type of IO device including but not limited to mirrors, prisms, video monitors, LCD devices, optical motion trackers, etc. In one embodiment I/O device 40 has a front mirror 44 and a rear mirror 46 facing the front and rear of coil 24 respectively and is mounted on track 42 over the subject's face. I/O device 40 can then be adjusted to multiple positions, directions, and configurations without moving the subject. Further, in contrast to prior systems where the outside radius of the coil is increased by mounting I/O device(s) on top of or extending from the top of a coil, I/O device 40 is mounted wholly or in part within the radius or outside dimensions of coil 24. It can be seen from FIGS. 4 & 5 that I/O device 40 is particularly well suited for mounting inside open window 29 (discussed in more detail above) above the face in coil 24. I/O device 40 can be moved along track 42 from one end of the coil to the other. By sliding I/O device 40 along track 42, it can be adjusted to any subject's useful viewing angle, including looking forward or backward. For example: receiving visual information projected to the subject from the front or the back of the MR magnet (discussed in more detail below). The versatile and low profile construction of I/O device 40 allows for coil 24 to be used in close fitting head only MR systems, and in head gradient inserts used in whole body MR systems. Further, it is contemplated I/O device 40 could be replaced or complemented by similar platforms to perform other I/O functions such as positioning temperature, air, oxygen, anesthesia, IV tubes, or the like relative to a subject's mouth or nose. It is further contemplated that input/output device 40 can be any visual, olfactory, gustatory, or auditory transducers providing two way communication or stimulus. I/O devices can also be used for delivery of therapy, robotic execution of surgery, and physiological monitoring including temperature, blood pressure, respiration, EEG, EKG, etc.

Figure 6:
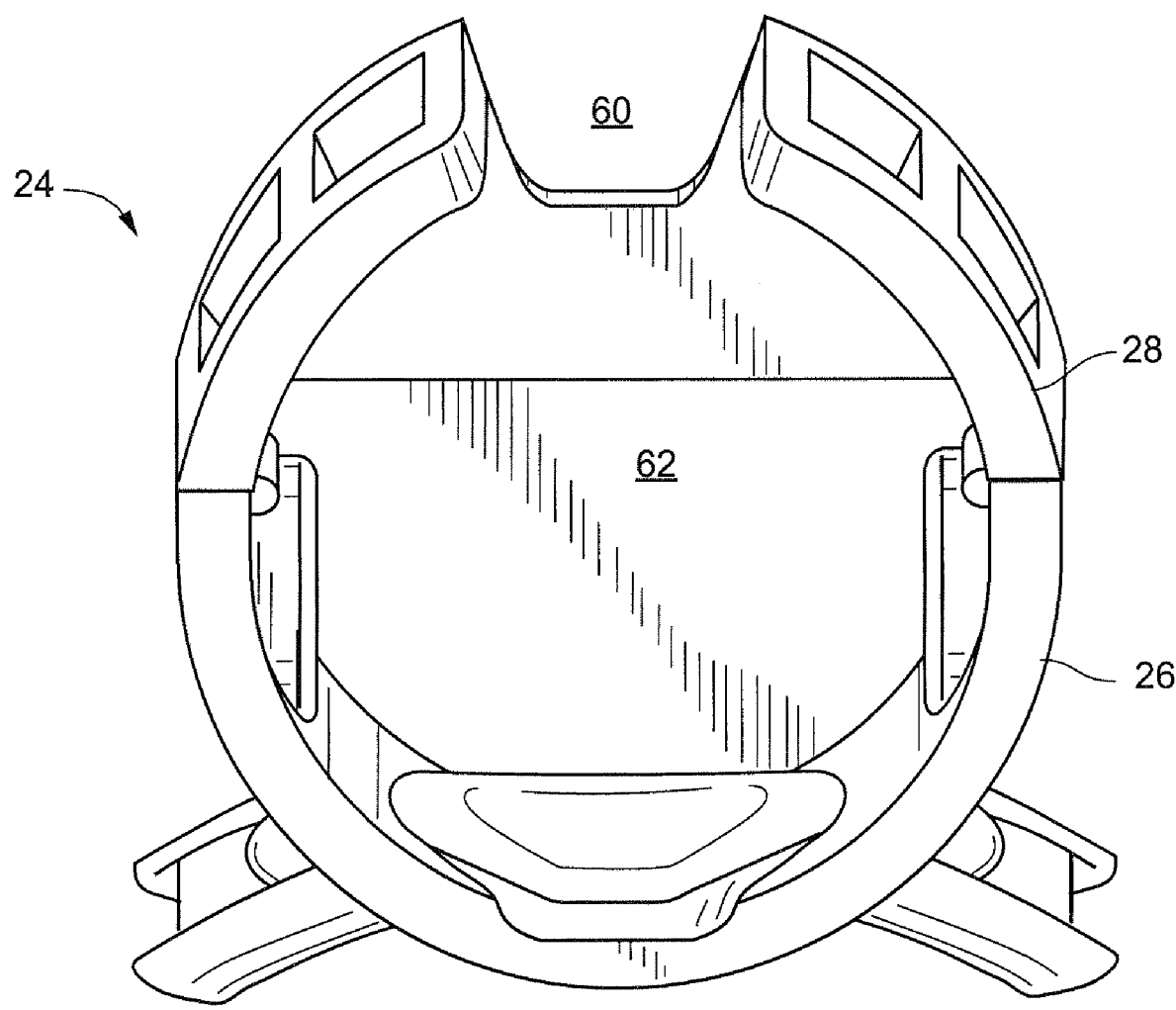
FIG. 6 is a front profile of a resonator for the present invention.

With respect to FIG. 6, a front view of a resonator is shown. As discussed above, back planes on RF coils function as an RF mirror to extend the uniformity of the coil's transverse RF magnetic field along the rotational or "z" axis of the coil. The lack of end rings on a TEM coil further enhances the field extent on the z-axis. A back plane or end cap can be used in coil 24 located within back wall 62 to make the coil shorter on the z axis, and therefore more ergonomic, better shielded, and more electrically efficient coil for a desired field of view. In coil 24 for example, back wall 62 of coil 24 housing a back plane makes it possible to build a coil short enough to fully expose a subject's mouth, and make the coil more efficient at higher frequencies, while still covering the whole head field of view desired for a standard head coil. In contrast, a conventional cylindrical birdcage head coil without an end cap may be twice as long, less efficient at high frequencies, and more prone to promoting claustrophobia. A back wall in a head coil is more desirable for coil performance and ergonomics on the "mouth" end of the coil.

Visual signal projection is often performed from the rear of a magnet and through the back of a coil to mirror or prism systems mounted above the subjects' eyes. Blocking this access with a coil back plane or endcap therefore prevents visual signal projection. The present invention solves the rear magnet access problem; at least in part by providing a substantial channel 60 in back wall 62 of coil 24. Opening 60 is located high in coil 24 to minimally affect the imaging performance in the head area of coil 24 while giving maximum access for rear visual projection systems. Therefore, opening 60 allows the coil 24 to preserve the advantages of a closed end coil, while allowing for most of the benefits of an open-ended coil. Further, channel 60 provides general medical access for temperature, air, oxygen, anesthesia, IV tubes, EEG leads, physiological monitors, or the like.

The tuned TEM resonator of the present invention is exemplified by a transmission line tuned coaxial cavity resonant in a TEM mode. The coaxial line tuning elements correspond to the "slotted" hollow center conductor of this coaxial cavity.

In FIGS. 8a and 8b, the TEM cavity volume coil is shown in the form of a reentrant cavity 121 such as is used for klystrons and microwave triodes (8). The cavity is reentrant in that its conductive boundaries 122, 123, 124, 125 and 126 extend into or reenter the volume encompassed by the cavity. Using transmission line theory, approximations of the distributed impedance coefficients R, L, C, the fundamental TEM mode resonant frequency, and the resonant Q of this cavity are made. The coaxial cavity is similar to a coaxial line shorted at two ends and joined in the center by a ring capacitor $C_c'$ and having the dimensions $$o.d.=2b_c' \text{ i.d.}=2a_c \text{ length}\approx 2l.$$

The input impedance to each low loss, shorted coaxial half cavity is given by $$Z_{in}=Z_o \tan h(\alpha+j\beta)l \quad (1)$$

The characteristic impedance for this coaxial cavity is derived from Eq. 2:

$$Z_o=\sqrt{L/C}=(\eta/2\pi)(\ln b/a) \text{ for } \eta=\sqrt{\mu/\epsilon} \quad (2)$$

For a coaxial cavity whose outside radius is $b_c$ and whose inside radius is $a_c'$ $$Z_{oc}=(\eta_0/2\pi)\ln(b_c/a_c) \quad (3)$$

$$Z_{inc}=Z_{0c} \tan h(\alpha_c+j\beta_c)l, \alpha_c \approx R_c/2Z_{0c}$$

for $\alpha=0$, $$Z_{inc}=Z_{Oc} \tan \beta_c l \quad (5)$$

For $Z_{inc}=X_{inc}$ Eq. (12), the distributed inductance $L_c$ of the low loss cavity is:

$$L_c=2X_{inc}/\omega 2Z_{0c} \tan h(\alpha_c+j\beta c)l/\omega$$

For the low loss coaxial cavity, $$L_c=2Z_{0c} \tan (\beta_0 l)/\omega=2Z_{0c} l/\upsilon_0 \quad (7)$$

Compared to a lumped element coil circuit enclosing a given volume, the inductance Lc of the coaxial cavity containing the same volume is significantly lower. The center gap series capacitance Cc required to resonate this cavity at the design frequency $f=\omega/2\pi$ is:

$$C_c=\tfrac{1}{2}\omega X_{inc}=\tfrac{1}{2}\omega(Z_o \tan h(\alpha_c+j\beta_c)l) \quad (8)$$

And for the low loss approximation, $$C_c=1/(2\omega Z_0 \tan \beta_0 l) \quad (9)$$

This center conductor gap capacitance could be supplied in lumped elements or by a capacitive ring 127 as pictured in FIGS. 8a and 8b. Stray capacitance Cs between the inner and outer walls of the coaxial cavity contributes a small fraction of the value Cc. Cs ultimately limits the cavity's self resonance frequency which is substantially higher than that of the lumped element coil of the same volume; a cavity of human head coil size will resonate above 500 MHz, for example. The stray capacitance for the lossless coaxial cavity is approximated by, $$C_s=\pi \epsilon l/\ln(a/b) \quad (10)$$

The fundamental TEM mode resonant frequency $f_0$ of the cavity given by Eqs. 9, 10 is:

$$f_0=1/(2\pi\sqrt{(L_c C_c)})$$

The series conductor resistance $R_c$ in the cavity is determined by the frequency dependent surface resistance $R_s$:

$$R_c=(R_s/2\pi_c)(1/a_c+1/b_c)2l, \quad (12)$$

where $R_s=\sqrt{(\omega\mu_0/2\sigma)}=1\sigma\delta$.

Shallow skin depth δ of current flux in a good conductor $\sigma=\delta(10^7)$, S/m makes for the requirement of a large surface area of cavities for minimizing R. The skin depth, δ, of copper at 100 MHz, for example, is 0.0066 mm.

$$\delta=1/\sqrt{(\pi f \mu mu \sigma)}$$

The small, high frequency skin depth dimension however allows the use of very thin foil or surface deposited conductors which adequately conduct (and contain) RF currents and fields, but effectively attenuate low frequency eddy current propagation as induced by switching $B_0$ field gradient currents in the MR application. The characteristically high resonant $Q_{rc}$ of the cavity is:

$$Q_{rc}=\beta c/2\alpha c=2\pi f_0 L_c/R_c=2\pi f_0 Z_0/R_c \quad (14)$$

Although the optimum TEM mode Q occurring for the b/a ratio of 3.6 is not readily achievable in head and body coil applications in the meter bore magnet, practical coil dimensions allow for unloaded Q values in excess of 1000. The advantageous properties of decreased inductance, decreased resistance, increased frequency, high Q, and serf shielding for the coaxial cavity should now be clear.

To permit TEM mode magnetic field propagation in the utility center of the coaxial cavity, the hollow center conductor (reentrant wall with capacitive cylinder), must be slotted (1, 2). Unshielded lumped element capacitors or capacitive plates bridging the cavity's slotted center conductor "leak" to the conservative electric (E) field largely stored within these capacitors. Problematic stray E fields, however, which adversely affect the coil's tune, match, and phase stability as well as efficiency, can be better contained by using N coaxial line elements as tubular, shielded capacitors 129 (3), as in FIG. 9b. The conservative E field for the resulting TEM resonant cavity is thus largely contained within the dielectric regions between the floating outer conductors 130 of the coaxial elements, and the reentrant center conductors 131 which are interrupted or split at 132, but are otherwise continuous with the cavity 121. (FIG. 9b) The coaxial tuning element used is similar to a pair of open ended coaxial lines joined in the center by a continuous outer conductor.

For the fundamental TEM mode resonance, each mirrored pair coaxial element is in balanced series resonance with the cavity. The current waveform peak amplitude is centered on these balanced elements, and effects a transverse virtual ground plane which bisects the tuned cavity. A desired transverse $B_1$ field maximum and an E field minimum are thereby generated within the cavity center as desired.

The TEM cavity resonator is tuned to the design frequency by adjusting the reactance (both L and C) of the line elements 9. Gross adjustment is managed by dimensional design of the elements and the cavity. Fine tuning is performed by manipulating the center conductor gaps in the elements, i.e. positioning the center conductors to appropriate insertion depths.

The transmission line element tuned coaxial cavity according to the invention is the basis for high frequency, large dimensioned volume coils for MR applications, and can be briefly characterized as a "tuned TEM resonator".

Transmission line theory (7) provides the design equations for the TEM resonator. The input impedance to each open coaxial half element is given by Eq. (15)

$$Z_{in} = Z_0 \cot h(\alpha + j\beta)l \quad (15)$$

and its characteristic impedance is derived from Eq. (2). For the input impedance $Z_{in} = X_{ine}$ and characteristic impedance $Z_0 = Z_{0e}$' the distributed capacitance $C_e$ for each of the coaxial tuning elements is:

$$C_{e1/2-\omega} X_{ine} = 1(2\omega Z_{0e} \cot h(\alpha e + j\beta e)l)$$

The distributed capacitance of a series pair of lossless open line segments is easily calculated using $jZ_0 \cot \beta 1$ for approximating Ce $$Ce = \tan \beta el/2\omega Z_{0e} \approx 1/2Z_{0e} \upsilon = \pi \in_e l/\ln(b_e/a_e) \quad (17)$$

A coaxial tuning element of the cavity length 2l, FIG. 9b, is constructed for a desired $C_e$ by choosing the appropriate dimensions for the center conductor radius $a_e$ and the outer conductor radius $b_e$. The dielectric material for the elements is typically not air, therefore $\in_e = \in_r \in_0$ where the relative permittivity for commonly used Teflon is $\in_r = 2$. The distributed inductance $L_e$ for each coaxial element can be similarly derived from Eq. (15) for $L_e 2X_{ine}/\omega$, and approximated by:

$$L_e \approx (Z_{0e} 2le/\upsilon) = Z_{0e} \sqrt{(\mu_0 \in_e)} 2l \quad (18)$$

From Eq. (12), the resistance $R_e$ per element is:

$$R_e = ((1/\delta\sigma)/2\pi)(1/a_e + 1/b_e)2l$$

The total series inductance $L_t'$ capacitance $C_t'$ and resistance $R_t'$ for an N element tuned TEM resonator are:

$$L_t \approx L_c + L_e/N \quad (20)$$

$$C_t \approx NC_e \quad (21)$$

$$R_t \approx R_c + R_e/N \quad (22)$$

Resonant frequencies are:

$$f_r = \omega_r/2\pi = \beta\upsilon/2\pi = n\upsilon/4l = n/(4N\sqrt{(LC)}), n = \text{integer} \quad (23)$$

In the approximations for L and C above, small amounts of mutual inductance and stray capacitance in the TEM resonator structure were not considered. By Eqs. (20, 21, and 23) the TEM mode resonance for the tuned TEM resonator is:

$$f_0 \approx 1/(2\pi \cdot pi\sqrt{(L_t C_t)}) \quad (24)$$

The Q factor for the TEM resonator is:

$$Q_t \approx 2\pi f_0 L_t/R_t \quad (25)$$

When coupled inductively or capacitively to a matched transceiver network, the quality factor becomes Q/2 for the circuit loaded TEM resonator.

TEM resonator modes: The tuned TEM resonator is a closed-ring periodic delay line similar to a traveling-wave magnetron oscillator (9).

In the traveling wave type oscillation, the mode M dependent phase difference ΦM between the electrical oscillations of N successive tuning elements is such to produce a rotating AC field or traveling wave periodic with $\tau_M$ in the interaction space between the elements and the cavity of the resonator.

$$\Phi_M = 2\pi M/N = \beta_0 \tau_M \quad (26)$$

The traveling wave propagates in the azimuthal direction at an angular phase velocity $\omega_M$ for the fundamental harmonic of mode M and phase constant $\beta_0$ where angular phase velocity $\omega_M$ equals the resonant or eigen frequency of the corresponding mode.

$$+\omega_M 32 + \beta_0 d\Phi/dt \quad (27)$$

In the pass-band of the resonator, $+\Phi < \pi$, therefore from Eq. (27), $0 < M < N/2$ for the integer M. (N/2+1) resonant modes are possible in the tuned TEM resonator.

$$M = N\Phi_M/2\pi \quad (28)$$

Figure 10:
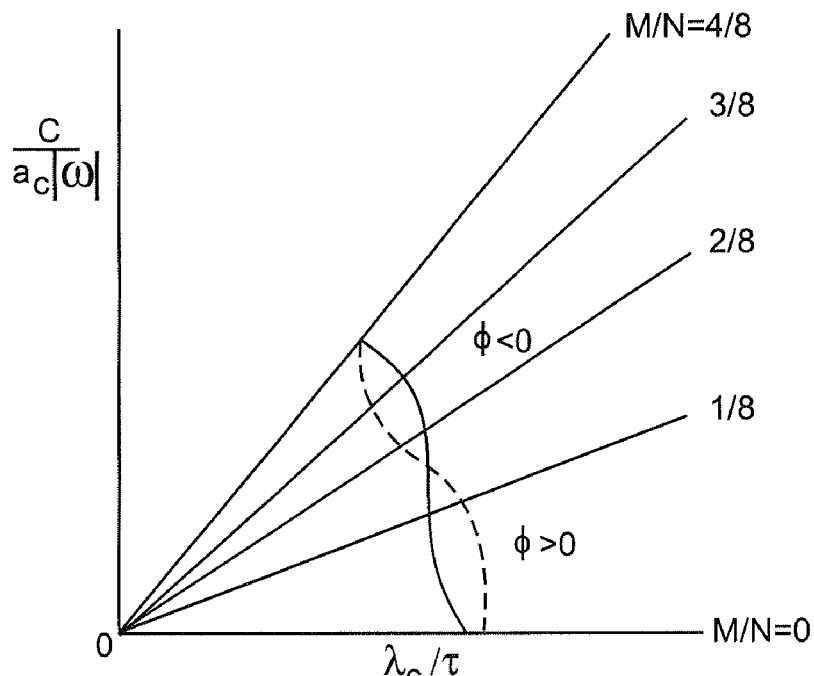
FIG. 10 is a diagram of the modes of an eight element TEM resonator.
Figure 11A:
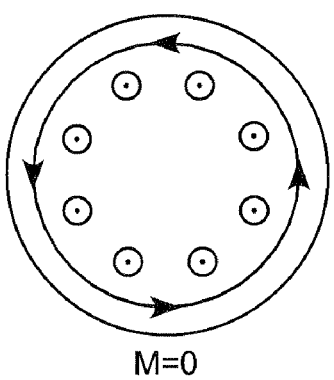
FIGS. 11a, b, c, d, e show $B_1$ flux line representations for the five modes of an eight element TEM resonator, according to the invention.
Figure 11B:
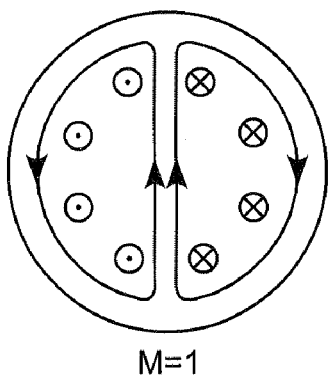
Figure 11C:
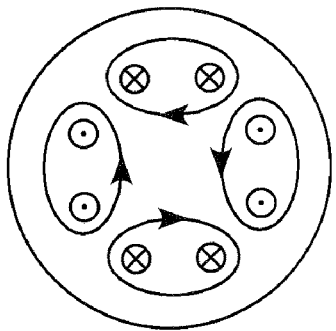
Figure 11D:
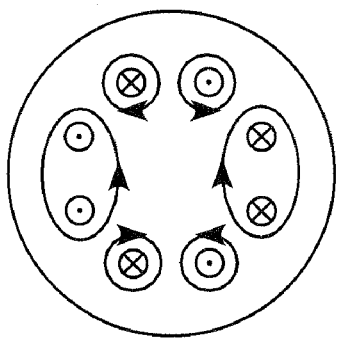
Figure 11E:
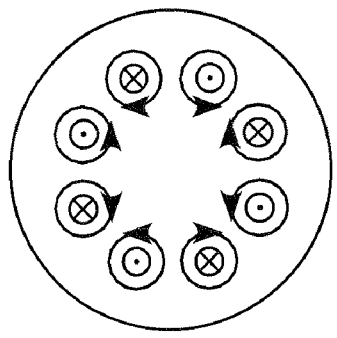

The fundamental modes and corresponding resonant frequencies of the eight element tuned TEM resonator are graphically described in FIG. 10. The ordinate y is the unitless "retardation" ratio of the free space propagation velocity to the "slow-wave" angular velocity of the closed delay line resonator of radius a.

$$y = c/a\omega = M\lambda_0/2\pi a = M\lambda_0/N\tau$$

The abscissa is the ratio of the free space wavelength $\lambda_0$ to the modal period $\tau_M = 2\pi a/M$ for the resonator. The curves $y = f(\lambda_0/\tau)$ for constant M/N are constant lines through the origin. The frequencies of the different fundamental modes are determined by the intersections of these constant mode lines with the dispersion curve:

$$c/a\omega = f(\lambda_0/\tau) \quad (30)$$

Because the angular phase velocity ω has positive and negative components (traveling waves propagate in two directions around the closed-ring resonator), separate dispersion curves of positive and negative phase Φ may exist resulting in more possible frequencies for the tuned TEM resonator, N in total.

The lowest frequency corresponding to M=0 (the cyclotron frequency mode) is the self resonance of the tuned TEM resonator Eq. (24). For this frequency with all tuning elements oscillating in phase, Φ=0°. The highest frequency and upper boundary for the fundamental modes corresponds to M=N/2, the π mode. In this mode all tuning elements are in phase opposition with adjacent elements, Φ=+180°. A single frequency standing wave results.

The remaining (N/2−1) modes of resonance are degenerate doublets for imperfect TEM resonator symmetries. A slight departure from circular symmetry in the resonator will cause+dispersion curve separation resulting in degenerate mode splitting. The azimuthal current distribution as a function of Φ in the resonator elements can be generalized for an imperfect coil as a Fourier series of positive phase (co-rotating) and negative phase (counter-rotating) traveling waves of unequal amplitude and phase, $$I = \Sigma_1^\infty (A_M^{cos}(\omega t - M\Phi + \delta) + B_M^{cos}(\omega t + M\Phi + \xi))$$

where δ and ξ are arbitrary phase constants. For perfect circular symmetry where A=B, and δ=ξ, the doublets converge to a single frequency for each respective mode. As coupling between the tuning elements decreases, the modal resonances converge toward a single frequency approximated by Eq. (24).

Mode M=1 corresponding to Φ=2π/N is the TEM mode of choice for the clinical MR application. This mode produces a transverse $B_1$ field whose maximum magnitude and homogeneity are coincident with the central transverse virtual ground plane of the tuned TEM volume coil. The 2π/N mode can be driven in quadrature for improved MR coil transmission and reception efficiency. This M=1 mode is closest to the single cyclotron mode (M=0), and is easily identified in non optimized coils as the lowest frequency split resonance.

According to the invention, if only eight elements of the resonator are tuned for a given frequency, the other eight are tuned for a different frequency, i.e. the TEM resonator can be double tuned by tuning even and odd elements respectively to two widely different frequencies (6). Two resonance groups then result of (N/4+1) modes each. Each resonance group consists of 2 single resonances separated by (N/4+1) degenerate double resonances.

The second mode of each group generates the desired transverse $B_1$ field for the MR application. The double tuned TEM resonator so described is similar to the "rising-sun" magnetron oscillator (9).

Figure 12:
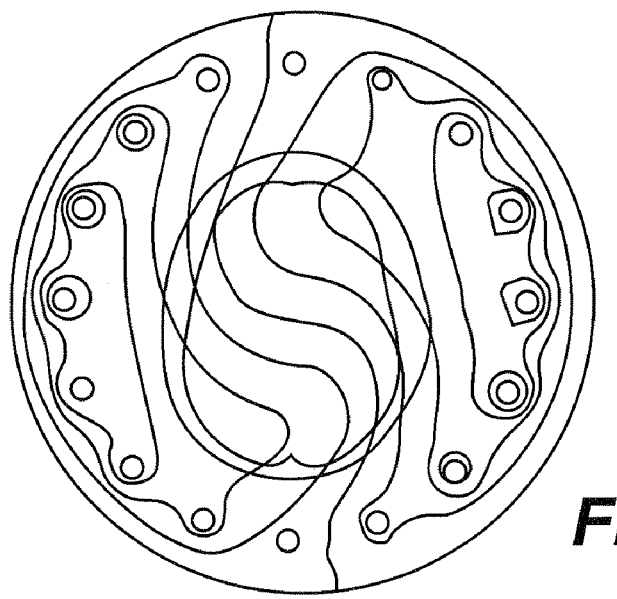
FIG. 12 shows time dependent $B_1$ magnetic vector equipotentials for mode 1 of a head loaded coil according to the invention.

These are shown in FIGS. 12 and 18. Since FIG. 18 in effect contains FIG. 12, the following description of my invention will be mainly in terms of FIG. 18.

According to my invention, the same coil structure can allow operation at two or more frequencies. For example, the FIG. 12 coil can provide fields at either of the commonly used values 70 MHz and 178 MHz. That is, while the 16 elements of FIG. 12, as a single set, can be tuned so that the coil can operate well at any single frequency in the corresponding range, e.g., (70-200) MHz, the elements can also be tuned so that the coil can operate well at either of 71 MHz and 175 MHz, or other frequency pair in that range. Thus, 8 of the 16 elements, preferably, every other one, can be adjusted to provide operation at 71 MHz, and the remaining 8 can be adjusted to provide operation 175 MHz. Such adjustments do not interact, because no element of one set is closely enough coupled to an element of the other set, that adjustment of the impedance of an element of the said one set, can significantly effect impedance in the said other set.

Of course, in providing multiple frequency operation, it is necessary to provide different values for other parameters, such as $B_1$. However, the coil of my invention can accommodate such different values by having corresponding sets of elements, which sets, once tuned, provide the desired frequencies without further adjustment of any elements, and without alteration of the physical configuration of the coil itself. In effect, then the coil of my invention is as many coils as there are frequencies for which the elements of my coil are tuned.

As will be seen from FIG. 18, my multiple tuned TEM resonator design, like the single frequency form of FIG. 12, uses 16 elements. However, these are divided into two groups of 8, each of which is mounted for adjustment independent of the other, by adjusting mechanism shortly to be described.

In practice, each group is tuned to some desired frequency by appropriately varying the depths of insertion of the center conductors, thereby fixing the elements' distributed impedances.

In use, one set or the other provides the desired field, and if necessary, is fine-tuned, just as if only 8 of its 16 elements are present. More generally, if there are n elements in all, then m thereof can form a set, thereby leaving (n−m) elements from which to form one or more additional sets.

Indeed, one will be able, in general, to provide k tunings, where k, the number of sets can be greater than 2.

Turning to FIG. 18, cavity 141, corresponding to cavity 121, FIG. 9a, is essentially a plastic cylinder 142 having a circular plate 144 and an end ring 145 fixed thereto, these three elements being provided with a conductive foil on its inside, so as to provide the conductive cavity configuration indicated in FIGS. 9a and 9b. Ring 24 allows a body member, such as the human head, to be inserted into the cavity.

Like cavity 121, the cavity 141 is provided with transmission line elements 149, like elements 9, but being 16 in number. In order to provide more than one tunable frequency, two, say, for simplifying illustration of the present invention, a pair of circular non-conductive plastic plates 146 and 147 have the center conductors 150 of the elements 149 affixed thereto. In this case, every other conductor 30 is affixed to just one plate. Thus, plate 146 is affixed to the center conductor 30 of a set of elements 149 corresponding to frequency A, and plate 147 is affixed to the center conductors of the remaining elements 149, which correspond to frequency B. The outer conductors 151 of all 16 elements 149 are fixed to plate 144 and end ring 145, and are electrically continuous with the metal foil on cylinder 142, plate 144, and end ring 145.

The conductors 150 are fixed in position by collet clamps 152, which releasably secure the center conductors 150. Clamps 152 themselves are fixed in place, as by being embedded in the respective plates, which are shown as transparent, though they could as well be opaque.

It will be evident that during resonator assembly, the depth of insertion of conductors 150 in the segments 29 can be set by loosening the collet clamps, then individually adjusting the depths of insertion of conductors 150 until by actual measurement a resonant condition exists when RF energy of the desired frequency is used to energize the coil. This tuning is coarse, but at this point, the collet clamps are set to fix the depth of insertion of conductors 150. However, plate 147 can be translated along its axis (which is also the axis of cavity 141), in order to move all 8 conductors simultaneously, so as to vary their depth of insertion, by equal amounts.

(This may be taken as a description of the construction and operation of the single frequency resonator of FIG. 12. That is to say, in FIG. 12, the only difference is that the 16 center conductors 150 have their depths of insertion adjusted, just as in FIG. 18, 8 conductors are so adjusted, in order to tune to the desired frequency.)

The remaining 8 center conductors in FIG. 18 are fixed to the plate 147 by collets 32, at their outer conductors 151. As with their 8 fellows, their depths of insertion are adjusted also, but so as to tune the coil to a different desired frequency. As before, collet clamps 152 releasably fix the conductors 150 in a circular plate 147 again of transparent plastic. Like plate 146, plate 147 can be translated along the cavity axis, thereby to vary the depths of insertion of the corresponding 8 conductors simultaneously, and by equal amounts.

Various mechanical movements cam be used for translating the plates 146 and 147, and indeed they can be moved directly by hand since the conductors 150 can have something of a friction fit in the dielectric of the elements, and in any event, the plates can be clamped in place by obvious means, not shown.

Preferably, I provide a simple screw mechanism, which acts colinearly of the plates' axis. Due to the symmetry of the arrangement, the plates cannot cock, and screw threading inherently provides clamping.

In FIG. 12, such screw mechanism 153 is just that: a screw 154. The screw 154 has its outer end terminated by a knob 155 for turning it, and has its inner end journaled at 156 in plate 144. The journal 156 may be any suitable hardware rotatably securing the end of screw 154 in plate 144, so that when knob 155 is turned, the screw 154 will rotate but will be prevented from translating along the coil axis.

Screw 154 passes through plate 157, which corresponds to plate 146, via a threaded bore (not shown) in the plate, the bore being coaxial with the coil axis. Turning knob 155 therefore causes the plate 157 to translate along the coil axis, whereby to adjust the central conductors' position simultaneously and by equal amounts.

In FIG. 18, a somewhat more complex screw mechanism 158 is provided. Mechanism 158 has a knob 159, corresponding to knob 155, in that turning it translates plate 146, but as will be seen later differs somewhat, structurally, from screw 153, though otherwise performing the same tuning function.

Corresponding to journal 156, mechanism 158 has journal 160 rotatably securing it to plate 144. Screw mechanism 158 is also threaded to plate 147 for translating it along the cavity axis.

FIG. 19 shows screw mechanism 158 in longitudinal section. Thus, corresponding to screw 154 and journal 160 of FIG. 12, in FIG. 19, a screw 161, terminating in the knob 159 at one end is journaled in plate 144 for rotation, without translation along the axis of plate 144. As shown, screw 161 is threaded into plate 146. A sleeve screw 163, in which screw 161 freely rotates has at one end a journaled portion 44 securing it to plate 146 for rotation without translation when knob 165, which terminates the other end of sleeve screw 163, is turned. The sleeve screw 163 is threaded to plate 147, so rotation of the knob 165 therefore causes plate 147 to translate along the axis of cavity 141.

In use, one first tunes the elements 149 whose center conductors are clamped in the collets of plate 146. Then one turns the other elements whose center conductors are clamped in the collets of plate 147. Since there is negligible coupling among the elements, neither turning affects the other.

The tuning features described above contemplate that, at the other ends of the transmission line segments, the initial depth of insertion of the corresponding center conductors, established in assembling the cavity, will not be changed in subsequent use. (The ring 145 will, of course, support the other outer ends of the elements 149, like the ring 24 does.) Additional tuning effect could be had by varying the depth of center conductor insertion at the other ends of the elements 149. This could be managed by an arrangement of rings corresponding to plates 146 and 147, which would serve to bodily adjust such depth of insertion, as do the plates 146 and 147. Note that one end of the cavity needs to be open for insertion of a body or body member.

In sum, then, one set or the other provides the desired field, and if necessary, is fine-tuned just as if only 8 of its 16 elements is present. More generally, if there are n elements in all, then m thereof can form a set, thereby leaving (n−m) elements from which to form one or more additional sets.

Indeed, one will be able, in general, to provide k tunings, whereby k, the number of sets, can be greater than 2.

The same approach allows the coil to be multiply tuned, in general, i.e., to three or more resonances.

TEM resonator $B_1$ fields: The free space magnetic vector potential contours (flux lines) for the five modes of the eight element TEM resonator are schematized in FIGS. 11a-11e. The mode M=1 is the obvious choice for efficient, homogeneous magnetic coupling to a central region of interest. Such free space AC fields are often approximated by the DC field Biot-Savart law. At radio frequencies beginning at about 100 MHz however, static field approximations of RF fields in human anatomy are no longer accurate. Similarly, simple homogeneous, isotropic geometries (spheres and cylinders) are not appropriate for modeling the human load.

Viewing the human body as a heterogeneous, lossy dielectric of tissue wavelength proportions, the electromagnetic propagation boundary effects of refraction, reflection and attenuation must be considered. Substantial axial eddy current shielding and orthogonal displacement current extension of the $B_1$ field are observed in human tissues at high frequencies. Fully time-dependent equations and complex numerical models are required for describing the high frequency coil $B_1$ field distribution in anatomic regions of interest. A time-harmonic magnetic field $B_1/\mu$ in a lossy, anisotropic, inhomogeneous coil-tissue system can be described by the differential form of the Maxwell-Ampere Law (10):

$$\nabla \times B_1/\mu = J_c + \delta D/\delta t \qquad (32)$$

By Ohm's Law the current density $J_c=\sigma E$, and by Euler's Law the electric field displacement $\delta D/\delta t = \delta \in E/\delta t = j\omega \in E$ so that Eq. (32) can be rewritten as:

$$\nabla \times B_1/\mu = (\sigma + j\omega \in)E$$

The complex value of E can be written in terms of the magnetic vector potential A, and the electric scalar potential $\psi$, such that:

$$\nabla \times B_1/\mu = (\sigma + j\omega \in) \cdot (-j\omega A - \nabla \psi)$$

Influencing the $B_1$ distribution and loss in human tissues adjacent to the coil are the $B_1$ field induced eddy current density, $J_e = -j\omega \sigma A$, and the accompanying electric field displacement current density, $J_d = -j\omega \in E = \omega^2 \in A$ for tissue specific values of $\sigma$ and $\in$. The magnetic vector potential lines A, and the contours $B_1 = \nabla \times A$ generated in a human head model by specified resonator element currents can be determined by solving numerically for A and $\psi$ in the equation:

$$\nabla \times 1/\mu \nabla \times A = (\sigma + j\omega \in)(-j\omega A - \nabla \psi) \qquad (35)$$

In FIG. 12, the Finite Element Method (FEM) is used to model a human head loaded 16 element TEM resonator operating at 175 MHz. The magnetic vector equi-potential lines A/m, for mode M=1 of the TEM resonator were numerically solved by Eq. (35). The two layers of the head were traced from a 4.1 T MR image, and represent brain and scalp/fat/skull respectively. Table values for frequency dependent $\sigma$, $\in$, and $\mu$ of human brain and skull/fat were assigned to the appropriate tissue layers of the model. The cross sectional view corresponding to the central transverse plane of the volume coil, is the Cartesian xy plane for the model with z being infinite. The coils 16 RF current elements are contained within a cavity's usual grounded conductive cylinder. With equal RF current amplitude in the elements separated by phase $\Phi=2\pi/N$, a transverse electromagnetic (TEM) field is generated within the transmission line model as shown. Note the flux line rotations present in the high frequency coil-head model of FIG. 12, but not seen in the free space/static field representation of M=1 in FIG. 11.

Figure 13A:
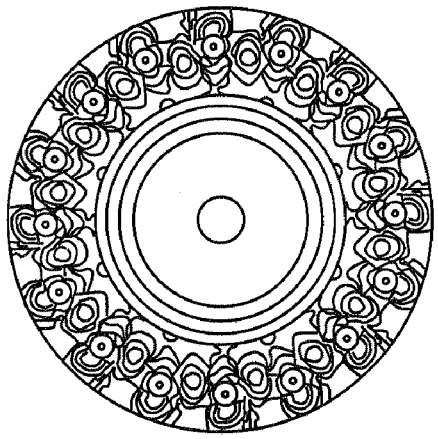
FIGS. 13a, b show time-dependent $B_1$ contours for mode 1 of the phantom and head loaded resonator according to the invention.
Figure 13B:

Calculated $B_1$ contours, T/m for phantom and head loaded TEM resonator models are shown in FIGS. 13a and 13b. Central to the current elements in FIG. 13a, is a 20 cm human head phantom identified by the contour pattern of five concentric circles. The phantom was assigned $\sigma$, $\in$, and $\mu$ values of human brain. All space not occupied by the coil cylinder, elements or subject's head is free. With a 175 MHz, 2 ampere current assigned to the elements, a 10 µT $B_1$ field is generated in free space at the surface of the head phantom. At 175 MHz the head becomes a lossy dielectric resonator with a $B_1$ field distribution substantially different than that of free space. The model predicts an attenuation of the $B_1$ field by 3 μT (30%) in the outside ⅓ radius of the phantom. This is the expected result of eddy current shielding. The model also predicts more than a 1 μT (10%) $B_1$ field enhancement in the inside ¹⁄₁₀ radius of the head. This displacement current induced $B_1$ enhancement compensates for the increased shielding expected for higher frequencies such that $B_1$ homogeneity is adequate for imaging the human head and body in fields of 4 T and higher. FIG. 13b presents the FIG. 12 scale model of a head within a coil which is excited with current levels required for gradient echo imaging at 175 MHz. The model predicts $B_1$ contours of highest magnitude to be in the frontal and occipital regions of the head due to their close proximity to the coil elements. The more distant temporal regions are lower in $B_1$ magnitude. The center of the brain shows the displacement current $B_1$ enhancement characteristic of the fortuitous coincidence of tissue σ/∈ and human head electrical dimensions at higher frequencies. Also beneficial is the eddy current retarding effect of the heterogeneity of human tissue and anatomical structure. The more heterogeneous two layer model in FIG. 8b predicts a $B_1$ inhomogeneity of less than +10% magnitude variation over the head compared to +15% variation over the single layer isotropic model of FIG. 8a. Empirical observations support the predictions from the coil-head, and coil-phantom models above (2, 4, 5, 13, 14).

Figure 14A:
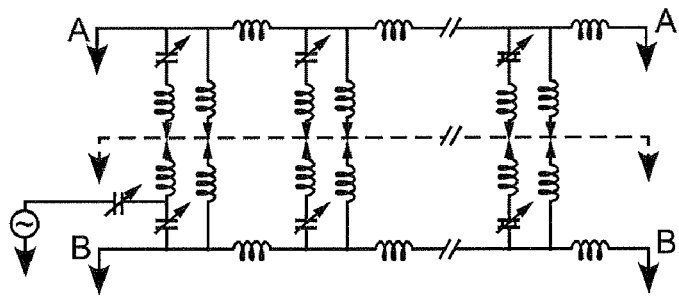
FIGS. 14a, b show alternative circuit models for a tuned TEM resonator according to the invention.
Figure 14B:
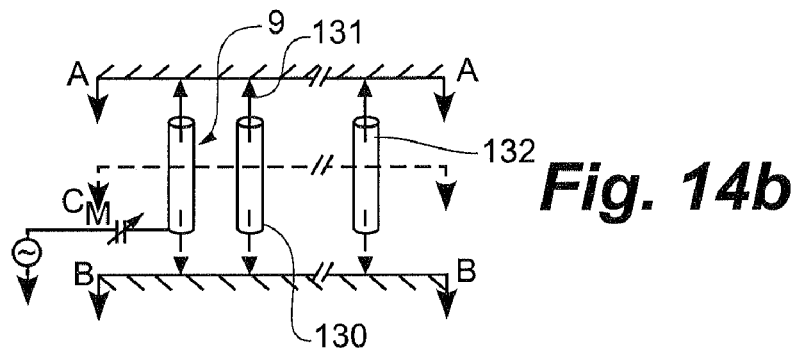

Alternative TEM resonator models: So far, transmission line theory was used to describe the tuned TEM resonator as a transmission line tuned coaxial cavity resonator. Alternatively, the TEM resonator can be approximated as a balanced comb-line, band-pass filter using the lumped element circuit of FIG. 14a. The lumped elements in this circuit approximate the distributed element coefficients of the transmission line circuit. Analysis of this lumped element filter circuit model adhering to methods in the literature for "bird-cage" resonators gives inaccurate results (15, 16). My invention's more accurate approach considers the lumped element filter's distributed stripline analogue in FIG. 14b. This network is a quarter wave (as in FIGS. 7a and 7c) comb-line filter interfaced with its mirrored image at the virtual ground plane of symmetry indicated by the dotted line. Each coaxial element, due to its split central conductor, therefore is a resonant half wave line (mirrored quarter wave pair, as in FIGS. 7b and 7c wave pair) whose bisected center conductor 11 is grounded at both ends to a cavity. The elements 9 are coupled via the TEM slow wave propagation h the cavity. The performance characteristics of this distributed structure are calculated from TEM assumptions (17).

Methods and Materials

Figure 15:
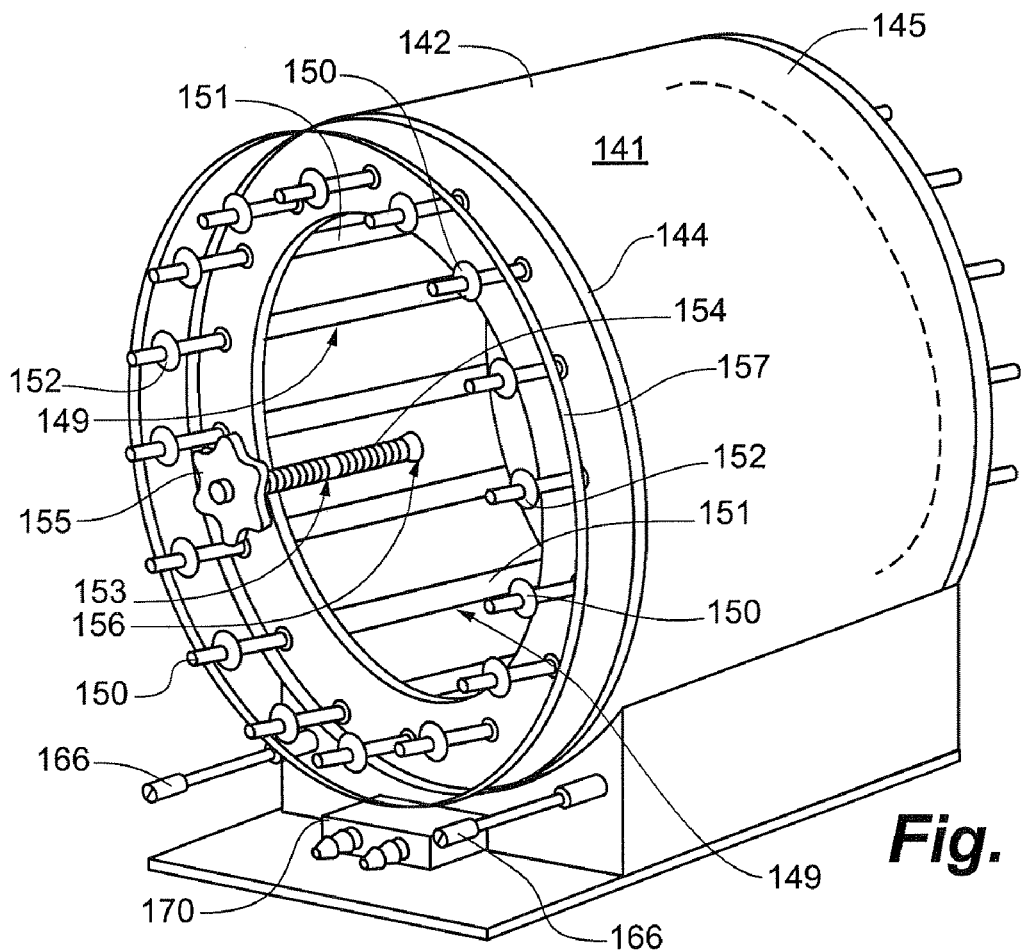
FIG. 15 is an elevation, in perspective, of a tuned TEM resonator for a high frequency, large volume MR coil, according to the invention.

TEM resonator construction: Single and double tuned TEM resonators have been built for clinical MR applications from 70 to 175 MHz. Prototypes have been bench tested to 500 MHz. Thus, FIG. 15 shows a 175 MHz (4.1 T) head coil. Here the tuned TEM human head sized resonator measures 34 cm o.d. (cavity) by 27 cm i.d. (elements) by 22 cm in length. The i.d. and length were determined by head size while the o.d. was chosen for compactness with some sacrifice of the optimal coil Q predicted for a larger cavity Eq. (14). The cavity itself is constructed of 1 mil copper foil 13 fitted to the inside and outside surfaces of an acrylic cylinder Eq. (13). Acrylic end members support the reentrant tuning elements and the copper foil making their continuity with the cavity. The cavity could be extended with foil on plate 144.

A "transmission line element" need be no more than a pair, or more, of conductors side by side, and AC coupled to each other by a dielectric therebetween. It is evident, therefore, that "coaxial cable" is not the only form the "elements" or "segments" may take in the process of my invention.

The tuning elements are 21 cm coaxial line segments 9 whose outer member 31 is a copper conductor whose i.d. is 12.7 mm (0.5"), and whose center conductor 30 is a bisected 6.5 mm (0.25") o.d. copper rod. Teflon sleeve inserts (not shown) provide the dielectric between conductors 150 and 31, and are machined to serve as both a dielectric and bearing surface between the two conductors. The Teflon sleeve thickness ($b_e$-$a_e$) should be greater than 3 mm to preclude the possibility of dielectric breakdown and consequential arcing during high peak power transmitting. 5 mm Teflon spacers 15 at each end of the coax segment maintain electrical isolation between the outer conductor 11 of the element 9 and the cavity foil 13 to which the center conductor is attached. See FIGS. 7 and 8 of Röschman (3) for an exemplary element construction of this sort.

The element component diameters and the number of the tuning elements used are determined for a desired frequency and coil size by starting with Eq. (25) and working backwards solving for N, $a_e$, and $b_e$. Assuming the lossless case for the lines and the cavity simplifies the calculations required. Using 4N tuning elements in the design facilitates quadrature drive. Typical values for N are 12 to 16 in a human head coil and 24 to 32 in a human body coil. Homogeneity is proportional to N whereas frequency is inversely proportional.

The divided center conductors of the tuning elements are conductively connected to the cavity 121 on one end thereof by the collet clamps 152, and on the other end by copper beryllium spring gaskets, copper straps, or the like. The collet clamps allow for fixed adjustment of the insertion depths of the center conductor halves during coil fabrication. The gaskets allow for variable adjustment during coil operation. By varying the insertion depth of their center conductors, the coaxial line elements are tuned to a desired coincidence of mode and frequency.

Figure 16:
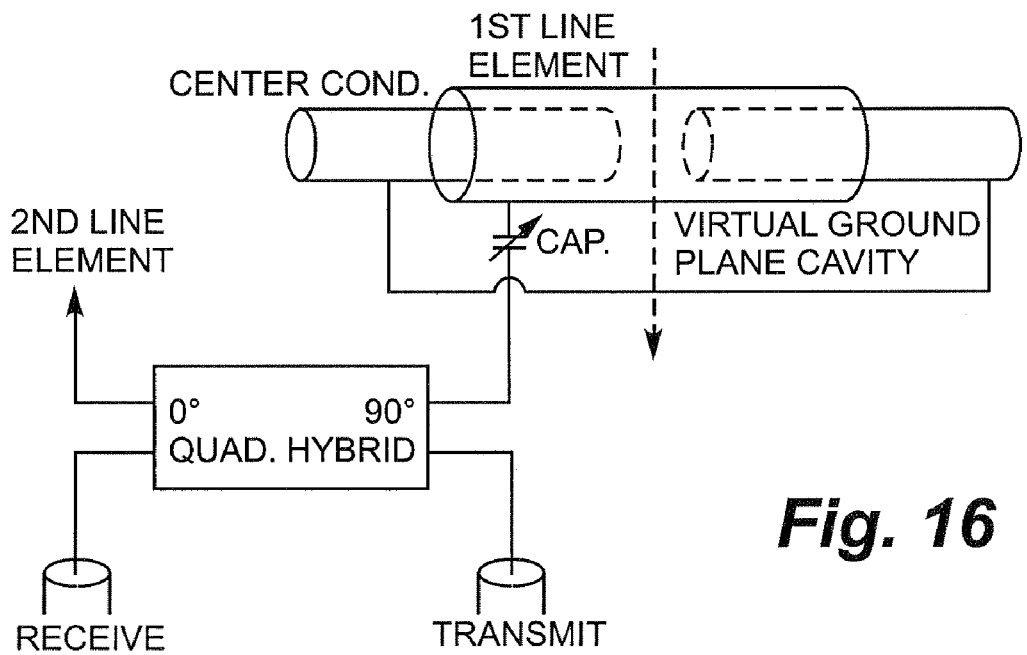
FIG. 16 is a circuit diagram of a driven coaxial line element used in the present invention.

As previously described, the center conductors on one end of the cavity are mechanically linked by a mobile plate and screw mechanism such that by turning a knob or knobs all can be adjusted in concert to tune the resonator without effecting its field symmetry. Two line elements 9 separated by a 90° azimuth angle are connected to a pair of 90° phased ports 21 of a strip line quadrature hybrid for quadrature drive of the TEM resonator. See FIG. 16 which shows one of two driven line elements for a quadrature excited resonator.

The hybrid porks are properly phased and impedance matched to the coil and its human head or body load via the reactance of variable reactors comprising variable series capacitance and/or balun circuits, not shown in FIG. 15, which, however, does show knobs 166 for varying said reactance. FIG. 18 requires an additional circuit of this sort, so knobs 167 would provide for varying reactance. The quadrature hybrids for frequencies A and B are identified by reference numerals 168 and 169. Reference numeral 170 identifies FIG. 15's quadrature hybrid.

Figure 17:
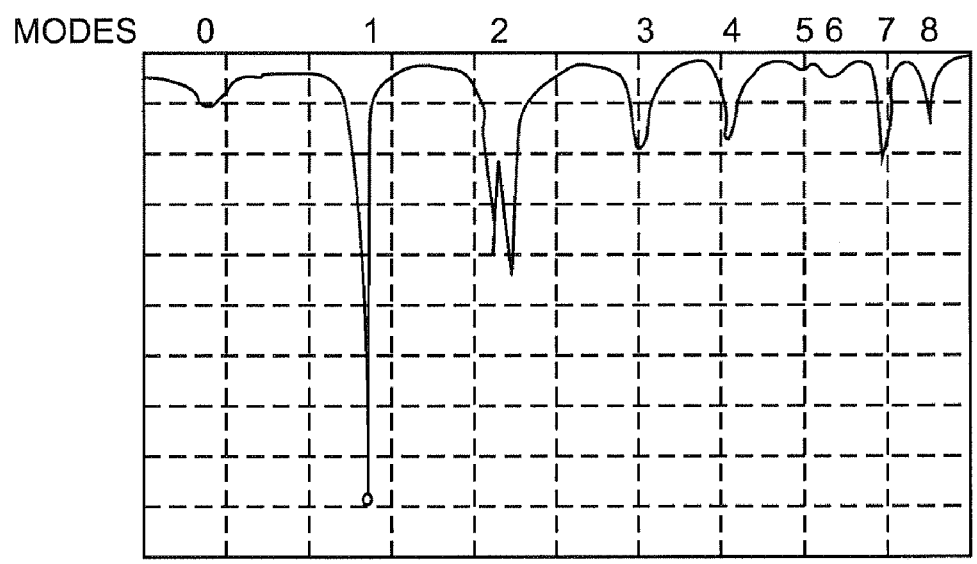
FIG. 17 is a diagram of transmission return loss showing resonances of a sixteen element resonator according to the invention.

TEM resonator optimization: Frequency tuning, impedance matching, quadrature phase isolation, $B_1$ homogeneity and sensitivity, and Q are among the more important performance characteristics to be optimized for any quadrature volume coil. After the TEM resonator is constructed, the first step toward optimization is to adjust all elements (2N half elements) to the equal capacitance values which tone the resonator's M=1 mode resonance to the design frequency. An RCL meter is used for element capacitance measurements. A network analyzer frequency swept reflection measurement is used to produce the return loss plot identifying the 16 element head coil's 9 resonant modes in FIG. 17. Mode 1, located at 174.575 MHz will initially appear as a double resonance as mode 2 for the non optimized coil. By an iterative method of free tuning the capacitances of individual elements (not unlike the tuning of a bicycle wheel through spoke adjustment), the mode 1 doublet will collapse into the well matched, high Q, single frequency point as shown. For the quadrature coil, the plot of FIG. 17 must be reproduced for mode 1 at each of the two drive points independently. Additionally, a transmission test should confirm better than 40 dB isolation between the quadrature drive points, at the design frequency. Maximum $B_1$ field amplitude should be verified on the axes orthogonal to the bisecting longitudinal planes of the coil containing the driven elements. $B_1$ transmission field magnitude and homogeneity are measured on the quadrature x and y axes with a directional magnetic field probe receiver. After the alignment of quadrature, well matched and isolated, high $B_1$ amplitude resonances at the mode 1 design frequency in the unloaded coil, the optimization process is repeated for the phantom loaded coil. The phantom electrically mimics a human head in volume and conductivity. The resonator is then fine tuned on human subjects. A stripline quadrature hybrid is finally connected to the two capacitively matched, quadrature drive points of the resonator. In the optimized coil, two superposed quadrature $B_1$ fields corresponding to the mode 1 frequency are measured, with peak amplitudes of 3 dB less gain than the previously measured single drive point linear fields. With all adjustments complete, the sliding center conductors of the coax segments are clamped into position at both the fixed ring and mobile plate ends of the coil. In the magnet, the resonator is tuned to different loads by turning the central knob 155 shown in FIG. 15, 46 are adjusted for precise impedance matching and 90° phase isolation between the two coil ports of the quadrature hybrid. Tune, match, and phase adjustments can readily be performed on each study.

Results

Single and double tuned TEM resonators perform efficiently from 70 to 175 MHz in human head and body applications. The Q ratio of a 175 MHz tuned TEM head coil design is a high 840/90 typical of resonant cavities. The tuning range for this tuned cavity design is arbitrarily large to an octave or better. This range facilitates the use of a given coil at different field strengths and for different nuclei. For a whole human head, 90° optimization is typically achieved with a 1 kW, 250 μsec square pulse. For each MR study performed, the TEM resonator is tuned to frequency, matched to a VSWR of 1.0 at both coil drive points, and quadrature phase isolated to greater than 50 dB, all without adversely influencing $B_1$ field symmetry. This In Situ optimization requires three external adjustments and less than three minutes time.

$B_1$ field patterns observed in phantom and human loads are consistent with the model predictions of FIG. 13. Equal element currents correlate to maximum homogeneity of $B_1$ field distribution in axis symmetric phantoms coaxially located within the coil. Head images from resonators with equal element currents do not show the best achievable homogeneity. The $B_1$ contour pattern calculated for equal currents in FIG. 13 predicts the inhomogenities in the head image of FIG. 18. $B_1$ coupling of the highest magnitude is in the occipital region of the head due to the head's close proximity to the coil elements. The intensity of $B_1$ coupling to the frontal region of the brain which is spaced further from the coil elements to allow for the nose, is less. The more distant temporal regions show the least signal intensity and corresponding $B_1$ field strength. The center of the brain shows the displacement current $B_1$ enhancement predicted. At high frequencies, a more homogeneous $B_1$ distribution in the head or other loads lacking perfect axial symmetry and position can be achieved by asymmetrically adjusting individual element currents while otherwise maintaining optimized performance characteristics for mode 1 of the coil. Element currents affecting higher homogeneity for a design and application can be calculated as before by numerically solving Maxwell's equations for finite-element scale models of the loaded coil. Homogeneity in the human head of 10% variation over a 15 cm d.s.v. has been achieved in practice, using a T1 weighted gradient echo sequence wherein TR=2500 ms, TE=17.5 ms, and TIR=1000 ms for a 3 mm, $512^2$ resolution single acquisition image. Only a relatively low level 400 W peak RF prefocussed pulse excitation wave form was required for head images. This is in contrast to the exceedingly high levels formerly predicted in the literature for high field clinical imaging. High resolution definition of the transcranial vascularity is thought to be enhanced by the high field susceptibility gradient imparted by the relative paramagnetism of deoxygenated hemoglobin in venous blood. 3 mm and 5 mm slice thickness brain images of $512^2$ and $1024^2$ resolution showing submillimeter detail of brain vasculature and neuroanatomy have been obtained (4, 18). Excellent quality human head and body images have been shown (19).

Using the tuned TEM resonator at 4.1 Tesla, the potential for scientific studies and clinical diagnostics from anatomic, spectroscopic, and functional imaging of the brain has been convincingly demonstrated. With 400 μM in plane resolution from 3 mm slices, clinically important structures such as the basal ganglia, red nuclei, thalami and the substantial nigra were clearly visualized in 20 volunteers, potentiating image based diagnoses of neurodegenerative disorders such as Parkinson's disease (20). In 8 healthy volunteers and 7 patients with temporal lobe epilepsy, the internal anatomy of the hippocampal formation was well defined. The alveus and fimbria were resolved from adjacent cellular layers; the stratum radiatum and lacunosum were resolved from the cornu ammonis. Atrophy, normal layer disruptions, and/or T1 and T2* deviations clearly indicated the affected hippocampus in all seven patients studied (21). High resolution spectroscopic images (0.5 cc voxels) from 10 healthy volunteers and 3 multiple sclerosis (MS) patients indicates the potential for using the spatial variability of NAA, creatine, choline, and lactate across MS plaques for the diagnosis and understanding of the disease (22). In high resolution NAA images of the whole brain, the loss of NAA from small stroke penumbra is dramatic (23). The high spatial and temporal resolution detection and quantification of the amino acids glutamate and glutamine are important for mechanistic studies and diagnoses of metabolic disorders such as hepatic encephalopathy (24). High resolution spectroscopic imaging studies of 10 human subjects have been used to quantify gray and white matter metabolites in the whole brain In-Vivo (25). The tuned TEM resonator has proven effective for the application of homogeneous, high resolution 3-D cerebral activation mapping (functional imaging) of the human brain at 175 MHz (26). The preceding results and those from studies in progress, demonstrate the effectiveness of the tuned TEM resonator design for high field clinical applications.

Human in, ages and spectra obtained with an experimental 4.1 T MR system indicate the advantages gained by performing clinical studies at higher $B_0$ fields. These advantages of S/N, spatial resolution, temporal resolution, chemical shift resolution and the magnetic susceptibility enhancement of brain and other organ functions point to higher $B_0$ fields in clinical MR.

An RF coil in accordance with embodiments of the invention achieves these advantages, allowing it to replace coils of the present lumped element technologies which have been used for clinical sized volumes at higher frequencies. The distributed technology presented herein, making use of transmission lines and resonant cavities, performs well over the tested bandwidth of 70-175 MHz for human head and body coil applications. Beyond this, bench tested prototype single and double tuned large volume coils forecast successful use of the tuned TEM resonator at frequencies to 500 MHz, for human volumes, and even higher for smaller volumes.

Figure 20:
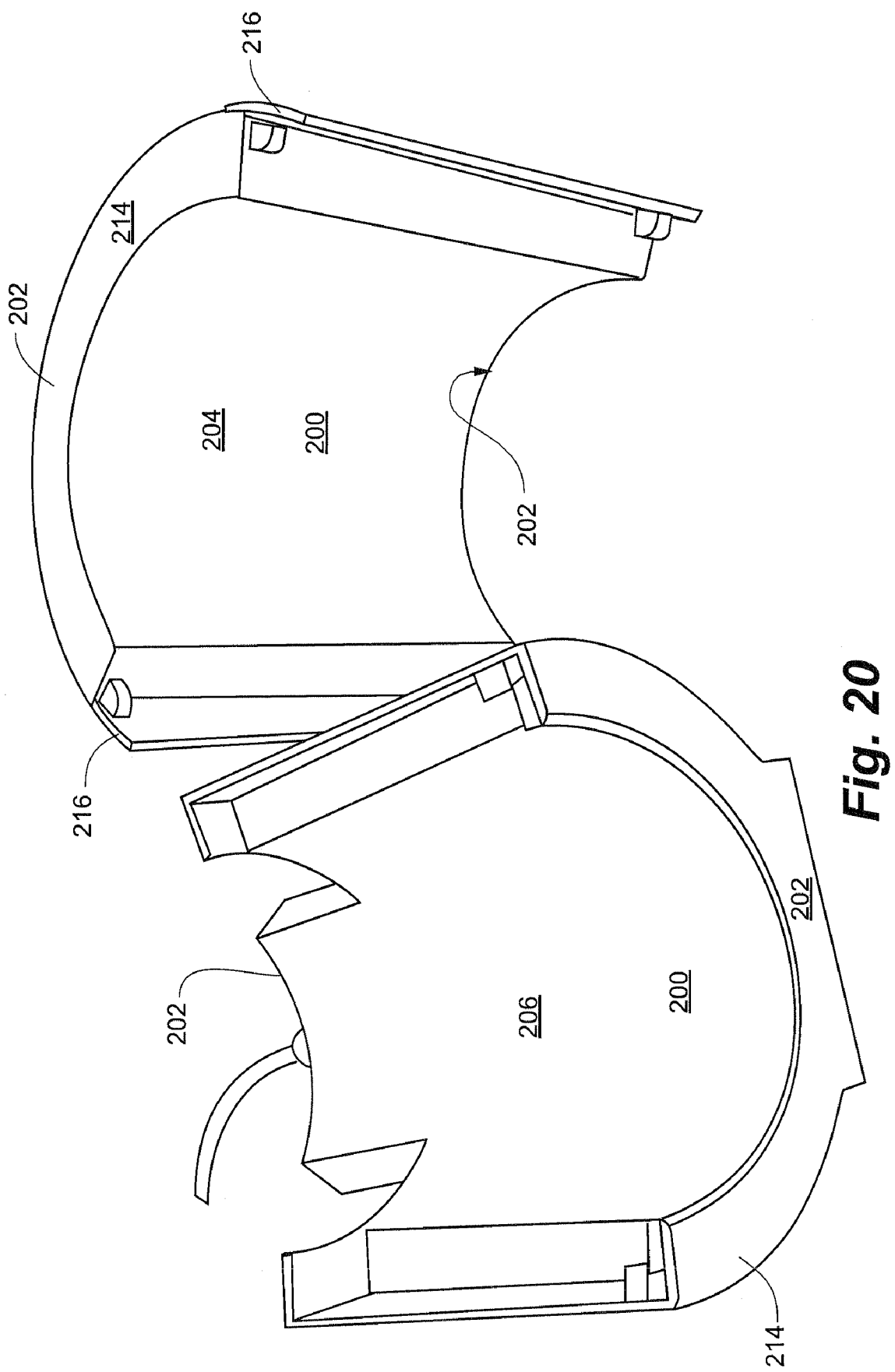
FIGS. 20-22 show embodiments of a dual open ended TEM resonator in embodiments of the present invention.
Figure 21:
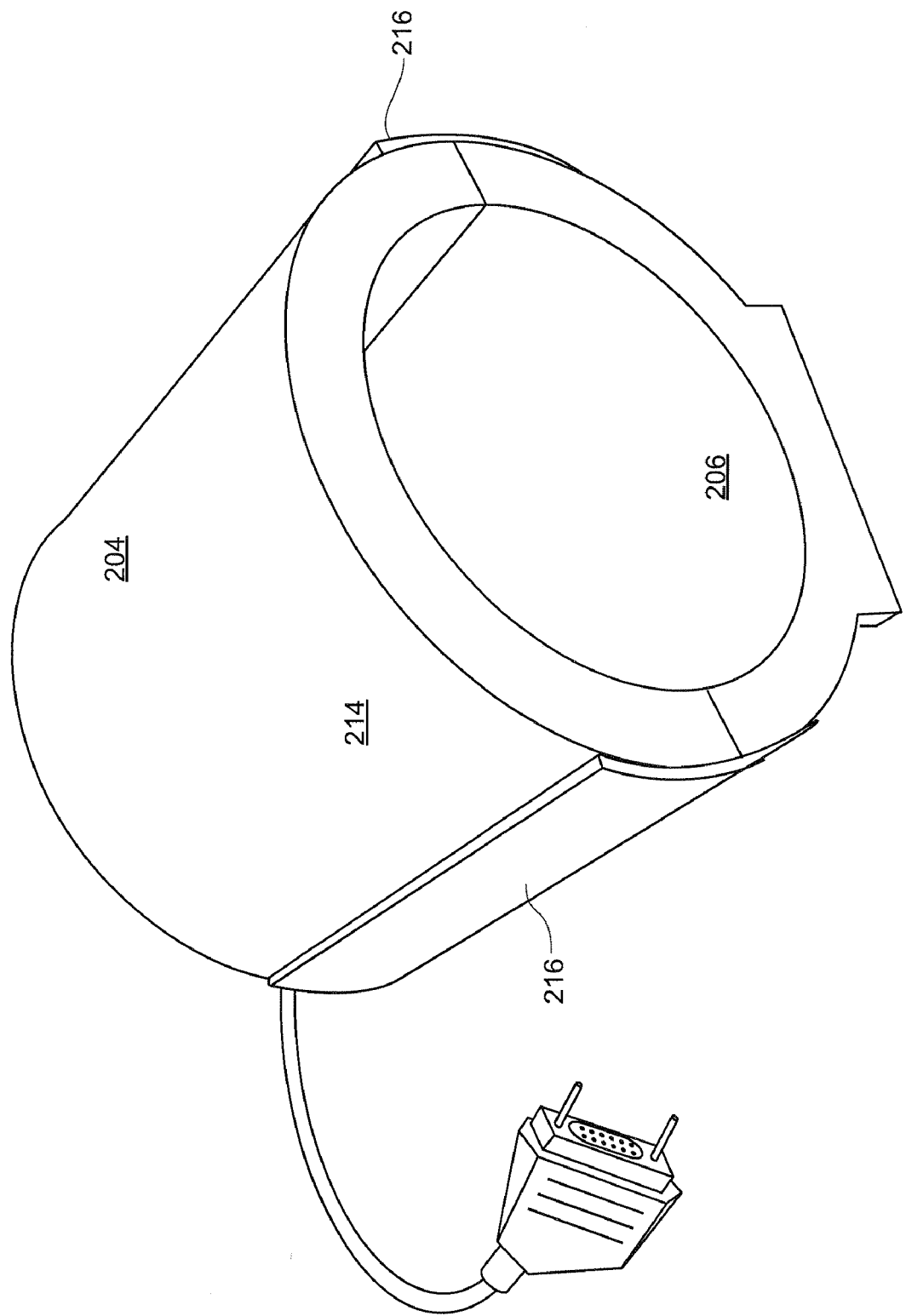
Figure 22:
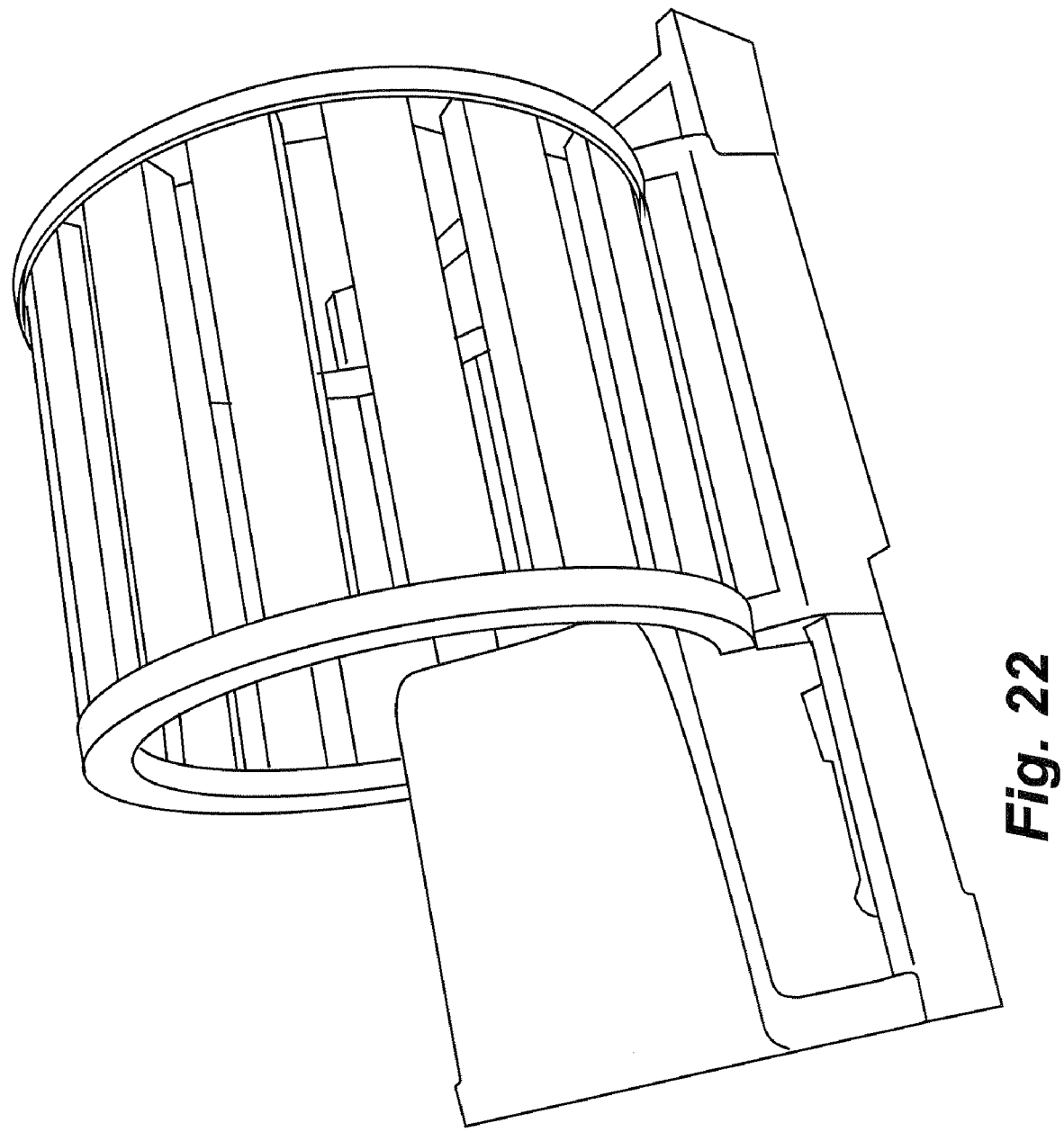

With reference to FIGS. 20-22, a dual open-ended TEM resonator in accordance with embodiments of the invention is shown. These embodiments are described with reference to an exemplary knee coil, however, the embodiments are not limited to MR coils for imaging patient's knees, and could be used for imaging many structures of interest, including most any body part, without departing from the scope of the claimed invention. Knee coil 200 is similar in structure and operation to the coil referenced above. Coil 200 may be open at both ends 202 according to some embodiments, as shown. Top half 204 and bottom half 206 are separable so that a patient can place their leg in bottom half 206 and then put top half 204 over the top of the leg, or vice versa. It should be noted that, while the embodiment is herein described as a leg coil or knee coil, it is fully contemplated that the embodiment described could be adapted to function as a foot coil, an arm coil, an elbow coil, a wrist coil, body coil, a coil for imaging an animal, a bag of food, or a petroleum line, for example without limitation. The embodiment described could be used in many situations where the operator wishes to split coil 200 into two or more sections, and fit it around an imaging subject of interest, for example, to achieve a good fit (e.g., a closely conforming fit) that might not be attainable if the coil 200 were not separable.

As discussed above, TEM coil 200 provides several benefits over the conventional technology birdcage approach. For example, each transmission line element 208 (FIGS. 23 and 24) in TEM coil 200 is an independent resonator. In the present embodiments, with each independent transmission line element 208 being capable of functioning as an independent resonator, it is possible to achieve higher efficiency at higher frequencies. Further, coil 200 may be adapted to be separated into a plurality of sections, such as sections 204 and 206, or even more sections. Having a plurality of separable sections provides better patient access to the coil. Further, as discussed above in detail, this can be done without making or breaking hard electrical contacts that would be required to connect end rings on conventional birdcage technology coils, for example.

Coil 200 may be shielded (e.g., self-shielded), according to certain embodiments. Shielding may be provided by the arrangement and composition of the transmission line elements 208, for example. As an example, for each inner conductor 212 of transmission line element 208, outer shield portion 210 (e.g., the outside portion of transmission line element 208) forms a self-shielded enclosure when closed around a subject (e.g., a limb such as a leg, or an arm). In the case of a leg or arm, for example, a self-shielded coil may substantially prevent or limit the RF field generated inside coil 200 from leaking out to the outside of coil 200. Therefore, when coil 200 is put on a limb (e.g., a leg or arm), a neighboring limb (or other part of the body) is invisible to the inside of coil 200. An undesired signal (e.g., noise) is therefore not received and/or coupled from the other limb. This aspect may be very beneficial in limb monitoring where a second (e.g., non-imaged) limb may be adjacent the limb being monitored. For example, a patient's legs may be positioned side-by-side, or an arm may be positioned next to a patient's body. The operator only wants to receive a signal from a leg of interest, and not from the adjacent leg, or to receive a signal only from an arm, and not from the rest of the patient's body. If coil 200 is not shielded, an undesired signal could "bleed in" from nearby anatomy, thereby adding noise to the intended signal.

Figure 23:
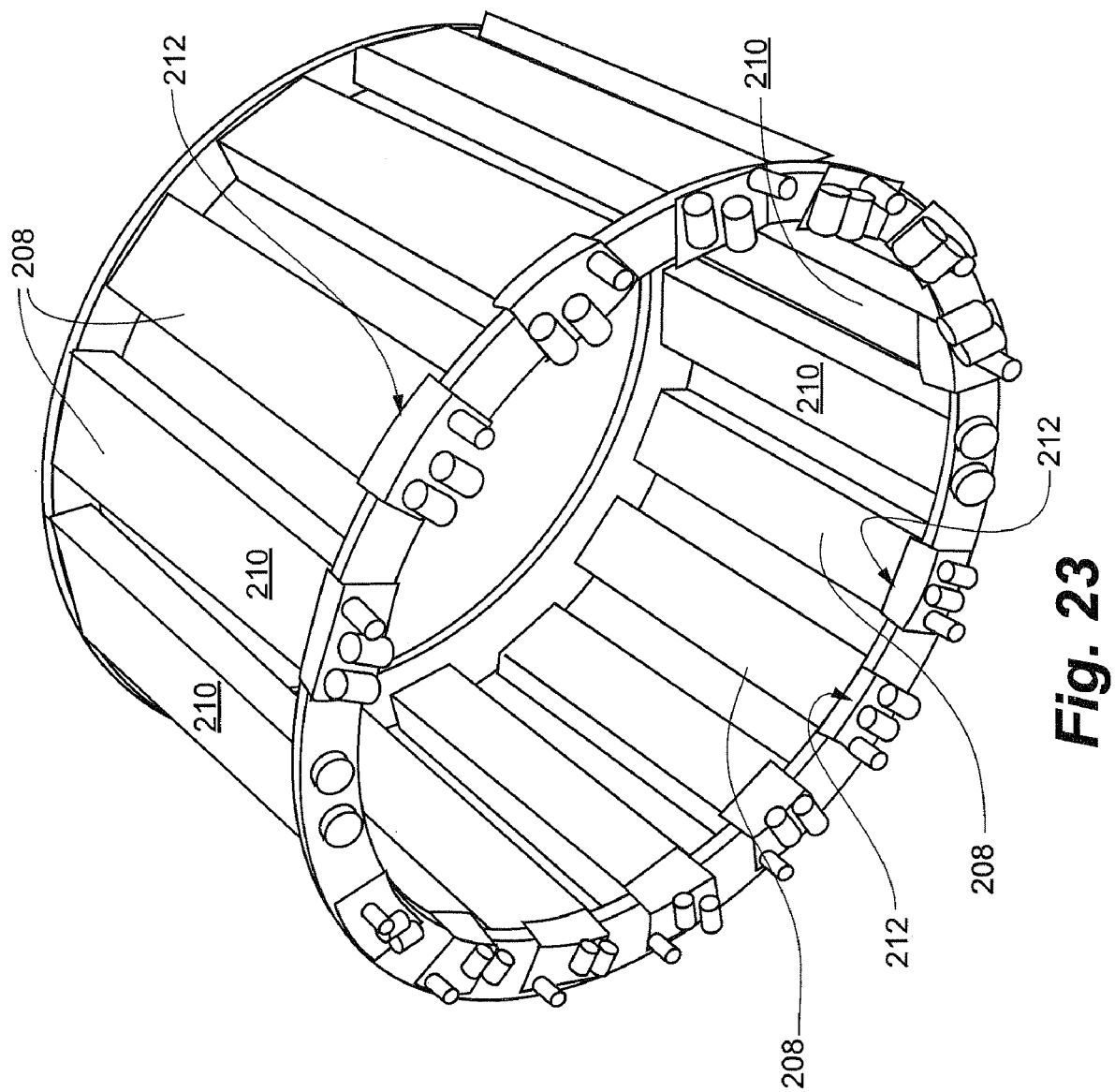
FIGS. 23-24 show embodiments of coil elements in a TEM resonator in embodiments of the present invention.
Figure 24:
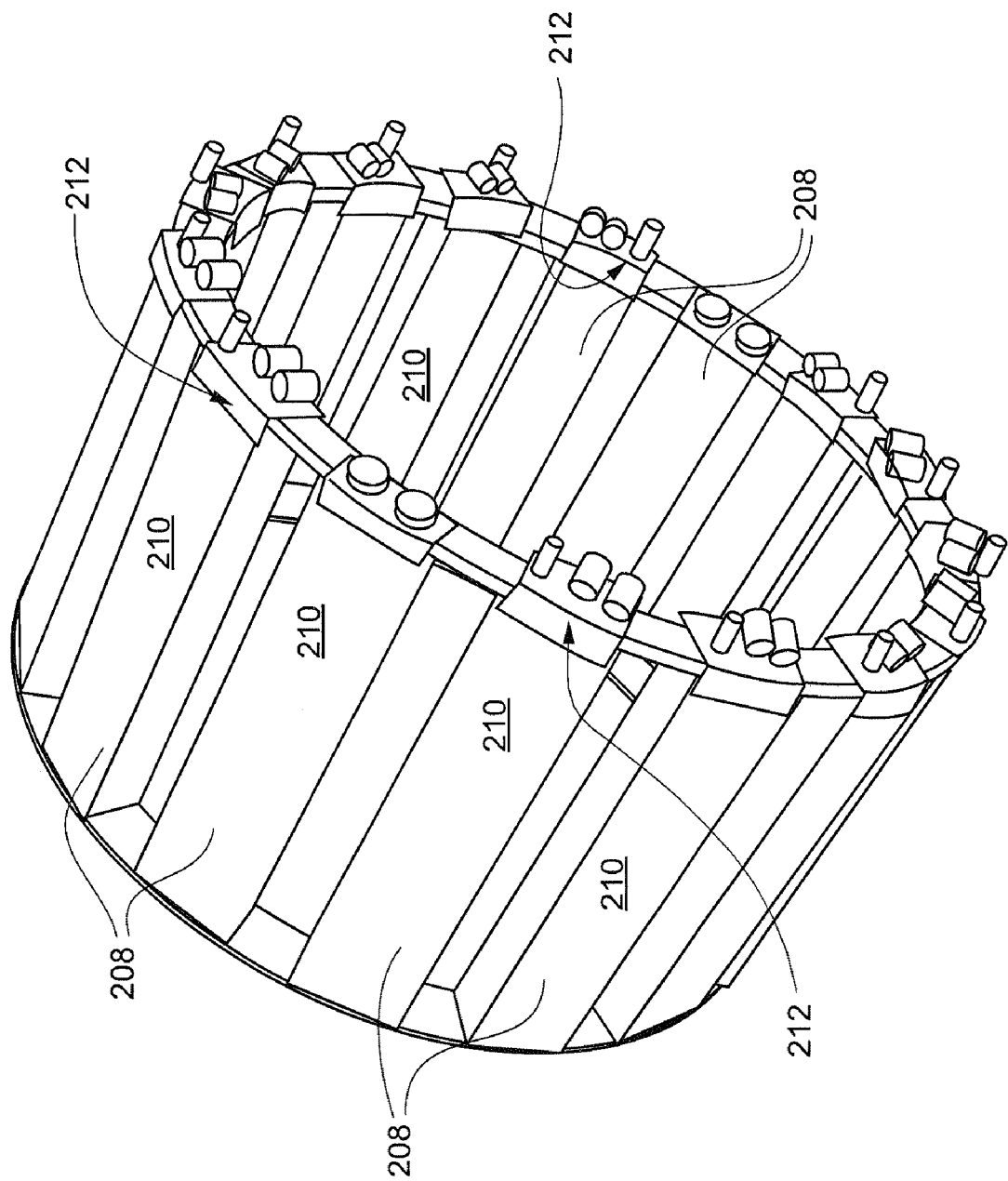

With continued reference to FIGS. 23 and 24, each transmission line element 208 is composed of an outer shield portion 210 and an inner conductor 212. Inner conductor 212 and outer shield portion 210 may form parallel signal elements in some embodiments, such that outer shield portion 210 forms a return path for electrical current in inner conductor 212. The transmission line elements 208 in this device are also thereby provided with shielding by the outer shield section 210. Inner conductor 212 may be formed of any kind of conductor, such as strip line, micro strip or coaxial line, for example without limitation. Inner conductor 212 is typically aligned parallel to outer shield portion 210, as described above. With reference to FIG. 21, housing 214 may be a plastic material (or other protective and/or non-conductive) which covers outer shield portion 210. In some embodiments, outer shield portion 210 may be laminated with a non-conductive material, and may be laminated to an inside surface of plastic housing 214 in certain embodiments. In a preferred embodiment, outer shield portion 210 may be made of a copper material, although a nonmagnetic, conductive material may be chosen by one of ordinary skill in the art without departing from the scope of the invention as claimed.

In some embodiments of the invention, coil 200 can be a separable coil wherein at least one separable section of coil 200 has an outer shield portion 210 adapted to overlap the outer shield portion of an adjacent section of coil 200. FIG. 20 illustrates an example of overlap 216 extending from both ends of the outer shield portion of section 204. Overlap 216 is adapted to overlap at least a portion of the outer shield portion of section 206 when sections 204 and 206 are coupled together to form coil 200. In some embodiments, overlap 216 may be separated from the outer shield portion of the second section (e.g., section 206 in this example) by a thin dielectric material. The overlapping nature of shield 216 provides better shielding and coupling between the two sections 204, 206. Overlap 216 may capacitively couple the outer shield portions of the two (or more) separable sections of coil 200, according to some embodiments.

In some embodiments, inner conductors 212 may include coaxial elements adapted to traverse coil 200 within transmission line elements 208. As shown in FIGS. 23 and 24, the outer shield portions 210 may be segmented (e.g., separated by a non-conductive gap). A collective shield may be formed from a plurality of outer shield portions even though the outer shield portions may be segmented into separate sections 210.

In embodiments of the invention, energy may be transferred from an energy source (e.g., RF electrical energy) to one or more transmission line elements 208. In embodiments in which energy is delivered to a single transmission line element 208, energy may be provided to the other transmission line elements 208 via reactance or reactive coupling. Reactance includes inductance and capacitance (and reactive coupling includes inductive and capacitive coupling). The transmission line elements 208 are therefore reactively coupled to each other by an RF magnetic field or flux. Reactive coupling (e.g., inductive coupling) transfers energy from one transmission line element 208 to another. The transmission line elements 208 are also capacitively coupled by the corresponding outer shield portions 210.

Figure 25:
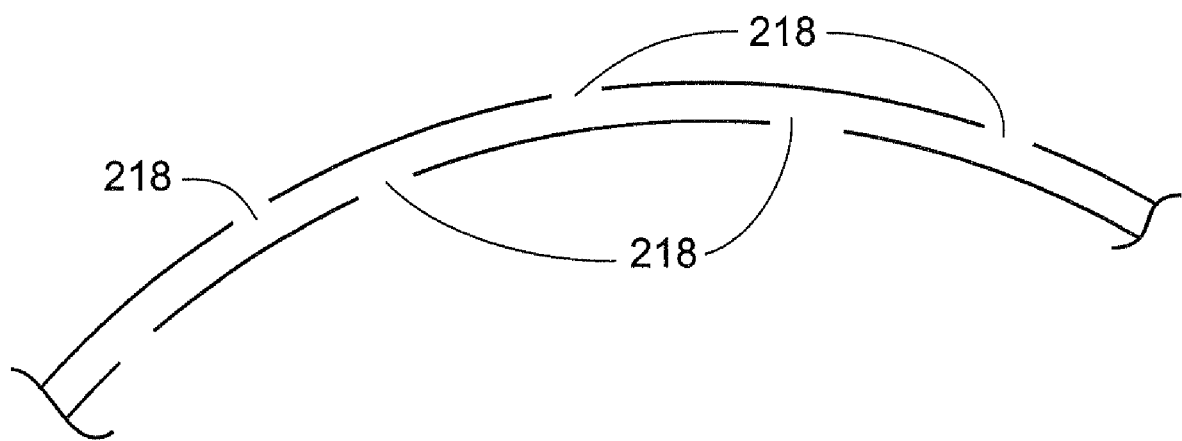
FIG. 25 shows a cutaway view of the shield construction for a coil in an embodiment of the present invention.

With reference to FIG. 25, the outer shield portions 210 may be made out of a double-sided foil according to certain embodiments. Lines 218 may be etched on alternating sides so that an overlap of the outer shield portions 210 is formed around the outer portion of coil 200. However, in embodiments of coil 200 in which coil 200 may be separable into two or more sections, the etched overlapping scheme depicted in FIG. 25 would no longer form a continuous shield. This would also reduce the amount of capacitive coupling between sections 204 and 206. Therefore, the embodiment shown in FIG. 20 adds an extra overlapping shielding segment 216 to improve the capacitive coupling between sections 204 and 206, and to improve the shielding provided thereby. The reactive coupling between sections 204 and 206 may be made to be substantially continuous around the periphery of coil 200 when sections 204 and 206 are coupled together to form coil 200.

In some embodiments of the invention, a determination may be made of an optimum profile of elements as the size of the coil is made to be smaller (e.g., smaller in diameter), and thus, a change in the profile of the TEM element is desired. Determination of an optimum profile of coil 200 is the concept that with the TEM coil, a transmission line element 208, having an outer shield portion 210 and parallel with that, an inner conductor or conductive element 212, can take many different forms, depending on coil constraints and whether the thinnest coil possible is desired for a given application, for example. There are a wide variety of different transmission line sections conceivable that would be optimized for specific applications whether they be anatomy or real estate in the magnets. The inner conductors may be different sizes, and can be made of different materials, have different spacings, have different numbers in a given coil, and can have different spatial orientations, for example.

Another embodiment of the present invention involves a multi-channel aspect for active detuning of the transmit and receive element. Passive components can be used to detune elements which does not degrade the imaging quality of the coil during transmission or reception. This could also involve impedance coupling between other coils especially during the receive phase of multi-channel elements placed interior to the end transmitter coil. This embodiment would involve actively detuning a TEM transmit coil from, for example, an array volume coil. For example, from a phased array volume coil from a parallel array volume coil, e.g., a TEM or transmission line array volume coil. With this aspect the operator can detune the TEM volume coil.

With reference to FIG. 26, a TEM coil 300 is shown with a loop array coil 302 (also commonly referred to as a phased array or parallel array) adapted to be nested within TEM coil 300. The array elements of coil 302 could be made of transmission line elements, or may also be a standard coil, or they could be a parallel array in which the coil elements are multiple elements of wire loops 304 as shown in FIG. 26, or foil loops. This embodiment combines TEM technology associated with the transmit coil together with a nested cylinder with loop array elements 304 called a parallel array or phased array. Loop array 302 would be adapted to "nest" within TEM coil 300. Outer TEM coil 300 could be used to transmit a homogeneous (e.g., uniform) radio frequency (RF) magnetic field, and loop array 302 nested within TEM coil 300 could then be used to receive the signal. Loop array 302 may be adapted (e.g., shaped and/or sized) to more closely fit the object being imaged (e.g., the body part of interest), and thus, may result in greater sensitivity. Such an embodiment combines the benefits of a highly homogeneous RF transmission with high sensitivity reception, as well as the potential for increased speed coming from the use of the combination of the two coils. The TEM transmit coil 300, as explained in detail above, may provide a high field strength, uniform magnetic field. In some embodiments, TEM coil 300 could be used to both transmit and receive, so an operator could transmit with the TEM coil 300, then receive with the combination of the loop array 302 and the TEM coil 300 together to produce an imaging signal.

As shown with continued reference to FIG. 26, an embodiment of the invention may combine the use of transmission line elements 306 and loop elements 304. The combination of transmission line elements 306 and loop elements 304 produces magnetic fields that are orthogonal to each other. For example, as shown in FIG. 26(A), transmission line elements 306 may generate a field 308, and loop elements 304 may generate a field 310 with lines of flux substantially perpendicular to those of field 308. Loop elements 304 generate di-poles in space. The use of mutually orthogonal field components thus created has been found to provide improved imaging, providing an improvement in signal-to-noise ratio (SNR). The improvement in SNR may be a factor of about square root of two per line-loop combination. In some embodiments, the transmission line elements 306 and loop elements 304 are matched in number and geometrically to provide a desired number and arrangement of line-loop combinations. The use of such an arrangement of line-loop combinations may also provide an improvement in transmission efficiency because of the transmission from two and receiving from two completely independent MR components simultaneously with the line-loop combination. In one possible embodiment, loop coil 302 may be nested in and connected together with line coil 300, and the combination coil may be adapted to be separable into two or more sections (e.g., via reactive coupling substantially as described above), obviating the need for many external connections. Of course, other combinations of a line coil and loop coil may be configured by one of ordinary skill in the art with the benefit of these teaching; such embodiments are contemplated and are deemed to fall within the scope of the invention as claimed.

This concept is not limited to separable coil arrays as is discussed above and could be extended to most any type of coil body type. Further, it is contemplated that both coils could be mated and nested in most any manner, such as any mechanical means to mate the two in a stable, efficient way and the connecter means could have a mating connecter so the operator could slide the nested coil into the outer coil, and a plug (or other suitable electromechanical coupling) would be provided inside the outer coil to accept the nested coil. For example, a slot within the outer coil could be used to accept a pin connection from the nested coil in certain embodiments. Further, such slots (or their equivalents) could be used to align both coils for optimum transmission and reception. In some embodiments, the outer coil may be adapted to function like a docking station, providing the ability to accept a number of different types of nested coils interchangeably, to plug in according to the particular application.

Some embodiments of the invention involve making pairs of coils (or combinations of two or more coils) that fit together and work together in an integrated way to improve the performance (e.g., improve the efficiency and/or the imaging quality). In the embodiment shown, transmission line elements 306 of an outer coil 300 are combined with loop elements 304 of a nested loop array coil 302 to produce an optimal field for imaging. Various alternative combinations could include a circular polarized field on a per element basis, a combination of two coils together to achieve a certain desired field shape, combining two coils together to achieve a certain space of comfort or ergonomic positioning (e.g., for patient comfort), or combining two coils together to produce a larger transmit coil having the ability to use different sizes of nested coils for different size patients.

Another embodiment of the invention involves a removable receiver array allowing for multi-function imaging. The receiver array is disposed on a coil that can be inserted into a TEM transmit coil. Different coil configurations may allow, for example, for anatomically-specific coils (e.g., knee coils, elbow coils, etc.), alternate axis sense coils, etc., and/or different numbers of channels (e.g., 8, 12, 16 channels), which can be placed on the coil with electronics configurable to implement one or more the multi-function variations. For parallel imaging, an increased number of channels may provide increased imaging speed as an additional benefit.

Figure 27:
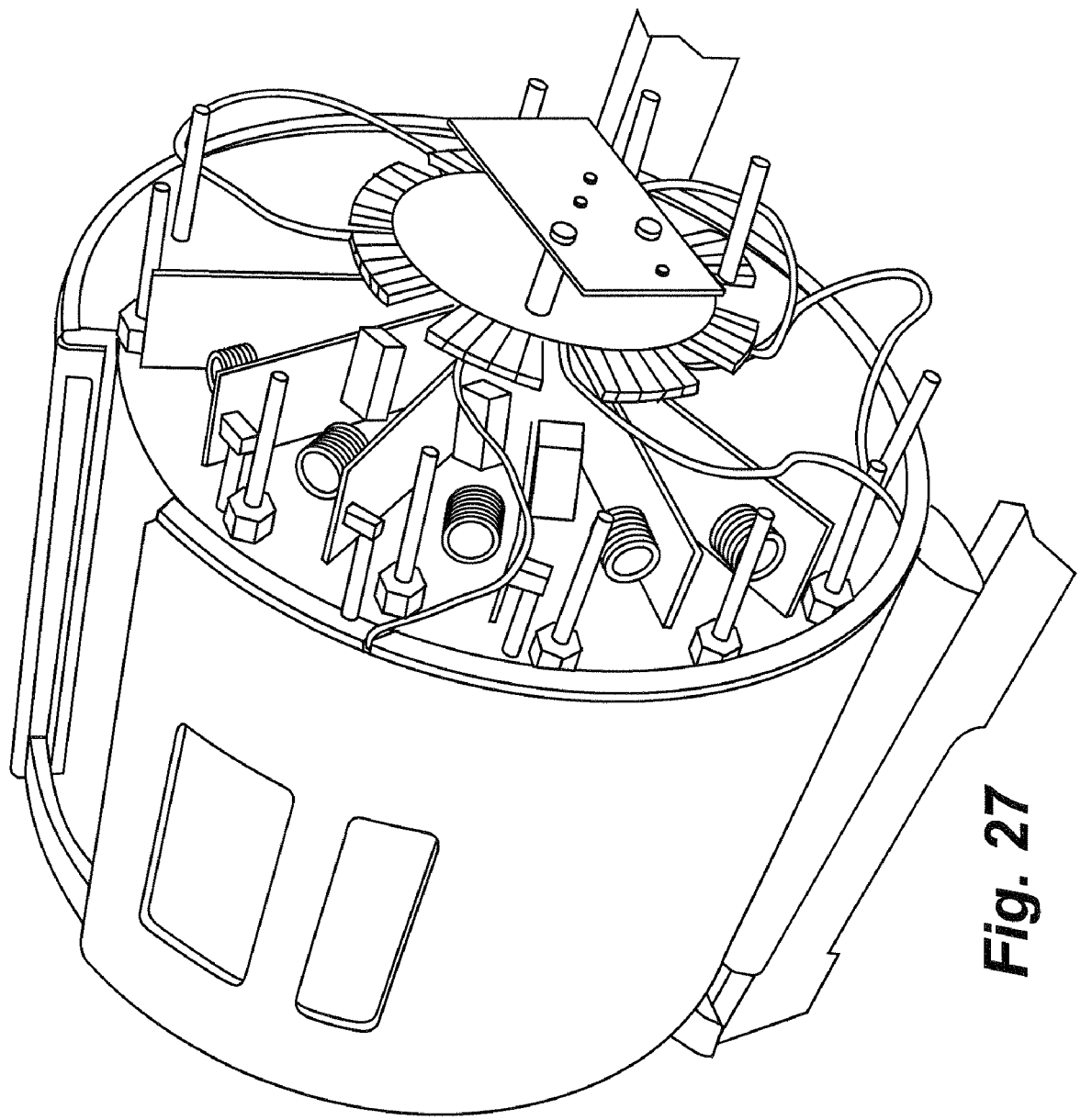
Figure 28:
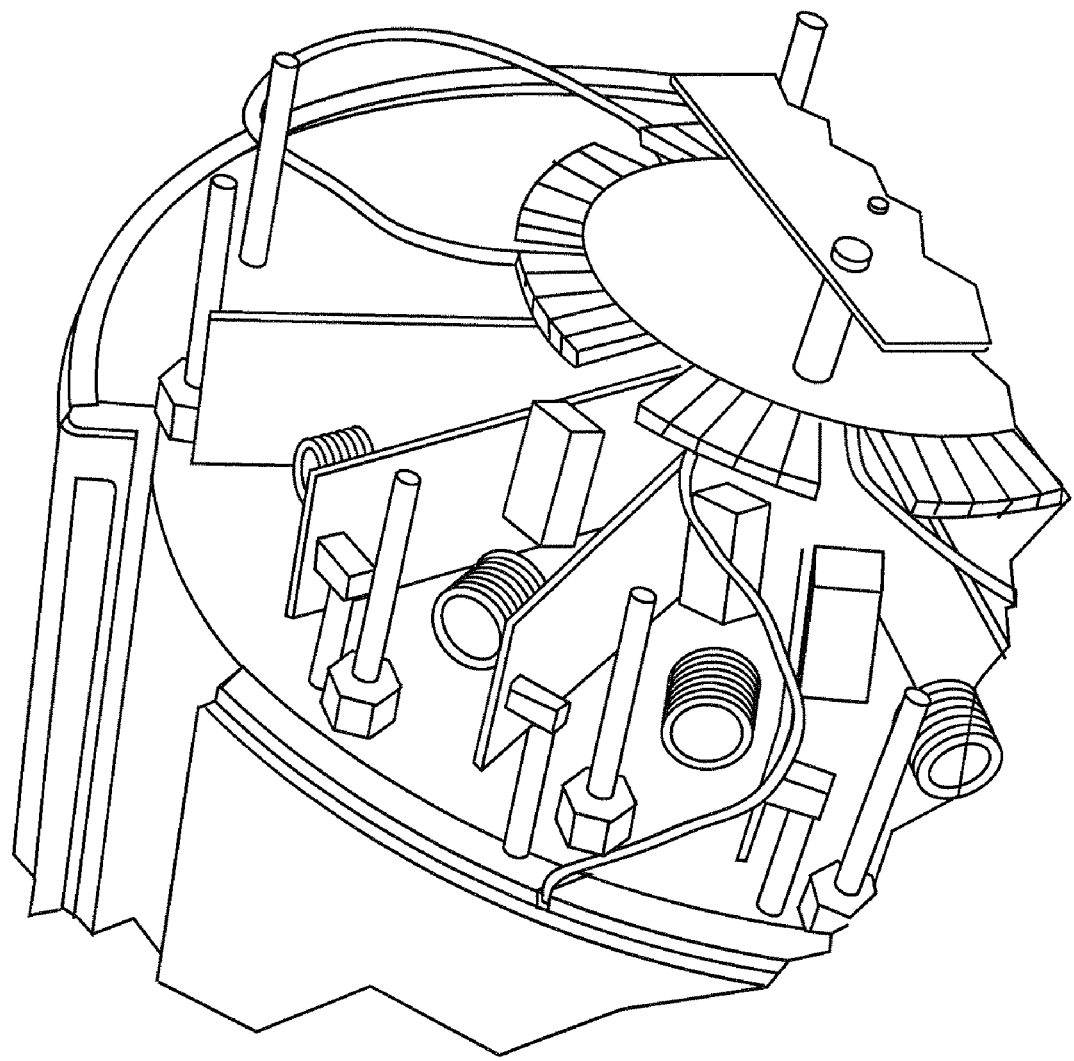
Figure 29:
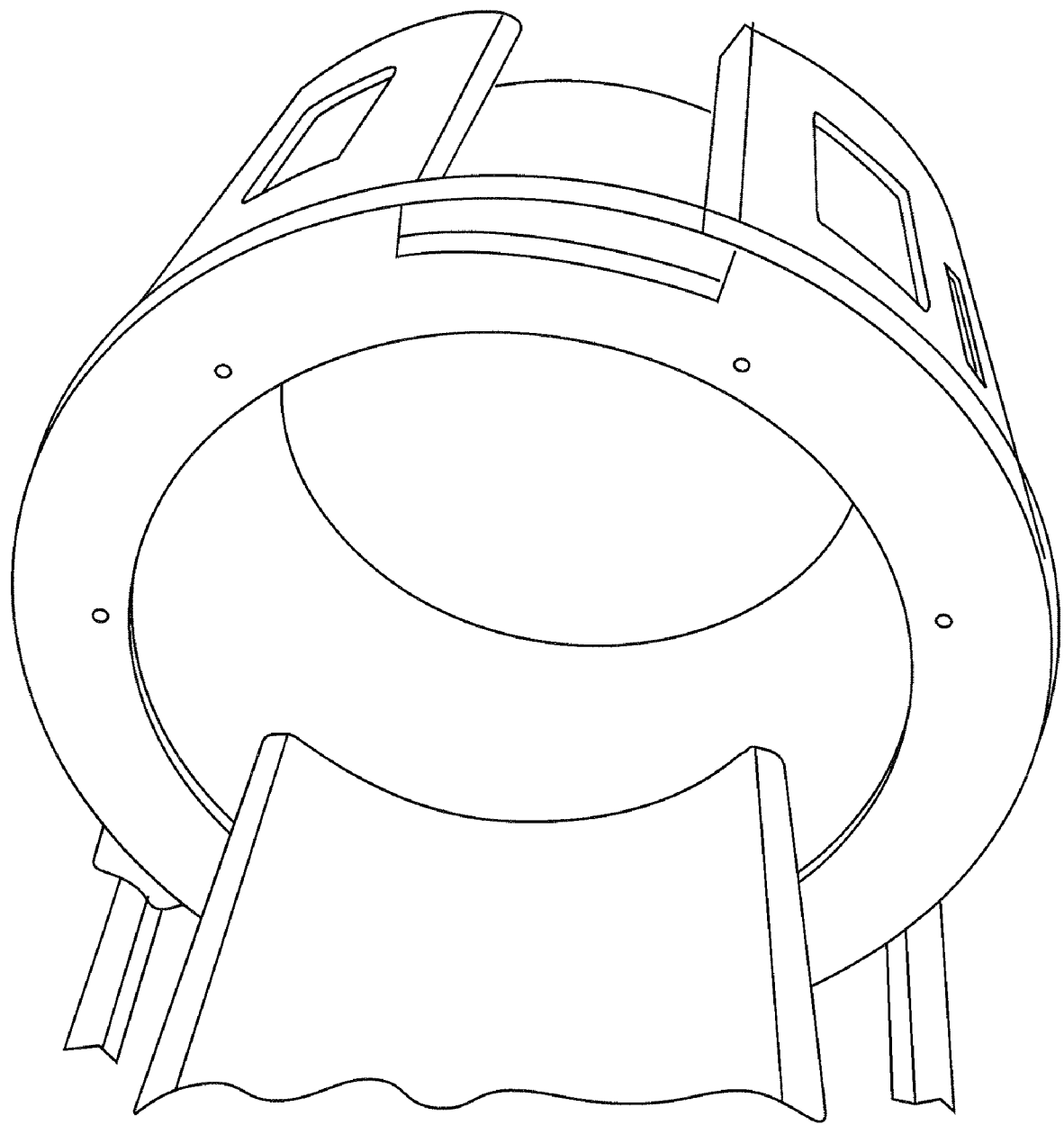
Figure 30:
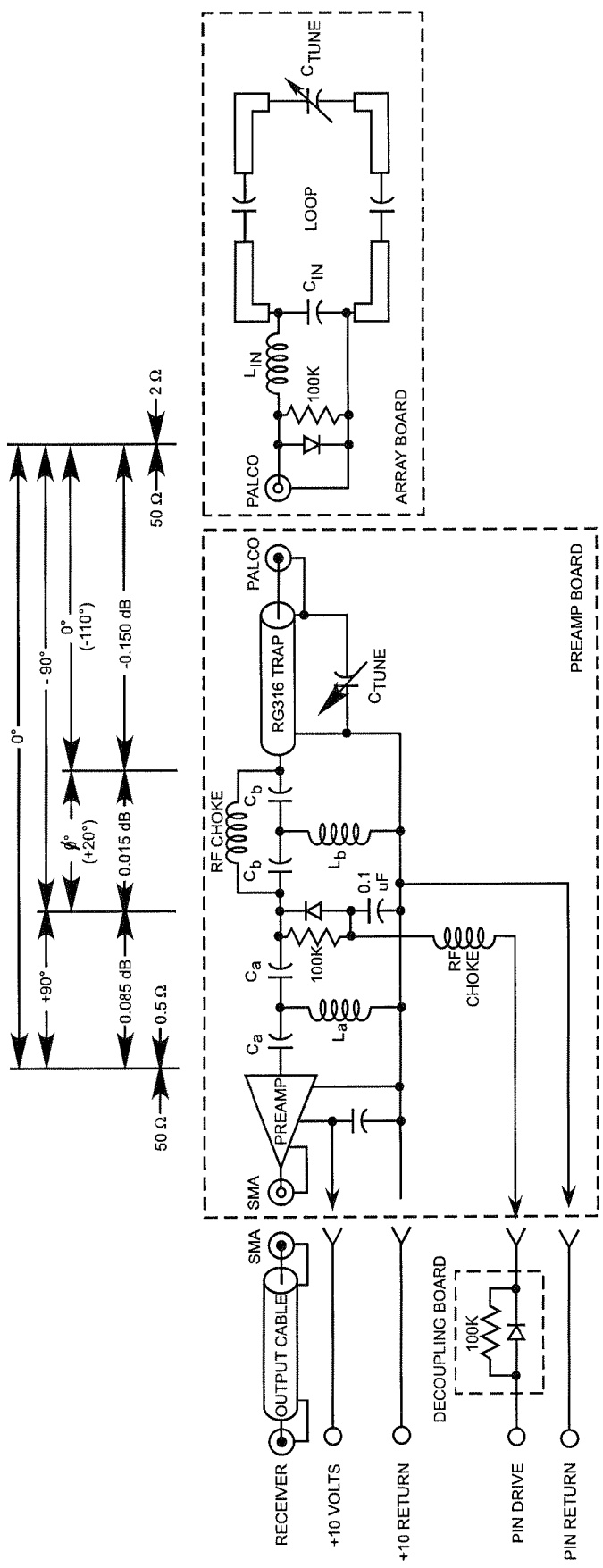
Figure 31:
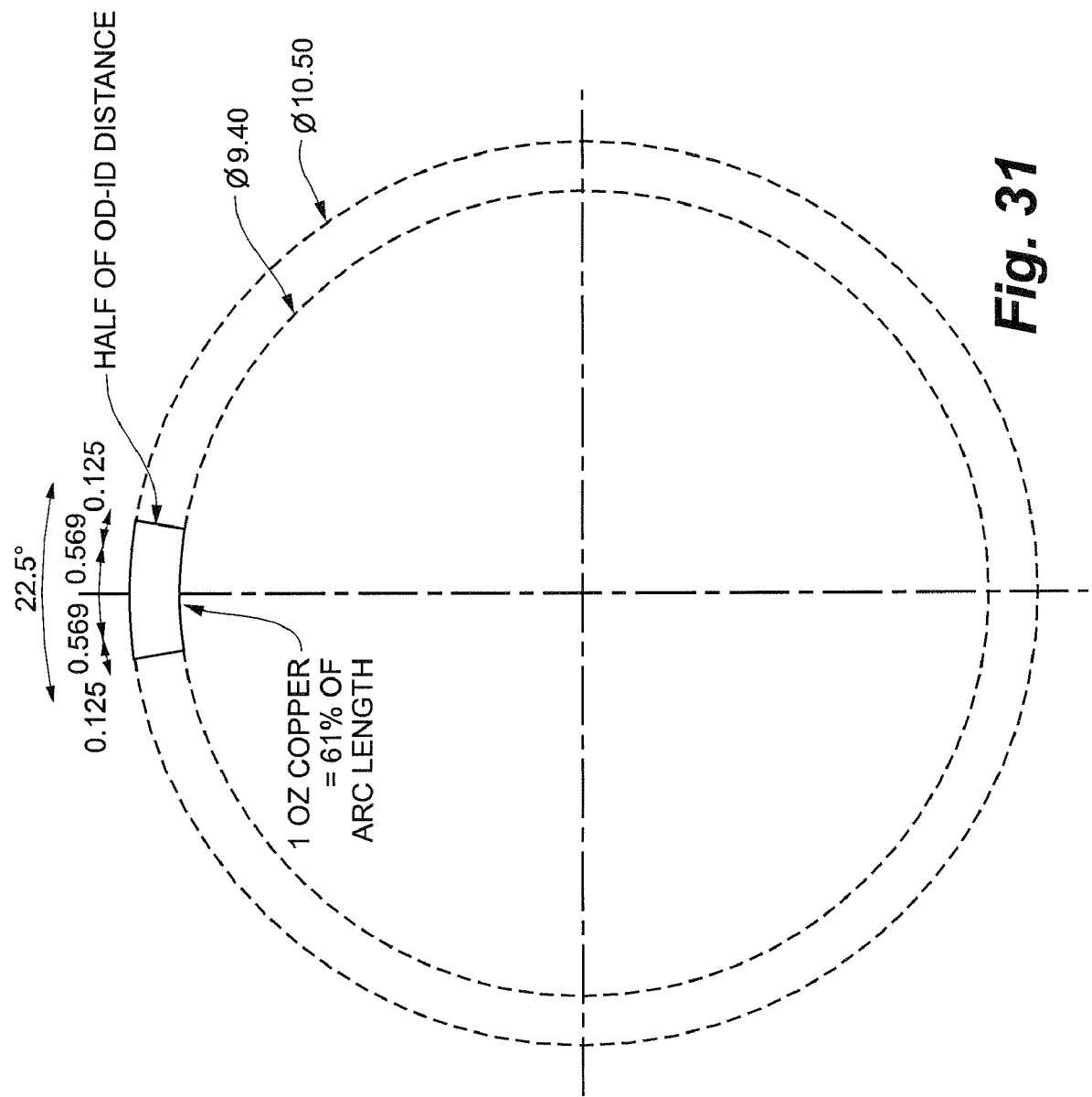

When a coil (e.g., an RF imaging coil) is used with an MR system, it is typically coupled to the rest of the system (e.g., to the operation of a TEM coil, for example). One way in which this may be accomplished is through the use of an RF front end (shown in FIGS. 27 and 28). The RF front end may form a part of the system that allows a variety of coils to be coupled to the system for a wide variety of imaging applications or configurations. For example, a system typically includes a relatively large transmit coil (e.g., for producing a homogeneous field). A number of different receive coils may be adapted to mate within the transmit coil. In some embodiments of the invention, the electrical and the mechanical connections between the transmit and receive coils may be standardized to allow a number of different receive coils (e.g., of different sizes, shapes, motions, functions, etc.) to mate together in an efficient (e.g., interchangeable) manner. This would allow an operator to employ a variety of different coils depending on the application, and couple them using an interface (e.g., electrical and/or mechanical) to create a standardized system. Current systems require an operator to reconfigure the couplings and connections for the specific coils to be used.

Figure 32:
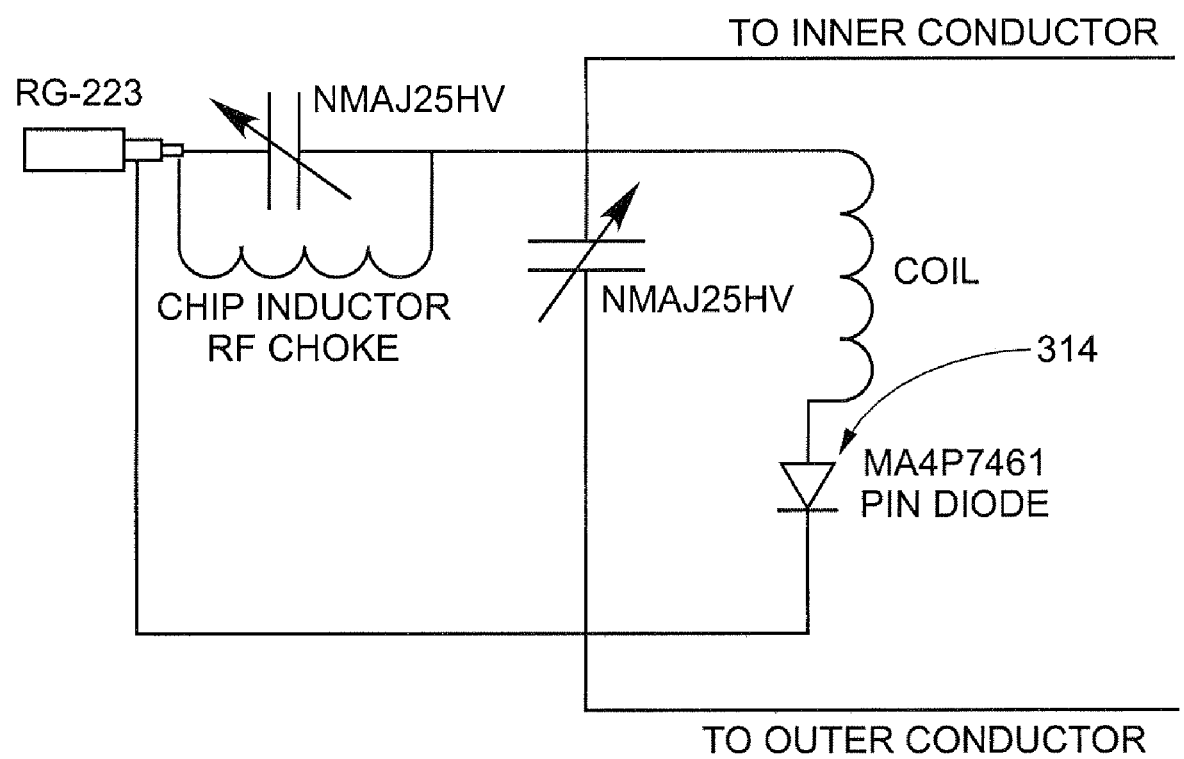
Figure 33:
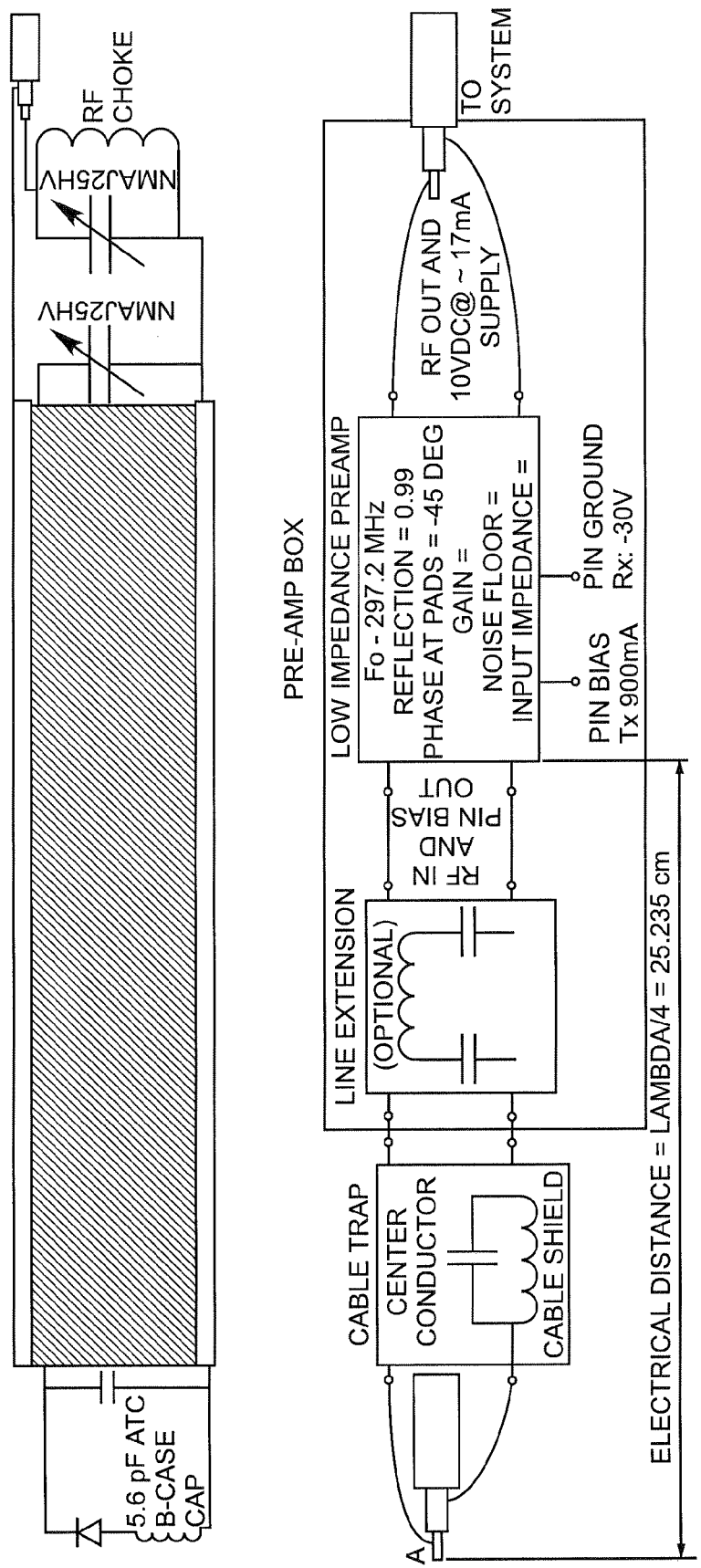
Figure 34:
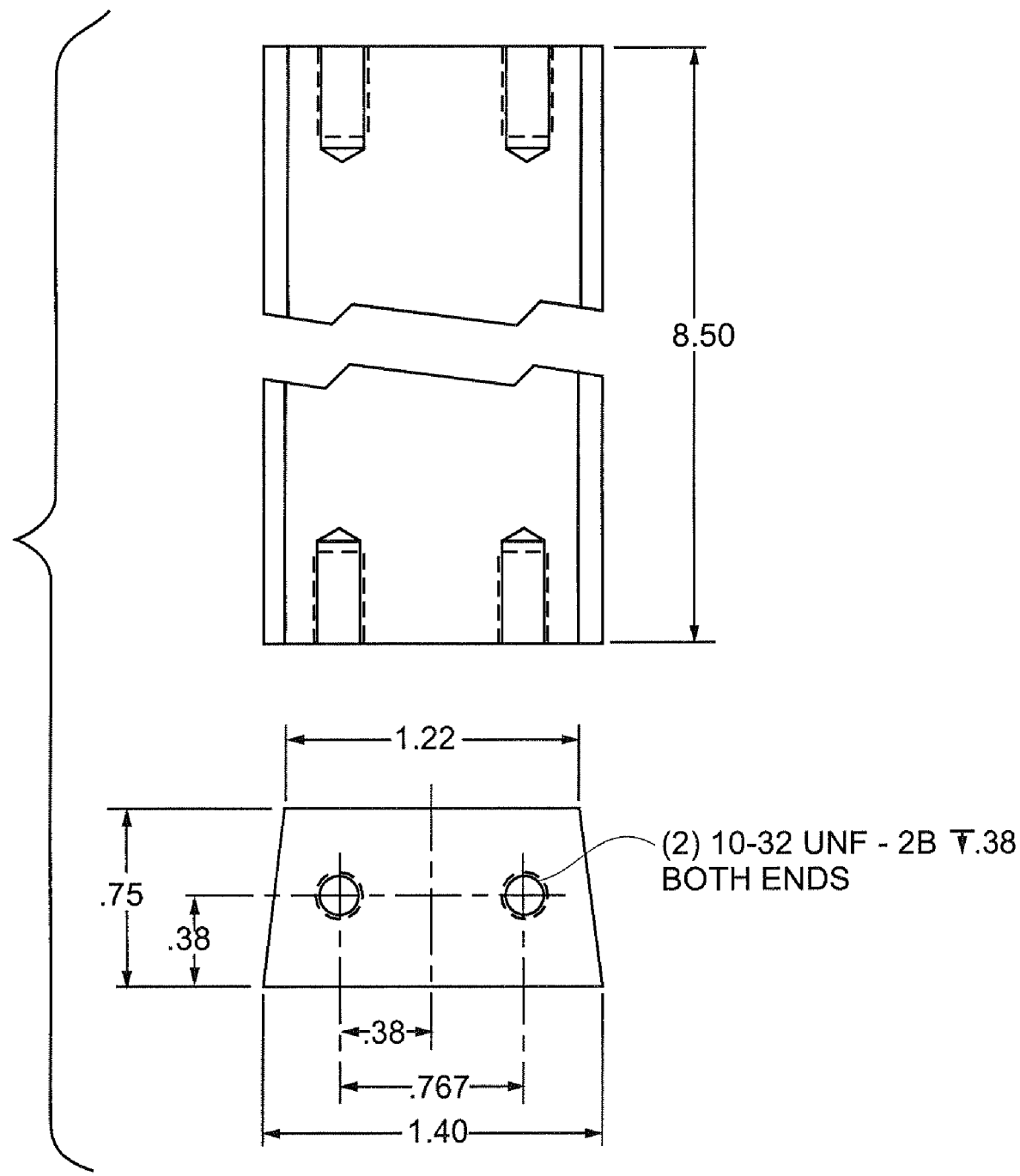
Figure 35:
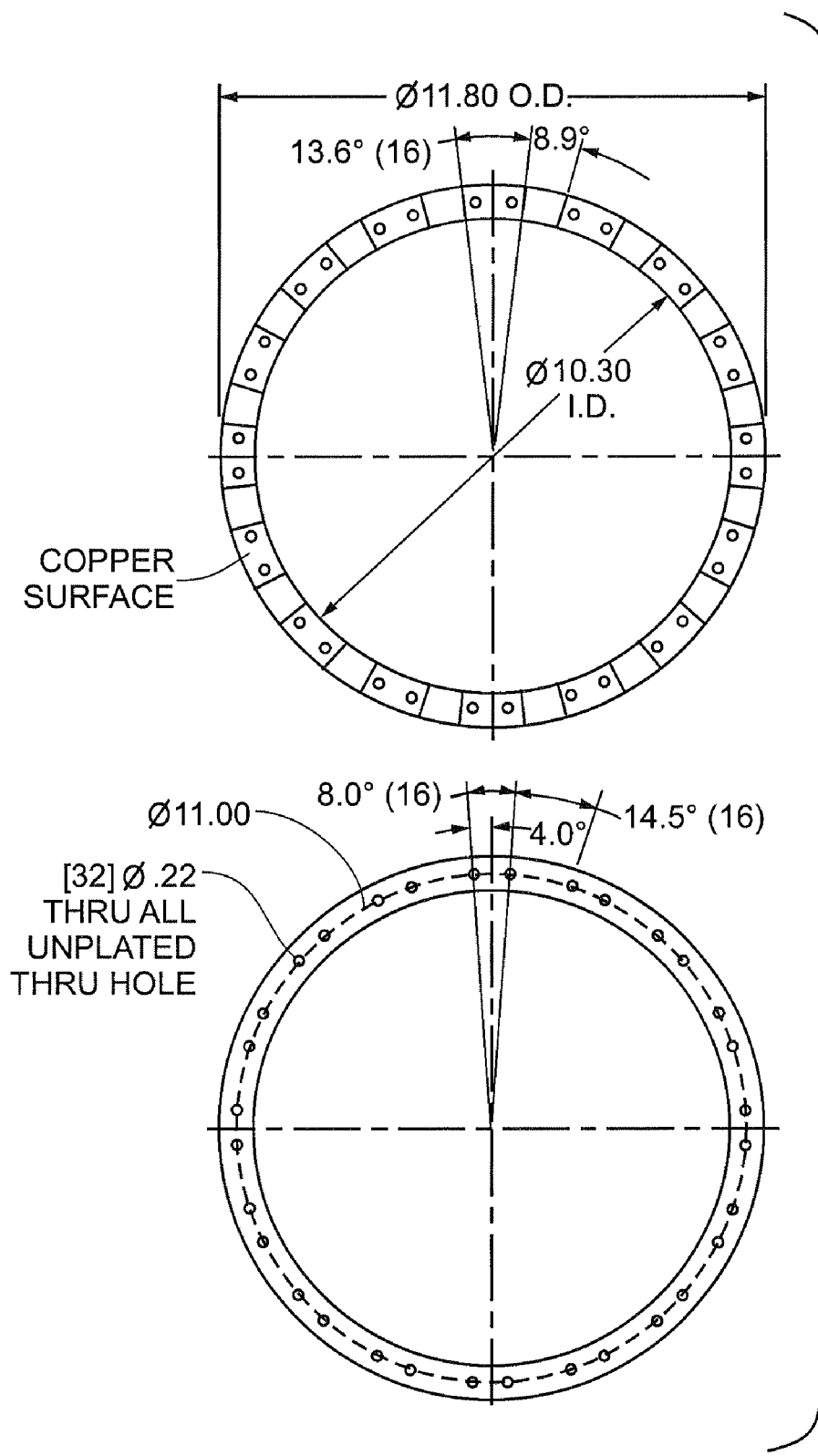
Figure 36:
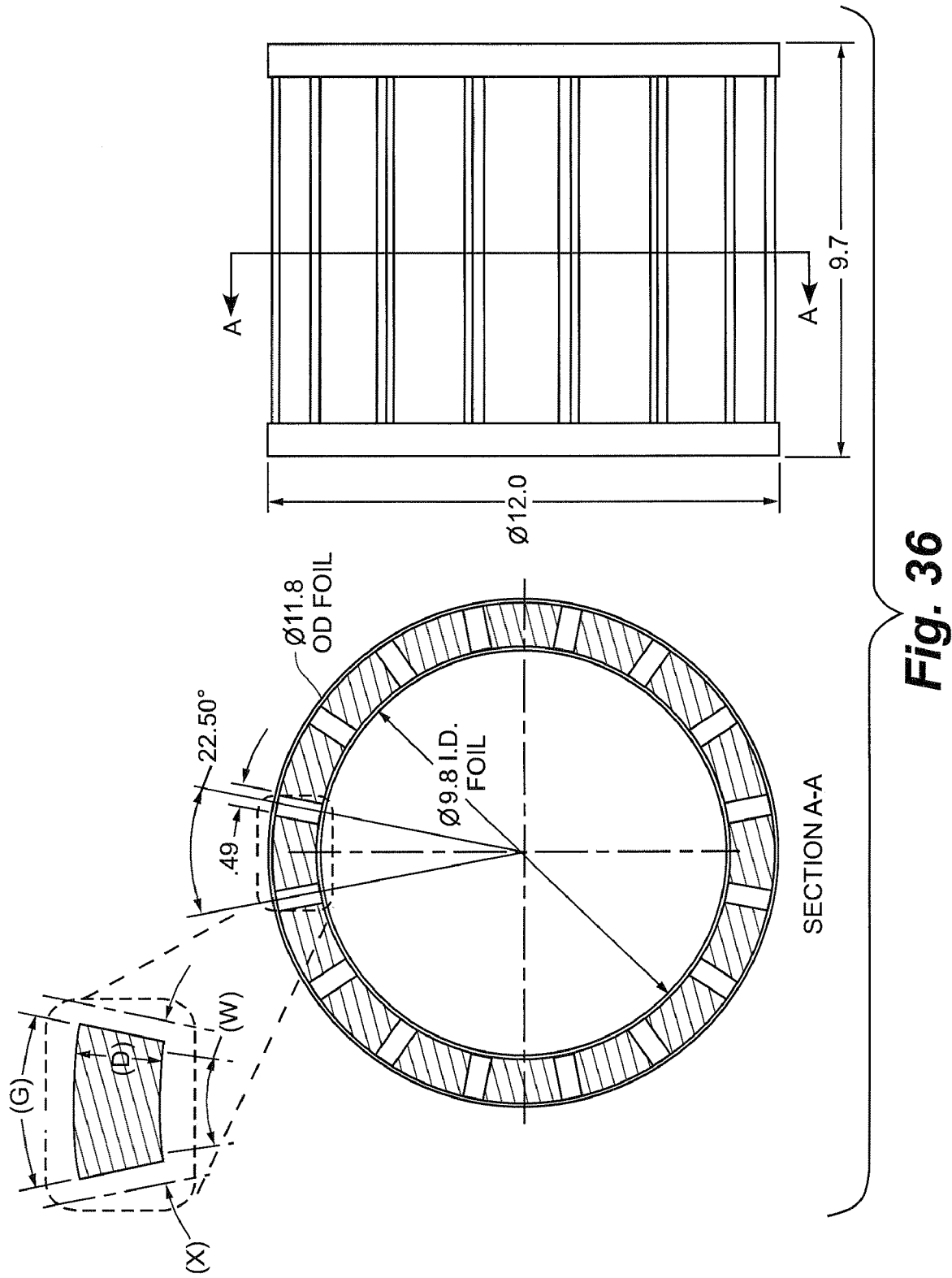
Figure 37:
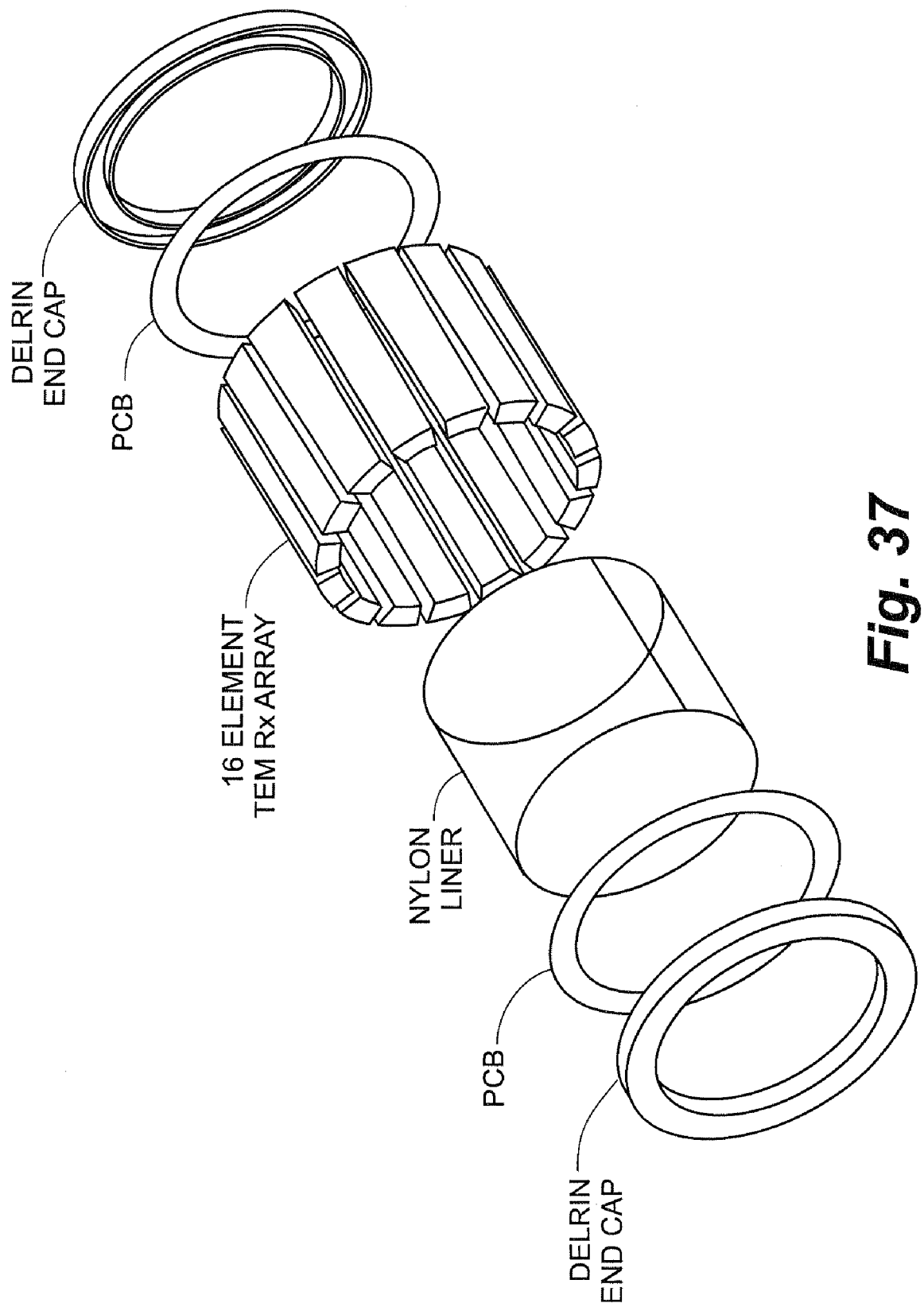

In various embodiments of the invention, a number of different RF coils, for example, for imaging a patient's entire head, for imaging a portion of a patient's head, for imaging a patient's eye (or eyes), or for imaging a patient's knee, would all be adapted to electrically and mechanically couple with the transmit coil (e.g., slide into the same coupling slots) to provide the ability to use different specialty coils with a single transmit coil. Therefore, when an operator slides an RF coil for a particular imaging application into coil 300, a mechanical connection is made between the coils as well as an RF connection. In some embodiments, a coaxial connector 312 (see FIGS. 24 and 26) may connect with a coaxial connector (or a coaxial cable) in a portion of the nested coil. A DC connection 314 (see FIG. 26) may also be provided to allow for DC electrical power to the coils, in some embodiments. DC current could be used, for example, to provide a signal to pin diode 315 (see FIG. 32), which may be adapted to actively detune the receiver device during transmit operations.

In other embodiments of the invention, a single coil may be configurable for use as a multi-function or multi-use or multi-channel coil. Such a coil may be electronically configured, for example, as either an 8- or 16-channel receiver, or as a single-channel TEM volume receive coil. In certain embodiments, a single channel TEM coil may function as both a transmitter and receiver for spectroscopy. In this embodiment, a single coil can be electronically reconfigured to serve different functions. For example, to image the eyes of a patient, an operator might transmit with a transmit TEM coil, and an imaging signal might be received using a coil with two loops (e.g., one loop for each eye). If imaging of only one eye was desired, one loop could be turned off, for example, via pin diode 315 (FIG. 32) and the other loop left on (e.g., the loop associated with the eye of interest). To look at both eyes, the operator could then reenergize the other loop. This is an example of electronically reconfiguring an existing two-loop eye coil to look at either eye or both eyes without changing the coil.

Thus, a coil system in accordance with some embodiments of the invention is electronically configurable. An operator may therefore be able to turn on or off different elements to achieve flexibility in imaging. The RF magnetic field inside the patient is a result of superimposed field contributions from each coil element. The present embodiment suggests being able to selectively turn on or off different combinations of line elements and/or loop array elements, thus creating different field superpositions and conditions to create different desired effects in the RF field. In a coil with line elements intended for imaging an entire head, for example, an operator could turn on elements nearer the back of the head (and turn off nearer the front of the head) in order to provide an image of just the back of the head. The ability to select the line elements in this manner may result in less power consumption, and may also be beneficial to the patient (e.g., in terms of less time and less exposure). This may be accomplished through the use of pin diodes 315 located in each such line element, for example, allowing the operator to select and deselect elements according to the application. The operator can also control the elements in other ways. The operator can control the elements (and hence, the nature of the RF fields) by changing the frequency of each, or by transmitting more than one frequency, or changing the phasing of each, for example. Pin diodes 315 may be electronically configurable to control phase shifters, frequency shifters, and on/off switches.

The above discussion could be extended to include a separable coil system, such as provided above. In such an embodiment, the transmit and receive coils may be separable from each other, and may be adapted to be reactively coupled to one another according to certain embodiments.

It will be appreciated that the present invention can take many forms and embodiments. The various embodiments of the invention are defined in the appended claims, and it is not intended that the particular embodiment presented herein should limit the scope thereof.

What is claimed is:

1. A radio frequency (RF) device for magnetic resonance imaging, the RF device comprising:

a resonator coil having two or more separable sections. the sections adapted to be disposed circumferentially about an axis to form the coil, the coil defining a cavity therethrough, each of the two or more sections including at least one transmission line segment, the two or more sections being reactively coupled when disposed to form the coil, the reactive coupling configured such that excitation energy applied to any one of the two or more sections causes excitation energy in the remaining sections, the two or more sections adapted to form an electromagnetic shield when disposed to form the coil, wherein the at least one transmission line segment comprises an inner conductor and an outer shield portion, the outer shield portion being formed of a non-magnetic conductive material, and wherein at least one separable section includes an outer shield portion which overlaps an outer shield portion of an adjacent separable section.

2. The device of claim 1 wherein the outer shield portion includes copper.

3. The device of claim 1 wherein an overlapping outer shield portion is formed between each section to form a continuous shield.

4. The device of claim 1 wherein the inner conductor of the transmission line segment is adapted to carry an electric current, and the outer shield portion is adapted to provide a return path for the electric current.

5. The device of claim 1 wherein the inner conductors and outer shield portions are substantially aligned with the axis of the coil.

6. The device of claim 5 wherein the outer shield portions include a radial end portion for providing electrical contact to the inner conductors.

7. The device of claim 1 wherein the inner conductors and outer shield portions are separated by a dielectric material.

8. The device of claim 1 wherein the cavity of the coil is open at both ends forming a generally cylindrical structure.

9. The device of claim 8 wherein the cavity is adapted to substantially conform to a portion of a patient limb.

10. The device of claim 8 wherein the cavity is adapted to substantially conform to a knee of a patient.

11. The device of claim 8 wherein the electromagnetic shield is adapted to reduce noise signals from adjacent objects.

12. The device of claim 11 wherein the electromagnetic shield is adapted to reduce noise signals from an adjacent limb.

13. The device of claim 1 wherein the overlap between outer shield portions are capacitively coupled to form a substantially continuous electromagnetic shield.

* * * * *